(12) United States Patent
Kimura

(10) Patent No.: US 11,442,317 B2
(45) Date of Patent: Sep. 13, 2022

(54) LIQUID CRYSTAL DISPLAY DEVICE, SEMICONDUCTOR DEVICE, AND ELECTRONIC APPLIANCE

(71) Applicant: Semiconductor Energy Laboratory Co., Ltd., Atsugi (JP)

(72) Inventor: Hajime Kimura, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 17/381,429

(22) Filed: Jul. 21, 2021

(65) Prior Publication Data

US 2021/0349360 A1 Nov. 11, 2021

Related U.S. Application Data

(63) Continuation of application No. 16/888,906, filed on Jun. 1, 2020, now Pat. No. 11,073,729, which is a (Continued)

(30) Foreign Application Priority Data

Apr. 6, 2006 (JP) .............................. JP2006-105618

(51) Int. Cl.
*G02F 1/1343* (2006.01)
*H01L 27/12* (2006.01)
(Continued)

(52) U.S. Cl.
CPC ...... *G02F 1/134309* (2013.01); *G02F 1/1337* (2013.01); *G02F 1/1368* (2013.01);
(Continued)

(58) Field of Classification Search
CPC ......... G02F 1/134309; G02F 1/133345; G02F 1/133514; G02F 1/1337; G02F 1/134363;
(Continued)

(56) References Cited

U.S. PATENT DOCUMENTS 5,623,157 A 4/1997 Miyazaki et al.
5,680,190 A 10/1997 Michibayashi et al.
(Continued)

FOREIGN PATENT DOCUMENTS

CN 001196832 A 10/1998
CN 001479145 A 3/2004
(Continued)

OTHER PUBLICATIONS

Search Report (Application No. 07005724.5) dated Jun. 12, 2007.
(Continued)

*Primary Examiner* — Charles S Chang
(74) *Attorney, Agent, or Firm* — Fish & Richardson P.C.

(57) ABSTRACT

The liquid crystal display device includes an island-shaped first semiconductor film 102 which is formed over a base insulating film 101 and in which a source 102d, a channel forming region 102a, and a drain 102b are formed; a first electrode 102c which is formed of a material same as the first semiconductor film 102 to be the source 102d or the drain 102b and formed over the base insulating film 101; a second electrode 108 which is formed over the first electrode 102c and includes a first opening pattern 112; and a liquid crystal 110 which is provided over the second electrode 108.

10 Claims, 34 Drawing Sheets

Related U.S. Application Data continuation of application No. 15/963,150, filed on Apr. 26, 2018, now Pat. No. 10,684,517, which is a continuation of application No. 14/957,746, filed on Dec. 3, 2015, now Pat. No. 9,958,736, which is a continuation of application No. 12/904,537, filed on Oct. 14, 2010, now Pat. No. 9,207,504, which is a continuation of application No. 11/695,898, filed on Apr. 3, 2007, now Pat. No. 9,213,206.

(51) Int. Cl.
*G02F 1/1333* (2006.01)
*G02F 1/1335* (2006.01)
*G02F 1/1337* (2006.01)
*G02F 1/1362* (2006.01)
*G02F 1/1368* (2006.01)
*H01L 29/786* (2006.01)

(52) U.S. Cl.
CPC .... *G02F 1/13439* (2013.01); *G02F 1/133345* (2013.01); *G02F 1/133514* (2013.01); *G02F 1/134363* (2013.01); *G02F 1/136213* (2013.01); *G02F 1/136286* (2013.01); *H01L 27/124* (2013.01); *H01L 27/1225* (2013.01); *H01L 27/1255* (2013.01); *H01L 29/7869* (2013.01); *H01L 29/78696* (2013.01); *G02F 1/1362* (2013.01); *H01L 2924/0002* (2013.01)

(58) Field of Classification Search
CPC ........... G02F 1/13439; G02F 1/136286; G02F 1/1368; H01L 27/124
USPC .............................................. 349/42–47, 139
See application file for complete search history.

(56) References Cited

U.S. PATENT DOCUMENTS

| | | | |
|---|---|---|---|
| 5,731,856 A | 3/1998 | Kim et al. |
| 5,744,864 A | 4/1998 | Cillessen et al. |
| 5,870,160 A | 2/1999 | Yanagawa et al. |
| 5,966,193 A | 10/1999 | Zhang et al. |
| 6,034,757 A | 3/2000 | Yanagawa et al. |
| 6,084,248 A | 7/2000 | Inoue |
| 6,108,065 A | 8/2000 | Ota et al. |
| 6,108,066 A | 8/2000 | Yanagawa et al. |
| 6,160,600 A | 12/2000 | Yamazaki et al. |
| 6,233,034 B1 | 5/2001 | Lee et al. |
| 6,281,953 B1 | 8/2001 | Lee et al. |
| 6,294,274 B1 | 9/2001 | Kawazoe et al. |
| 6,333,520 B1 | 12/2001 | Inoue |
| 6,411,357 B1 | 6/2002 | Ting et al. |
| 6,429,120 B1 | 8/2002 | Ahn et al. |
| 6,433,842 B1 | 8/2002 | Kaneko et al. |
| 6,449,026 B1 | 9/2002 | Min et al. |
| 6,462,799 B2 | 10/2002 | Ohta et al. |
| 6,462,800 B1 | 10/2002 | Kim et al. |
| 6,507,383 B1 | 1/2003 | Abe et al. |
| 6,522,380 B2 | 2/2003 | Lee et al. |
| 6,525,798 B1 | 2/2003 | Yamakita et al. |
| 6,532,053 B2 | 3/2003 | Ohta et al. |
| 6,563,174 B2 | 5/2003 | Kawasaki et al. |
| 6,583,472 B1 | 6/2003 | Shibata et al. |
| 6,600,535 B1 | 7/2003 | Tsuda et al. |
| 6,611,310 B2 | 8/2003 | Kurahashi et al. |
| 6,646,692 B2 | 11/2003 | Yamazaki et al. |
| 6,677,609 B2 | 1/2004 | Inoue |
| 6,680,577 B1 | 1/2004 | Inukai et al. |
| 6,710,835 B2 | 3/2004 | Kurahashi et al. |
| 6,727,522 B1 | 4/2004 | Kawasaki et al. |
| 6,756,298 B2 | 6/2004 | Ahn et al. |
| 6,774,970 B1 | 8/2004 | Sekiguchi |
| 6,781,152 B2 | 8/2004 | Yamazaki |
| 6,784,457 B2 | 8/2004 | Yamazaki et al. |
| 6,803,982 B2 | 10/2004 | Komatsu |
| 6,816,221 B2 | 11/2004 | Oke et al. |
| 6,831,724 B2 | 12/2004 | Ohta et al. |
| 6,833,882 B2 | 12/2004 | Lee |
| 6,847,422 B2 | 1/2005 | Zhang et al. |
| 6,864,134 B1 | 3/2005 | Satou et al. |
| 6,897,909 B2 | 5/2005 | Ochiai et al. |
| 6,914,645 B2 | 7/2005 | Kurahashi et al. |
| 6,914,656 B2 | 7/2005 | Sakamoto et al. |
| 6,917,392 B2 | 7/2005 | Hannuki et al. |
| 6,933,528 B2 | 8/2005 | Itakura et al. |
| 6,950,081 B2 | 9/2005 | Akimoto et al. |
| 6,963,382 B1 | 11/2005 | Yamazaki et al. |
| 6,975,374 B2 | 12/2005 | Ohta et al. |
| 6,987,552 B2 | 1/2006 | Yamazaki et al. |
| 7,009,206 B2 | 3/2006 | Lee et al. |
| 7,023,021 B2 | 4/2006 | Yamazaki et al. |
| 7,049,190 B2 | 5/2006 | Takeda et al. |
| 7,050,137 B2 | 5/2006 | Hoshino et al. |
| 7,052,940 B2 | 5/2006 | Lee |
| 7,061,014 B2 | 6/2006 | Hosono et al. |
| 7,061,186 B2 | 6/2006 | Inukai et al. |
| 7,064,346 B2 | 6/2006 | Kawasaki et al. |
| 7,088,402 B2 | 8/2006 | Ochiai et al. |
| 7,088,409 B2 | 8/2006 | Itou et al. |
| 7,098,086 B2 | 8/2006 | Shibata et al. |
| 7,105,868 B2 | 9/2006 | Nause et al. |
| 7,106,400 B1 | 9/2006 | Tsuda et al. |
| 7,119,364 B2 | 10/2006 | Yamazaki |
| 7,119,857 B1 | 10/2006 | Nakamura et al. |
| 7,130,010 B2 | 10/2006 | Jeoung |
| 7,133,086 B2 | 11/2006 | Toyota et al. |
| 7,157,303 B2 | 1/2007 | Son |
| 7,164,402 B2 | 1/2007 | Yanagawa et al. |
| 7,189,585 B2 | 3/2007 | Yamazaki et al. |
| 7,195,960 B2 | 3/2007 | Inoue |
| 7,211,825 B2 | 5/2007 | Shih et al. |
| 7,248,324 B2 | 7/2007 | Ono et al. |
| 7,251,005 B2 | 7/2007 | Ono et al. |
| 7,251,006 B2 | 7/2007 | Ono et al. |
| 7,253,863 B2 | 8/2007 | Ono et al. |
| 7,256,852 B2 | 8/2007 | Ono et al. |
| 7,256,854 B2 | 8/2007 | Ono et al. |
| 7,271,869 B2 | 9/2007 | Ono et al. |
| 7,282,782 B2 | 10/2007 | Hoffman et al. |
| 7,285,196 B2 | 10/2007 | Ahn et al. |
| 7,286,105 B2 | 10/2007 | Akimoto et al. |
| 7,297,977 B2 | 11/2007 | Hoffman et al. |
| 7,303,987 B2 | 12/2007 | Lim et al. |
| 7,304,708 B2 | 12/2007 | Ono et al. |
| 7,323,356 B2 | 1/2008 | Hosono et al. |
| 7,323,716 B2 | 1/2008 | Satou et al. |
| 7,342,615 B2 | 3/2008 | Toyota et al. |
| 7,362,400 B2 | 4/2008 | Itou et al. |
| 7,365,713 B2 | 4/2008 | Kimura |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,405,781 B2 | 7/2008 | Hoshino et al. |
| 7,411,209 B2 | 8/2008 | Endo et al. |
| 7,436,376 B2 | 10/2008 | Akimoto et al. |
| 7,440,066 B2 | 10/2008 | Ono et al. |
| 7,453,065 B2 | 11/2008 | Saito et al. |
| 7,453,087 B2 | 11/2008 | Iwasaki |
| 7,456,924 B2 | 11/2008 | Ono et al. |
| 7,462,862 B2 | 12/2008 | Hoffman et al. |
| 7,468,304 B2 | 12/2008 | Kaji et al. |
| 7,468,715 B2 | 12/2008 | Akimoto et al. |
| 7,483,001 B2 | 1/2009 | Matsueda |
| 7,492,417 B2 | 2/2009 | Hirakata et al. |
| 7,501,293 B2 | 3/2009 | Ito et al. |
| 7,501,685 B2 | 3/2009 | Shibata et al. |
| 7,515,237 B2 | 4/2009 | Park et al. |
| 7,545,449 B2 | 6/2009 | Nakamura et al. |
| 7,551,169 B2 | 6/2009 | Yanagawa et al. |
| 7,566,903 B2 | 7/2009 | Yamazaki et al. |
| 7,567,328 B2 | 7/2009 | Yamazaki et al. |
| 7,605,898 B2 | 10/2009 | Ochiai et al. |
| 7,612,853 B2 | 11/2009 | Ohta et al. |

(56) References Cited

U.S. PATENT DOCUMENTS

| | | |
|---|---|---|
| 7,616,282 B2 | 11/2009 | Yamazaki et al. |
| 7,656,491 B2 | 2/2010 | Yamazaki et al. |
| 7,670,469 B2 | 3/2010 | Ahn et al. |
| 7,674,650 B2 | 3/2010 | Akimoto et al. |
| 7,683,996 B2 | 3/2010 | Ono et al. |
| 7,692,748 B2 | 4/2010 | Ono et al. |
| 7,697,100 B2 | 4/2010 | Ono et al. |
| 7,705,949 B2 | 4/2010 | Ono et al. |
| 7,714,975 B1 | 5/2010 | Yamazaki et al. |
| 7,732,251 B2 | 6/2010 | Hoffman et al. |
| 7,732,819 B2 | 6/2010 | Akimoto et al. |
| 7,733,455 B2 | 6/2010 | Ono et al. |
| 7,816,682 B2 | 10/2010 | Kimura |
| 7,851,797 B2 | 12/2010 | Yamazaki et al. |
| 7,898,629 B2 | 3/2011 | Ono et al. |
| 7,903,207 B2 | 3/2011 | Lee et al. |
| 7,915,615 B2 | 3/2011 | Yamazaki et al. |
| 7,936,429 B2 | 5/2011 | Ono et al. |
| 7,982,267 B2 | 7/2011 | Shibata et al. |
| 7,982,692 B2 | 7/2011 | Matsueda |
| 8,027,005 B2 | 9/2011 | Ohta et al. |
| 8,035,109 B2 | 10/2011 | Kimura |
| 8,035,786 B2 | 10/2011 | Ono et al. |
| 8,039,288 B2 | 10/2011 | Yamazaki |
| 8,045,116 B2 | 10/2011 | Ono et al. |
| 8,102,387 B2 | 1/2012 | Akimoto et al. |
| 8,102,476 B2 | 1/2012 | Son et al. |
| 8,107,038 B2 | 1/2012 | Kim et al. |
| 8,203,144 B2 | 6/2012 | Hoffman et al. |
| 8,233,120 B2 | 7/2012 | Kim et al. |
| 8,253,140 B2 | 8/2012 | Shibata et al. |
| 8,294,637 B2 | 10/2012 | Matsueda |
| 8,378,356 B2 | 2/2013 | Kimura |
| 8,399,884 B2 | 3/2013 | Yamazaki et al. |
| 8,466,482 B2 | 6/2013 | Yamazaki |
| 8,525,760 B2 | 9/2013 | Matsueda |
| 8,552,431 B2 | 10/2013 | Shibata et al. |
| 8,647,031 B2 | 2/2014 | Hoffman et al. |
| 8,704,233 B2 | 4/2014 | Yamazaki et al. |
| 9,105,521 B2 | 8/2015 | Yamazaki |
| 9,263,469 B2 | 2/2016 | Yamazaki |
| 9,318,610 B2 | 4/2016 | Yamazaki et al. |
| 2001/0011981 A1 | 8/2001 | Yamamoto et al. |
| 2001/0012084 A1 | 8/2001 | Ohta et al. |
| 2001/0015783 A1 | 8/2001 | Ohta et al. |
| 2001/0025958 A1 | 10/2001 | Yamazaki et al. |
| 2001/0030322 A1 | 10/2001 | Yamazaki et al. |
| 2001/0040661 A1 | 11/2001 | Ohta et al. |
| 2001/0043304 A1 | 11/2001 | Matsumoto |
| 2001/0046027 A1 | 11/2001 | Tai et al. |
| 2002/0044140 A1 | 4/2002 | Inukai |
| 2002/0056838 A1 | 5/2002 | Ogawa |
| 2002/0063835 A1 | 5/2002 | Kim |
| 2002/0132454 A1 | 9/2002 | Ohtsu et al. |
| 2002/0140891 A1 | 10/2002 | Tomioka et al. |
| 2002/0176030 A1 | 11/2002 | Matsumoto |
| 2002/0196394 A1 | 12/2002 | Ohta et al. |
| 2003/0103181 A1 | 6/2003 | Imayama et al. |
| 2003/0133066 A1 | 7/2003 | Ono et al. |
| 2003/0142259 A1 | 7/2003 | Asai et al. |
| 2003/0189401 A1 | 10/2003 | Kido et al. |
| 2003/0207050 A1 | 11/2003 | Hay et al. |
| 2003/0218222 A1 | 11/2003 | Wager, III et al. |
| 2003/0218664 A1 | 11/2003 | Sakamoto et al. |
| 2003/0227590 A1 | 12/2003 | Oke et al. |
| 2004/0038446 A1 | 2/2004 | Takeda et al. |
| 2004/0051100 A1 | 3/2004 | Yamazaki et al. |
| 2004/0051821 A1 | 3/2004 | Cheng et al. |
| 2004/0127038 A1 | 7/2004 | Carcia et al. |
| 2004/0137269 A1 | 7/2004 | Hay et al. |
| 2004/0174483 A1 | 9/2004 | Nakamura et al. |
| 2004/0183978 A1 | 9/2004 | Jeoung |
| 2004/0263750 A1 | 12/2004 | Chae |
| 2005/0001959 A1 | 1/2005 | Chang |
| 2005/0007507 A1 | 1/2005 | Ono et al. |
| 2005/0017302 A1 | 1/2005 | Hoffman |
| 2005/0040400 A1 | 2/2005 | Yamazaki et al. |
| 2005/0046763 A1 | 3/2005 | Ono et al. |
| 2005/0078252 A1 | 4/2005 | Lin |
| 2005/0105032 A1 | 5/2005 | Ono et al. |
| 2005/0105033 A1 | 5/2005 | Itou et al. |
| 2005/0116231 A1 | 6/2005 | Kang et al. |
| 2005/0128390 A1 | 6/2005 | Yang |
| 2005/0140867 A1 | 6/2005 | Choi |
| 2005/0199959 A1 | 9/2005 | Chiang et al. |
| 2005/0202601 A1 | 9/2005 | Koide |
| 2005/0231673 A1 | 10/2005 | Yamazaki et al. |
| 2005/0264731 A1 | 12/2005 | Itou et al. |
| 2005/0275038 A1 | 12/2005 | Shih et al. |
| 2006/0001817 A1 | 1/2006 | Yamazaki et al. |
| 2006/0003479 A1 | 1/2006 | Park et al. |
| 2006/0023152 A1 | 2/2006 | Ohta et al. |
| 2006/0035452 A1 | 2/2006 | Carcia et al. |
| 2006/0043377 A1 | 3/2006 | Hoffman et al. |
| 2006/0055859 A1 | 3/2006 | Jin et al. |
| 2006/0061701 A1 | 3/2006 | Chang |
| 2006/0061722 A1 | 3/2006 | Jun |
| 2006/0091793 A1 | 5/2006 | Baude et al. |
| 2006/0092356 A1 | 5/2006 | Morimoto et al. |
| 2006/0092363 A1 | 5/2006 | Hasegawa et al. |
| 2006/0103789 A1 | 5/2006 | Takahashi et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0125993 A1 | 6/2006 | Hoshino et al. |
| 2006/0164575 A1 | 7/2006 | Su et al. |
| 2006/0169973 A1 | 8/2006 | Isa et al. |
| 2006/0170111 A1 | 8/2006 | Isa et al. |
| 2006/0186413 A1 | 8/2006 | Sakakura et al. |
| 2006/0192912 A1 | 8/2006 | Itou et al. |
| 2006/0197092 A1 | 9/2006 | Hoffman et al. |
| 2006/0208977 A1 | 9/2006 | Kimura |
| 2006/0215086 A1 | 9/2006 | Kurasawa |
| 2006/0215087 A1 | 9/2006 | Matsushima et al. |
| 2006/0228974 A1 | 10/2006 | Theiss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0267891 A1 | 11/2006 | Nishimura et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0002199 A1 | 1/2007 | Fujikawa et al. |
| 2007/0013820 A1 | 1/2007 | Jeoung |
| 2007/0024187 A1 | 2/2007 | Shin et al. |
| 2007/0046191 A1 | 3/2007 | Saito |
| 2007/0052025 A1 | 3/2007 | Yabuta |
| 2007/0052901 A1 | 3/2007 | Ohta et al. |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0126969 A1 | 6/2007 | Kimura et al. |
| 2007/0146591 A1 | 6/2007 | Kimura et al. |
| 2007/0146605 A1 | 6/2007 | Park et al. |
| 2007/0152217 A1* | 7/2007 | Lai ............ H01L 29/7869 438/149 |
| 2007/0153198 A1 | 7/2007 | Cho et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215945 A1 | 9/2007 | Tokunaga et al. |
| 2007/0252928 A1 | 11/2007 | Ito et al. |
| 2007/0272922 A1 | 11/2007 | Kim et al. |
| 2007/0284627 A1 | 12/2007 | Kimura |
| 2007/0287296 A1 | 12/2007 | Chang |
| 2008/0002079 A1 | 1/2008 | Kimura |
| 2008/0006877 A1 | 1/2008 | Mardilovich et al. |
| 2008/0038882 A1 | 2/2008 | Takechi et al. |
| 2008/0038929 A1 | 2/2008 | Chang |

(56) References Cited

U.S. PATENT DOCUMENTS

| | | |
|---|---|---|
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0149937 A1 | 6/2008 | Moriwaki |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0096974 A1 | 4/2009 | Ono et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0167997 A1 | 7/2009 | Ohta et al. |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2010/0060811 A1 | 3/2010 | Yamazaki et al. |
| 2010/0065844 A1 | 3/2010 | Tokunaga |
| 2010/0066955 A1 | 3/2010 | Hoshino et al. |
| 2010/0092800 A1 | 4/2010 | Itagaki et al. |
| 2010/0109002 A1 | 5/2010 | Itagaki et al. |
| 2010/0120180 A1 | 5/2010 | Yamazaki et al. |
| 2010/0195038 A1 | 8/2010 | Ohta et al. |
| 2011/0024758 A1 | 2/2011 | Kimura |
| 2011/0037917 A1 | 2/2011 | Kimura |
| 2011/0101352 A1 | 5/2011 | Hosono et al. |
| 2011/0201162 A1 | 8/2011 | Hosono et al. |
| 2012/0002150 A1 | 1/2012 | Ono et al. |
| 2012/0002151 A1 | 1/2012 | Ono et al. |
| 2012/0012838 A1 | 1/2012 | Hosono et al. |
| 2012/0086739 A1 | 4/2012 | Akimoto et al. |
| 2013/0153909 A1 | 6/2013 | Kimura |
| 2014/0021476 A1 | 1/2014 | Shibata et al. |
| 2014/0027793 A1 | 1/2014 | Matsueda |
| 2016/0306240 A1 | 10/2016 | Yamazaki et al. |

FOREIGN PATENT DOCUMENTS

| | | |
|---|---|---|
| CN | 001489189 A | 4/2004 |
| CN | 001512227 A | 7/2004 |
| CN | 001591099 A | 3/2005 |
| CN | 001591138 A | 3/2005 |
| CN | 001622337 A | 6/2005 |
| CN | 002715193 Y | 8/2005 |
| CN | 001666140 A | 9/2005 |
| CN | 001755446 A | 4/2006 |
| EP | 0685757 A | 12/1995 |
| EP | 0851270 A | 7/1998 |
| EP | 1081676 A | 3/2001 |
| EP | 1103947 A | 5/2001 |
| EP | 1122794 A | 8/2001 |
| EP | 1128430 A | 8/2001 |
| EP | 1209748 A | 5/2002 |
| EP | 1447786 A | 8/2004 |
| EP | 1564713 A | 8/2005 |
| EP | 1737044 A | 12/2006 |
| EP | 2226847 A | 9/2010 |
| EP | 2246894 A | 11/2010 |
| EP | 2256718 A | 12/2010 |
| EP | 2261978 A | 12/2010 |
| EP | 2287825 A | 2/2011 |
| EP | 2299435 A | 3/2011 |
| EP | 2413366 A | 2/2012 |
| GB | 2166276 | 4/1986 |
| JP | 58-139173 A | 8/1983 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-036030 A | 2/1995 |
| JP | 07-104312 A | 4/1995 |
| JP | 08-078329 A | 3/1996 |
| JP | 08-264794 A | 10/1996 |
| JP | 08-295514 A | 11/1996 |
| JP | 09-005793 A | 1/1997 |
| JP | 09-146108 A | 6/1997 |
| JP | 09-292504 A | 11/1997 |
| JP | 10-062802 A | 3/1998 |
| JP | 10-186405 A | 7/1998 |
| JP | 11-505377 | 5/1999 |
| JP | 11-202356 A | 7/1999 |
| JP | 2000-044236 A | 2/2000 |
| JP | 2000-081637 A | 3/2000 |
| JP | 2000-089255 A | 3/2000 |
| JP | 2000-150900 A | 5/2000 |
| JP | 2000-284326 A | 10/2000 |
| JP | 2000-351974 A | 12/2000 |
| JP | 2001-056474 A | 2/2001 |
| JP | 2001-059976 A | 3/2001 |
| JP | 2001-083540 A | 3/2001 |
| JP | 2001-144301 A | 5/2001 |
| JP | 2001-159872 A | 6/2001 |
| JP | 2001-166321 A | 6/2001 |
| JP | 2001-174818 A | 6/2001 |
| JP | 2001-175198 A | 6/2001 |
| JP | 2001-183992 A | 7/2001 |
| JP | 2001-201754 A | 7/2001 |
| JP | 2001-209069 A | 8/2001 |
| JP | 2001-222240 A | 8/2001 |
| JP | 2001-281703 A | 10/2001 |
| JP | 2001-290439 A | 10/2001 |
| JP | 2001-311954 A | 11/2001 |
| JP | 2001-313397 A | 11/2001 |
| JP | 2002-076356 A | 3/2002 |
| JP | 2002-169179 A | 6/2002 |
| JP | 2002-182228 A | 6/2002 |
| JP | 2002-221736 A | 8/2002 |
| JP | 2002-268074 A | 9/2002 |
| JP | 2002-289859 A | 10/2002 |
| JP | 2002-318554 A | 10/2002 |
| JP | 2003-022049 A | 1/2003 |
| JP | 2003-050405 A | 2/2003 |
| JP | 2003-068757 A | 3/2003 |
| JP | 2003-086000 A | 3/2003 |
| JP | 2003-086808 A | 3/2003 |
| JP | 2003-122301 A | 4/2003 |
| JP | 2003-149675 A | 5/2003 |
| JP | 2003-172946 A | 6/2003 |
| JP | 2003-177417 A | 6/2003 |
| JP | 2003-202589 A | 7/2003 |
| JP | 2003-202834 A | 7/2003 |
| JP | 2003-207797 A | 7/2003 |
| JP | 2003-315827 A | 11/2003 |
| JP | 2003-330422 A | 11/2003 |
| JP | 2003-332581 A | 11/2003 |
| JP | 2004-012731 A | 1/2004 |
| JP | 2004-103957 A | 4/2004 |
| JP | 2004-119599 A | 4/2004 |
| JP | 2004-157552 A | 6/2004 |
| JP | 2004-212972 A | 7/2004 |
| JP | 2004-252071 A | 9/2004 |
| JP | 2004-271824 A | 9/2004 |
| JP | 2004-273614 A | 9/2004 |
| JP | 2004-273732 A | 9/2004 |
| JP | 2004-295135 A | 10/2004 |
| JP | 2004-303761 A | 10/2004 |
| JP | 2005-037741 A | 2/2005 |
| JP | 2005-077424 A | 3/2005 |
| JP | 2005-077822 A | 3/2005 |

(56) References Cited

FOREIGN PATENT DOCUMENTS

| | | |
|---|---|---|
| JP | 2005-084231 A | 3/2005 |
| JP | 2005-106967 A | 4/2005 |
| JP | 2005-107489 A | 4/2005 |
| JP | 2005-260145 A | 9/2005 |
| JP | 3695393 | 9/2005 |
| JP | 2005-354036 A | 12/2005 |
| JP | 2006-013433 A | 1/2006 |
| JP | 2006-039451 A | 2/2006 |
| JP | 2006-058908 A | 3/2006 |
| JP | 2006-085133 A | 3/2006 |
| JP | 2006-184325 A | 7/2006 |
| JP | 2008-176262 A | 7/2008 |
| KR | 2000-0057644 A | 9/2000 |
| KR | 2004-0012208 A | 2/2004 |
| WO | WO-2001/018597 | 3/2001 |
| WO | WO-2001/033292 | 5/2001 |
| WO | WO-2001/071417 | 9/2001 |
| WO | WO-2003/093897 | 11/2003 |
| WO | WO-2004/114391 | 12/2004 |
| WO | WO-2005/088726 | 9/2005 |
| WO | WO-2005/093850 | 10/2005 |

OTHER PUBLICATIONS

Hosono.H et al., "Transparent flexible transistor using amorphous oxide semiconductors as active layer", Oyobuturi, 2005, vol. 74, No. 7, pp. 910-916, JSAP(The Japan Society of Applied Physics).

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21 2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Nl, Cu,or Zn] At Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

(56) References Cited

OTHER PUBLICATIONS

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 9 3, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistorsby AR Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 DIGEST, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW'09 : Proceedings of the 16th International Display Workshops, 2009, pp. 689-692.

Son.K et al., "42.4L: Late-News Paper: 4 Inch QVGA AMOLED Driven by The Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW'02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Choi.M et al., "P-110: A Single Gap Transflective Display Using a Fringe-Field Driven Homogeneously Aligned Nematic Liquid Crystal Display", SID Digest '05 : SID International Symposium Digest of Technical Papers, 2005, vol. 36, pp. 719-721.

Lee.S et al., "29.2: 18.1 Ultra-FFS TFT-LCD With Super Image Quality and Fast Response Time", SID Digest '01 : SID International Symposium Digest of Technical Papers, 2001, vol. 32, pp. 484-487.

Song.J et al., "Electro-optic Characteristics of Fringe-Field Driven Transflective LCD with Dual Cell Gap", IDW/AD '05(Proceedings of The 12th International Display Workshops in conjunction with Asia Display), Dec. 6, 2005, vol. 1, pp. 103-106.

You.J et al., "23.4: Characteristics and Reliabilities of the Ion Beam Irradiated Polyimide as an LC Alignment Layer", SID Digest '05 : SID International Symposium Digest of Technical Papers, 2005, vol. 36, pp. 1089-1091.

(56) References Cited

OTHER PUBLICATIONS

Lu.R et al., "Transflective Liquid Crystal Display Using In-plane Switching Effect", Conference Record of The 2006 IDRC (International Display Research Conference), Sep. 1, 2006, pp. 39-42.
Lee.G et al., "Design of Wide-Viewing-Angle Transflective IPS LCD", Conference Record of The 2006 IDRC (International Display Research Conference), Sep. 1, 2006, pp. 75-77.
Aoki.N, "Advanced IPS Technology for Mobile Applications", SID Digest '06 : SID International Symposium Digest of Technical Papers, 2006, vol. 37, pp. 1087-1090.
Sakamoto.M et al., "Development of the Novel Transflective LCD Module Using Super-Fine-TFT Technology", SID Digest '06 : SID International Symposium Digest of Technical Papers, 2006, vol. 37, pp. 1669-1672.
Lee.G et al., "Optical Configurations of Horizontal-Switching Transflective LCDs in Double Cellgap Structure", IDW/AD '05(Proceedings of The 12th International Display Workshops in conjunction with Asia Display), 2005, vol. 1, pp. 111-114.
Itou.O et al., "A Wide Viewing Angle Transflective IPS LCD Applying New Optical Design", SID Digest '06 : SID International Symposium Digest of Technical Papers, 2006, vol. 37, pp. 832-835.
Chinese Office Action ((Application No. 201310182364.1) dated Apr. 3, 2015.
European Search Report (Application No. 10010225.0) dated Jun. 18, 2015.
Chinese Office Action (Application No. 201310182364.1) dated May 31, 2016.
Chinese Office Action (Application No. 201510441592.5) dated Jan. 29, 2018.
Chinese Office Action (Application No. 201510441592.5) dated Aug. 22, 2018.

\* cited by examiner

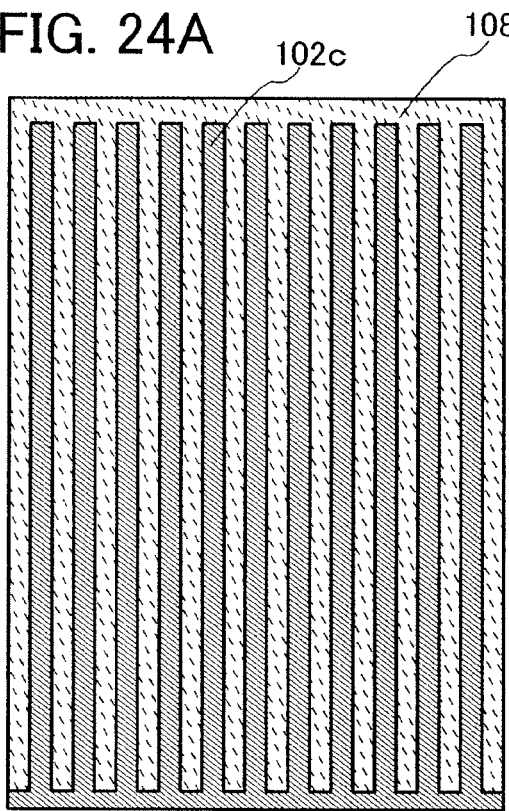
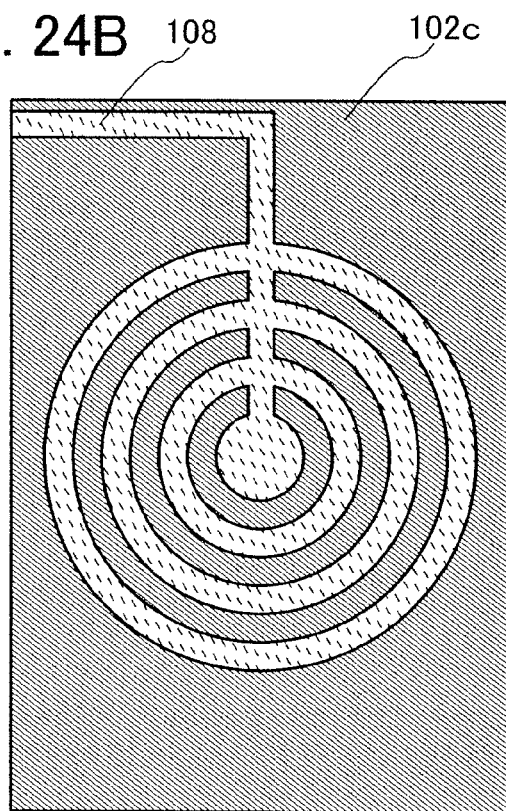
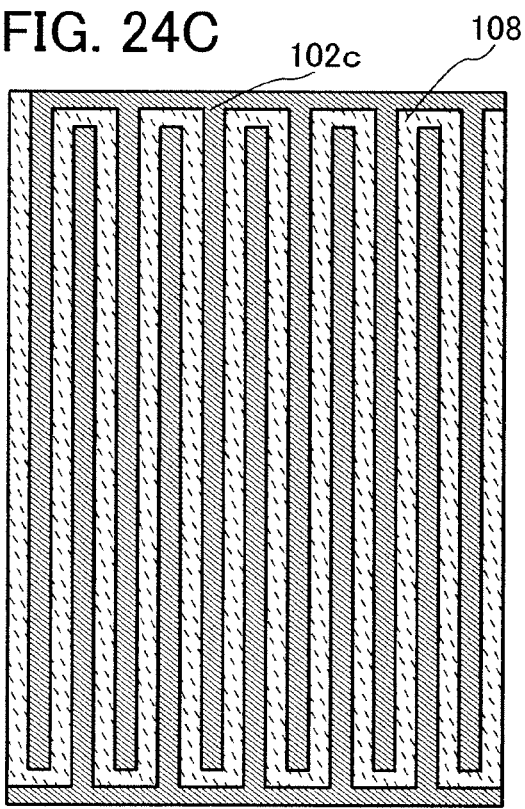
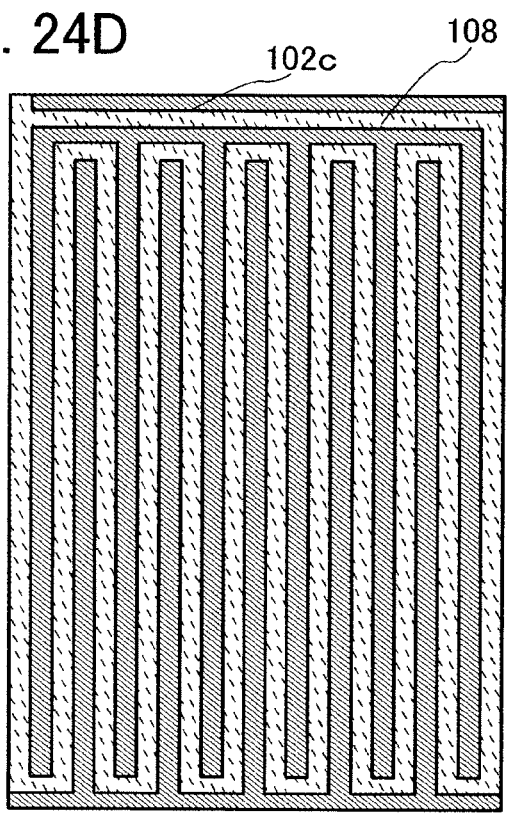

LIQUID CRYSTAL DISPLAY DEVICE, SEMICONDUCTOR DEVICE, AND ELECTRONIC APPLIANCE

CROSS-REFERENCE TO RELATED APPLICATIONS

This application is a continuation of U.S. application Ser. No. 16/888,906, filed Jun. 1, 2020, now allowed, which is a continuation of U.S. application Ser. No. 15/963,150, filed Apr. 26, 2018, now U.S. Pat. No. 10,684,517, which is a continuation of U.S. application Ser. No. 14/957,746, filed Dec. 3, 2015, now U.S. Pat. No. 9,958,736, which is a continuation of U.S. application Ser. No. 12/904,537, filed Oct. 14, 2010, now U.S. Pat. No. 9,207,504, which is a continuation of U.S. application Ser. No. 11/695,898, filed Apr. 3, 2007, now U.S. Pat. No. 9,213,206, which claims the benefit of a foreign priority application filed in Japan as Serial No. 2006-105618 on Apr. 6, 2006, all of which are incorporated by reference.

BACKGROUND OF THE INVENTION

1. Field of the Invention

The present invention relates to a semiconductor device, a liquid crystal display device, and an electronic appliance including them. In particular, the present invention relates to a semiconductor device and a liquid crystal display device in which an electric field generally parallel to a substrate is generated to control liquid crystal molecules, and an electronic appliance including the semiconductor device or the liquid crystal display device.

2. Description of the Related Art

As one of plans for technical development of a liquid crystal display device, to widen a viewing angle can be given. As a technique for realizing a wide viewing angle, a mode in which an electric field generally parallel to a substrate is generated and liquid crystal molecules are moved in a plane parallel to the substrate to control grayscale is employed. As such a mode, IPS (In-Plane Switching) and FFS (Fringe-Field Switching) are given. In these modes, a first electrode (such as a pixel electrode with which voltage is controlled for each pixel) having a slit (an opening pattern) is located under a liquid crystal and a second electrode (such as a common electrode with which common voltage is applied to all pixels) is located under the first electrode. An electric field is applied between the pixel electrode and the common electrode, so that the liquid crystal is controlled. With such layout, an electric field in a direction parallel to a substrate is applied to the liquid crystal. Therefore, the liquid crystal molecules can be controlled with the electric field. That is, the liquid crystal molecules which are aligned parallel to the substrate (so called homogeneous alignment) can be controlled in a direction parallel to the substrate; therefore, viewing angle is increased.

Conventionally, both common electrode and pixel electrode are formed of ITO (indium tin oxide) (Patent Document 1: Japanese Published Patent Application No. 2000-89255 (FIG. 5 and 14th paragraph)).

SUMMARY OF THE INVENTION

As described above, in the case of employing a structure in which the second electrode (such as the common electrode) is located under the first electrode (such as the pixel electrode), both the common electrode and the pixel electrode are formed of ITO conventionally. Accordingly, the numbers of manufacturing steps and masks, and manufacturing cost have been increased. The present invention is made in view of the foregoing, and an object of the present invention is to provide a liquid crystal display device and an electronic appliance with wide viewing angle, having less numbers of manufacturing steps and masks and low manufacturing cost compared with a conventional device; and to provide a manufacturing method of the liquid crystal display device.

To solve the aforementioned problems, a liquid crystal display device according to the present invention includes a first electrode formed over a substrate, an insulating film formed over the first electrode, a second electrode formed over the insulating film, and a liquid crystal provided over the second electrode; in which the second electrode has an opening pattern and the first electrode has a semiconductor film containing silicon.

A semiconductor device according to the present invention includes a first electrode formed over a substrate, an insulating film formed over the first electrode, and a second electrode formed over the insulating film; in which the second electrode has an opening pattern and the first electrode has a semiconductor film containing silicon A liquid crystal display device according to the present invention includes a first electrode formed over a substrate, an insulating film formed over the first electrode, a second electrode formed over the insulating film, a liquid crystal provided over the second electrode, and a transistor formed over the substrate; in which the second electrode has an opening pattern, the first electrode has a semiconductor film containing silicon, the transistor has a semiconductor film containing silicon, and the semiconductor film included in the first electrode is formed at the same time as the semiconductor film included in the transistor.

A semiconductor device according to the present invention includes a first electrode formed over a substrate, an insulating film formed over the first electrode, a second electrode formed over the insulating film, and a transistor formed over the substrate; in which the second electrode has an opening pattern, the first electrode has a semiconductor film containing silicon, the transistor has a semiconductor film containing silicon, and the semiconductor film included in the first electrode is formed at the same time as the semiconductor film included in the transistor.

In the liquid crystal display device and the semiconductor device, the first electrode and the semiconductor film included in the transistor are formed at the same time, and then, etched and patterned at the same time. Accordingly, the first electrode and the semiconductor film included in the transistor contain the same material. In addition, an n-type impurity or a p-type impurity is introduced thereto at the same time in some cases. In such a case, they have a portion with approximately the same concentration of the impurity. Note that the transistor includes a portion to which the impurity is introduced, a portion to which the impurity is slightly introduced, a portion to which the impurity is hardly introduced, and the like. The first electrode is generally in the same states as the portion in the semiconductor film included in the transistor, to which the impurity is introduced in many cases. Thus, the first electrode can be formed at the same time as the transistor. Therefore, an additional step is not required to form the first electrode. In addition, a liquid crystal display device with wide viewing angle and low manufacturing cost compared with a conventional device can be provided.

Note that the opening pattern includes not only a closed opening pattern such as a slit, but also a space which is located between the conductive patterns and in which the conductive pattern is not formed, such as a space between the comb-teeth of a comb-shaped electrode. The same can be applied to description hereinafter.

Note that in the aforementioned liquid crystal display device and the semiconductor device, a portion in which first and second interlayer insulating films are provided between the first electrode and the second electrode, and the second electrode and the first electrode except for the opening pattern are overlapped each other the first electrode; the first interlayer insulating film, and the second electrode can function as a capacitor. In this case, storage capacitance can be increased. Therefore, when a thin film transistor is turned off, the potential of the pixel electrode can be easily kept.

A liquid crystal display device according to the present invention includes a first electrode formed over a substrate, an insulating film formed over the first electrode, a second electrode formed over the insulating film, a liquid crystal provided over the second electrode, and a transistor formed over the substrate; in which the second electrode includes an opening pattern, the first electrode includes a semiconductor film containing silicon, the semiconductor film included in the first electrode is formed at the same time as the semiconductor film included in the transistor, and the semiconductor film included in the first electrode and the semiconductor film included in the transistor contain an impurity having the same conductivity type.

A semiconductor device according to the present invention includes a first electrode formed over a substrate, an insulating film formed over the first electrode, a second electrode formed over the insulating film, and a transistor formed over the substrate; in which the second electrode includes opening pattern, the first electrode includes a semiconductor film containing silicon, the semiconductor film included in the first electrode is formed at the same time as the semiconductor film included in the transistor, and the semiconductor film included in the first electrode and the semiconductor film included in the transistor contain an impurity having the same conductivity type.

When the first electrode and the transistor contain the impurity having the same conductivity type (such as an n-type or a p-type), the layout can be efficient. Accordingly, the aperture ratio can be improved.

A liquid crystal display device according to the present invention includes a transistor formed over a substrate, a semiconductor film formed in the transistor, a first electrode formed by a part of the semiconductor film, an insulating film formed over the first electrode, a second electrode formed over the insulating film, and a liquid crystal provided over the second electrode; in which the second electrode includes an opening pattern.

A semiconductor device according to the present invention includes a transistor formed over a substrate, a semiconductor film formed in the transistor, a first electrode formed by a part of the semiconductor film, an insulating film formed over the first electrode, and a second electrode formed over the insulating film; in which the second electrode includes an opening pattern.

When the first electrode and the semiconductor film included in the transistor are formed in one island as described above, the layout can be efficient. Accordingly, the aperture ratio can be improved.

In the aforementioned structure of the liquid crystal display device according to the present invention, the first electrode is a pixel electrode and the second electrode is a common electrode.

In the aforementioned structure of the semiconductor device according to the present invention, the first electrode is a pixel electrode and the second electrode is a common electrode.

In the aforementioned structure of the liquid crystal display device according to the present invention, the first electrode is a common electrode and the second electrode is a pixel electrode.

In the aforementioned structure of the semiconductor device according to the present invention, the first electrode is a common electrode and the second electrode is a pixel electrode.

In the aforementioned structure of the liquid crystal display device according to the present invention, orientation of the liquid crystal is controlled by an electric field between the first electrode and the second electrode.

Note that a switch shown in the present invention may be any switch such as an electrical switch or a mechanical switch. That is, as long as current flow can be controlled, any type of switch can be used without being limited to a particular type. For example, a transistor, a diode (such as a PN diode, a PIN diode, a Schottky diode, or a diode-connected transistor), or a logic circuit that is a combination thereof may be used. In the case of using a transistor as a switch, a polarity (conductivity) type of the transistor is not particularly limited because it operates as a mere switch. However, when off current is preferred to be small, a transistor of a polarity with smaller off current is desirably used. As a transistor with small off current, a transistor having an LDD region, a transistor having a multigate structure, and the like are given. Further, an N channel transistor is desirably used when a potential of a source terminal of the transistor functioning as a switch is close to a low potential side power source (Vss, GND, 0V, or the like). On the other hand, a P-channel transistor is desirably used when the potential of the source terminal is close to a high potential side power source (Vdd or the like). This is because it is easy for a transistor to function as a switch when an absolute value of a gate-source voltage is increased. Note that a CMOS switch can also be applied by using both N-channel and P-channel transistors. With a CMOS switch, an operation can be appropriately performed even when the situation changes such that a voltage outputted through the switch (that is, an input voltage) is higher or lower than an output voltage. Although as a switch in the present invention, a TFT controlling a pixel electrode, a switch element used in a driver circuit portion, and the like are given; a switch can be employed in another part, if current flow is required to be controlled.

In the present invention, "being connected" includes "being electrically connected" and "being directly connected". Here, "being electrically connected" refers to a state in which an element capable of electric connection (such as a switch, a transistor, a capacitor, an inductor a resistor, or a diode) may be interposed in the predetermined connection. In addition, "being directly connected" refers to only a specific case of "being electrically connected", where no element capable of electric connection is interposed and direct connection is achieved. That is, "being directly connected" specifically refers to "being electrically connected" without another element interposed in the predetermined connection. Note that the description "being directly connected" means the same as "being connected in a direct manner" is also used.

Note that a display element, a display device, and a light emitting device can employ various modes or can include various elements. For example, a display medium whose contrast varies by an electromagnetic action can be used, such as an EL element (an organic EL element, an inorganic EL element, or an EL element including organic and inorganic substances), an electron emitting element, a liquid crystal element, electron ink, a grating light valve (GLV), a plasma display panel (PDP), a digital micromirror device (DMD), a piezoceramic display, or a carbon nanotube. Note that a display device using an EL element includes an EL display; a display device using an electron emitting element includes a field emission display (FED), an SED flat panel display (SED: Surface-conduction Electron-emitter Display), and the like; a display device using a liquid crystal element includes a liquid crystal display, a transmissive liquid crystal display, a transflective liquid crystal display, and a reflective liquid crystal display; and a display device using electronic ink includes electronic paper. As an application of the present invention other than a liquid crystal element, for example, an electrode containing silicon is used for an electrode in an EL element and the like. Therefore, an element such as an EL element can be manufactured at low cost. In this case, an electrode may have an opening pattern, but not necessarily. When an electrode containing silicon of the present invention is used in an organic EL element, a structure in which a layer containing an organic compound is interposed between electrodes is favorably employed, but not necessarily. On the other hand, when the electrode containing silicon of the present invention is used in an inorganic EL element, a structure in which a layer containing an inorganic compound is interposed between electrodes may be employed, or a structure in which a layer containing an inorganic compound is formed over the electrode may be employed; since AC drive is possible in the inorganic EL element. In the latter structure, light emission can be carried out with use of a lateral electric field formed by a first electrode and a second electrode. With such a structure, a component which attenuates light from the electrode or the like is not necessarily provided on a light emitting side, accordingly, luminance of the EL display device is improved and deterioration of the EL display device is suppressed.

Note that various types of transistors can be applied to the present invention and an applicable type of the transistor is not limited. Accordingly, the present invention can employ a thin film transistor (TFT) using a non-single crystalline semiconductor film typified by amorphous silicon or polycrystalline silicon, a transistor using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, and the like. In addition, a type of substrate on which a transistor is provided is not particularly limited. The transistor can be formed on a single crystalline substrate, an SOI substrate, a glass substrate, a plastic substrate, a paper substrate, a cellophane substrate, a stone substrate, or the like. In addition, after forming a transistor over a substrate, the transistors may be transposed to another substrate to be located thereon.

Note that as described above, in the present invention, various types of transistor can be used and can be formed over any substrate. Therefore, all circuits may be formed over a glass substrate, a plastic substrate, a single crystalline substrate, an SOI circuit, or any other circuit. When all circuits are formed on one substrate, the cost can be reduced by reducing the number of components and the reliability can be improved by reducing the number of connection to components in the circuits. Alternatively, it is possible that some circuits are formed on a substrate and some other circuits are formed on another substrate. That is, all of the circuits are not necessarily formed over one substrate. For example, some circuits are formed over a glass substrate with a use of a transistor while some other circuits are formed over a single crystalline substrate, and the IC chip may be connected to the glass substrate by COG (Chip On Glass) to be located thereover. Alternatively, the IC chip may be connected to the glass substrate by TAB (Tape Auto Bonding) or by using a printed board. In this manner, when some circuits are formed over one substrate, the cost can be reduced by reducing the number of components and the reliability can be improved by reducing the number of connection to components in the circuits. Further, when portions with high drive voltage or high drive frequency, which consume more power, are not formed on one substrate, increase in power consumption can be prevented.

It is to be noted that a transistor can have various structures and modes, and is not limited to a specific structure. For example, a multigate structure which has two or more gates may be employed as well. With a multigate structure, off current can be reduced and reliability can be improved by improving the pressure resistance of a transistor, and flat characteristics can be obtained such that a drain-source current hardly changes even when a drain-source voltage changes in operation in a saturation region. Alternatively, a structure in which gate electrodes may be provided over and under a channel may be employed. With such a structure in which gate electrodes are provided over and under a channel, a current value can be easily increased since a channel forming region increases, an S value (subthreshold coefficient) can be reduced since a depletion layer is easily formed. Further alternatively, a structure in which a gate electrode is provided over a channel or under the channel may be employed. Also, a forward staggered structure or an inversed staggered structure may be employed. A channel forming region may be divided into a plurality of regions, connected in parallel, or connected in series. Further, a source electrode or a drain electrode may overlap with a channel (or a part thereof). Accordingly, with such a structure in which a source electrode or a drain electrode overlaps with a channel (or a part of thereof), charges are accumulated in a part of the channel and an unstable operation can be prevented. Further, an LDD region may be provided. By providing an LDD region, off current can be reduced and reliability can be improved by improving the withstand voltage of a transistor, and flat characteristics can be obtained such that a drain-source current hardly changes even when a drain-source voltage changes in operation in a saturation region.

Note that in the present invention, one pixel corresponds to one element which can control brightness. Therefore, for example, one pixel shows one color element by which brightness is expressed. Accordingly, in the case of a color display device formed of color elements of R (red), G (green), and B (blue), the smallest unit of an image includes three pixels of an R pixel, a G pixel, and a B pixel. Note that color elements are not limited to three colors and may be more colors, and RGBW (W is white) or RGB to which another color such as yellow, cyan, or magenta is introduced may be used, for example. Further, when one color element is controlled by using a plurality of regions, one of the regions corresponds to one pixel. For example, in the case of performing an area gray scale display, a plurality of regions are provided for one color element to control the brightness, which express gray scale as a whole. One of the regions to control the brightness corresponds to one pixel. Therefore, in that case, one color element includes a plurality of pixels. In that case, a region which contributes to display an image may differ in size depending on the pixels. Further, in a plurality of regions controlling the brightness which are provided for one color element, that is, in a plurality of pixels included in one color element, signals provided to each pixel may slightly differ from one another so that the viewing angle is expanded. Note that the description "one pixel (for three colors)" corresponds to three pixels of R, G, and B which are considered as one pixel; while "one pixel (for one color)" corresponds to a plurality of pixels provided for one color element which are collectively considered as one pixel.

Note that in the present invention, there is a case where pixels are arranged in matrix. The case where pixels are arranged in matrix includes not only to a case where the pixels are arranged in a stripe pattern, which is a so-called grid configuration where longitudinal stripes and lateral stripes cross each other, but also to a case where three color elements are arranged in a so-called delta pattern when a full color display is performed using three color elements (for example, RGB). Further, a Bayer arrangement is also included. Note that the color element is not limited to three colors and may have more colors, for example, RGBW (W is white) or RGB to which yellow, cyan, or magenta is added. The size of a light emission area may be different depending on color elements.

A transistor is an element including at least three terminals of a gate, a drain, and a source. A channel forming region is provided between a drain region and a source region. Here, it is difficult to determine which of two terminals is a source or a drain since it depends on a structure, operating condition, and the like of the transistor. Therefore, in the present invention, regions which function as a source and a drain are referred to as a first terminal and a second terminal, respectively.

Note that a gate includes a gate electrode and a gate wiring (also referred to as a gate line, a gate signal line, or the like) or a part thereof. A gate electrode corresponds to a conductive film a part of which overlaps with a semiconductor forming a channel forming region, an LDD (Lightly Doped Drain) region, or the like, with a gate insulating film interposed therebetween. A gate wiring corresponds to a wiring for connecting gate electrodes of each pixel and a wiring for connecting a gate electrode and another wiring.

However, there is a part which functions as a gate electrode and also as a gate wiring. Such a region may be referred to as a gate electrode or a gate wiring. That is, there is a region which cannot be distinguished as a gate electrode or a gate wiring. For example, in a case where a channel forming region overlaps with a gate wiring which is extended, the overlapped region functions both as a gate wiring and as a gate electrode. Therefore, such a region may be referred to as a gate electrode or a gate wiring.

Further, a region which is formed of the same material as a gate electrode and connected to the gate electrode may be referred to as a gate electrode as well. Similarly, a region which is formed of the same material as a gate wiring and connected to the gate wiring may be referred to as a gate wiring. In a strict sense, such a region does not overlap with a channel forming region or does not have a function to connect to another gate electrode in some cases. However, there is a region which is formed of the same material as a gate electrode or a gate wiring and connected to the gate electrode or the gate wiring due to manufacturing cost, reduction of steps, layout, and the like. Therefore, such a region may also be referred to as a gate electrode or a gate wiring.

For example, in a multigate transistor, gate electrodes of one transistor and another transistor are often connected through a conductive film formed of the same material as the gate electrode. Such a region for connecting the gate electrodes may be referred to as a gate wiring, or may be referred to as a gate electrode when a multigate transistor is considered as one transistor. That is, a component which is formed of the same material as a gate electrode or a gate wiring and connected to the gate electrode or the gate wiring may be referred to as a gate electrode or a gate wiring. Moreover, for example, a portion of a conductive film which connects a gate electrode and a gate wiring may also be referred to as a gate electrode or a gate wiring.

Note that a gate terminal corresponds to a part of a region of a gate electrode or a region electrically connected to the gate electrode.

Note that a source includes a source region, a source electrode, and a source wiring (also referred to as a source line, a source signal line, or the like) or a part thereof. A source region corresponds to a semiconductor region which contains a large amount of p-type impurities (boron, gallium, or the like) or n-type impurities (phosphorus, arsenic, or the like). Therefore, a region containing a small amount of p-type impurities or n-type impurities, that is, an LDD (Lightly Doped Drain) region is not included in a source region. A source electrode corresponds to a conductive layer a part of which is formed of a different material from a source region and electrically connected to the source region. Note that a source electrode including a source region is sometimes referred to as a source electrode. A source wiring corresponds to a wiring for connecting source electrodes of each pixel and a wiring for connecting a source electrode and another wiring.

However, there is a part which functions as a source electrode and also as a source wiring. Such a region may be referred to as a source electrode or a source wiring. That is, there is a region which cannot be distinguished as a source electrode or a source wiring. For example, when there is a source region overlapping with a source wiring which is extended, the region functions as a source wiring and also as a source electrode. Therefore, such a region may be referred to as a source electrode or a source wiring.

Further, a region which is formed of the same material as a source electrode and connected to the source electrode; or a part which connects one source electrode and another source electrode may also be referred to as a source electrode. Further, a part overlapping with a source region may be referred to as a source electrode. Similarly, a region which is formed of the same material as a source wiring and connected to the source wiring may be referred to as a source wiring. In a strict sense, there is a case where such a region does not have a function to connect one source electrode to another source electrode. However, there is a region which is formed of the same material as a source electrode or a source wiring and connected to the source electrode or the source wiring due to manufacturing cost, reduction of steps, layout, and the like. Therefore, such a region may also be referred to as a source electrode or a source wiring.

For example, a conductive film a part of which connects a source electrode and a source wiring may be referred to as a source electrode or a source wiring.

Note that a source terminal corresponds to a part of a source region, a source electrode, or a region electrically connected to a source electrode.

Note that a drain is similar to a source.

Note that in the present invention, a semiconductor device corresponds to a device including a circuit having a semiconductor element (a transistor, a diode, or the like). Further, a semiconductor device may correspond to a general device which functions by utilizing semiconductor characteristics. A display device corresponds to a device including a display element (a liquid crystal element, a light emitting element, or the like). Note that a display device may correspond to a display panel itself in which a plurality of pixels including display elements such as a liquid crystal element or an EL element and a peripheral driver circuit for driving the pixels are formed over a substrate. Moreover, a display device may include a device provided with a flexible printed circuit (FPC) or a printed wiring board (PWB). Further, a light emitting device corresponds to a display device including a self-luminous light emitting element such as an EL element or an element used for an FED, in particular. A liquid crystal display device corresponds to a display device including a liquid crystal element.

In the present invention, an expression that an object is formed on or formed over a different object does not necessarily mean that the object is in direct contact with the different object. The expression may include a case where two objects are not in direct contact with each other, that is, a case where another object is interposed therebetween. Accordingly, for example, when it is described that a layer B is formed on (or over) a layer A, it means either case where the layer B is formed on and in direct contact with the layer A, or where another layer (for example, a layer C or a layer D) is formed on and in direct contact with the layer A and the layer B is formed on and in direct contact with the layer C or D. Similarly, when it is described that an object is formed above a different object, it does not necessarily mean that the object is in direct contact with the different object, and another object may be interposed therebetween. Accordingly, for example, when it is described that a layer B is formed above a layer A, it means either case where the layer B is formed in direct contact with the layer A, or where another layer (for example, a layer C or a layer D) is formed in direct contact with the layer A and the layer B is formed in direct contact with the layer C or D. Similarly, when it is described that an object is formed below or formed under a different object, it means either case where the objects are in direct contact with each other or not in contact with each other. In addition, if not specifically limited, one surface of a substrate is referred to as an upper direction, and the other surface of the substrate is referred to as a lower direction. That is, in a case where a layer B is formed over a layer A in manufacturing steps, its structure can be considered as a structure where the layer B is formed over the layer A, even when a completed product is turned upside down. That is, an expression over or under only refers to a side of an object to which another object is formed, and does not have a general meaning of over or under, which is "a direction with respect to gravity". Needless to say, similar description can be applied to other directions such as left or light. Note that it is not limited thereto when it is particularly specified, and the direction of gravity or the like may be employed as a standard.

With the present invention, a semiconductor film in a transistor and a first electrode for driving a liquid crystal can be formed in the same step. As a result, the first electrode can be manufactured without increasing the numbers of masks (reticles) and manufacturing steps.

Accordingly, a liquid crystal display device with wide viewing angle and low manufacturing cost compared with a conventional device can be provided.

BRIEF DESCRIPTION OF DRAWINGS

FIGS. 24A to 24D are plan views for illustrating shapes of an electrode of an FFS mode liquid crystal display device according to Embodiment Mode 19;

DETAILED DESCRIPTION OF THE INVENTION

Hereinafter, embodiment modes and embodiments in the present invention are described with reference to the accompanying drawings. However, the present invention can be carried out with many different modes and it is easily understood by those skilled in the art that modes and details can be modified in various ways without departing from the purpose and the scope of the present invention. Accordingly, the present invention should not be interpreted as being limited to the description of the embodiment modes and embodiments.

Embodiment Mode 1

Figure 1A:
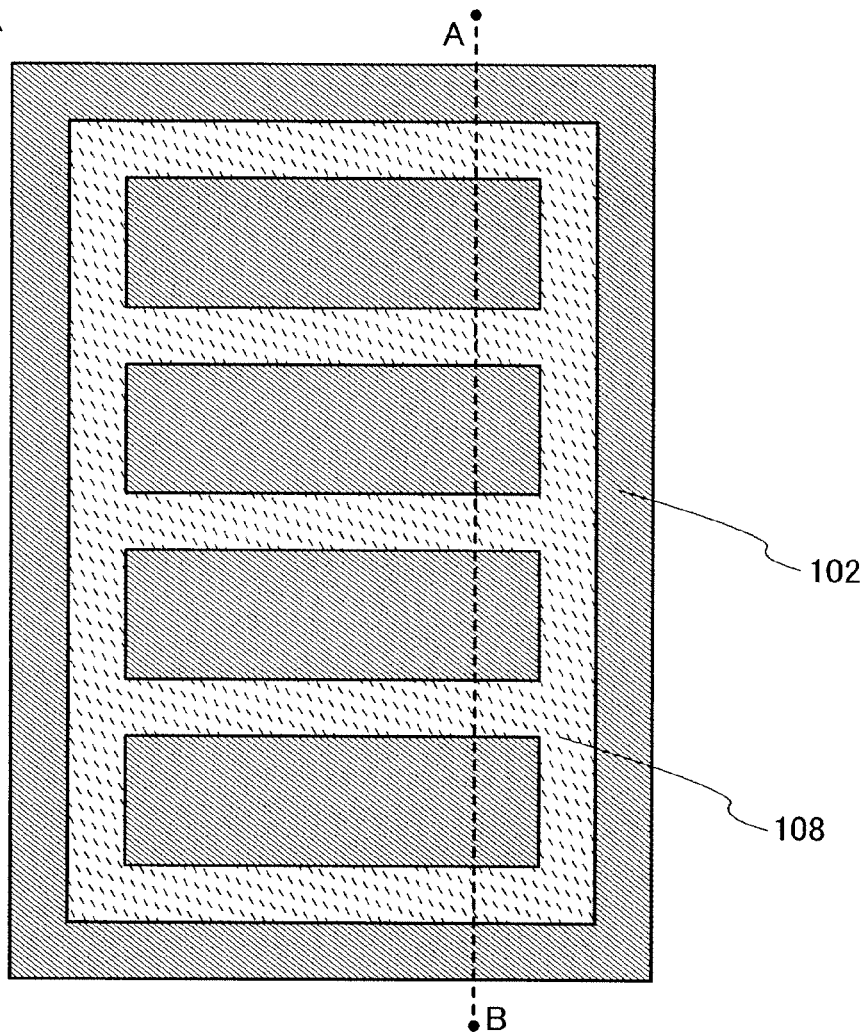
FIG. 1A is a plan view for illustrating a structure of a liquid crystal display device according to the present invention.
Figure 1B:
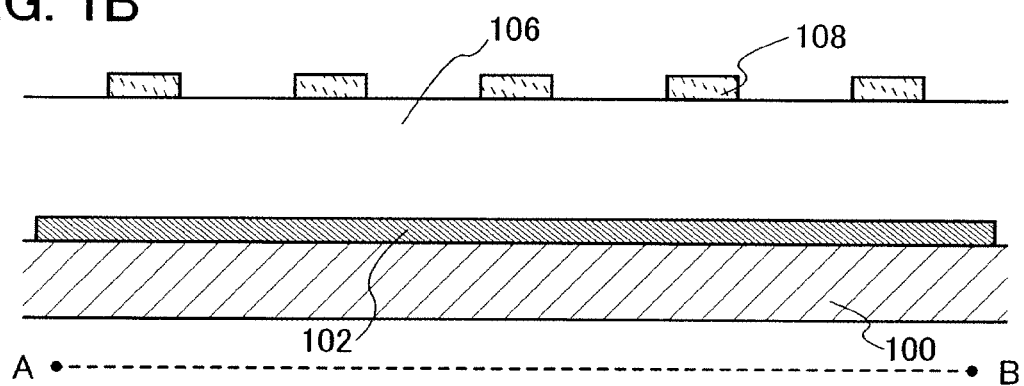
FIG. 1B is a cross-sectional view along a line A-B of FIG. 1A.

FIGS. 1A and 1B illustrate a basic example of the present invention. FIG. 1A is a plan view and FIG. 1B is a cross-sectional view.

A first electrode 102 is formed over a substrate 100. The first electrode 102 is formed with use of ITO (indium tin oxide) conventionally.

In the present invention, the first electrode 102 is formed of, for example, a semiconductor material containing silicon, although not limited thereto. Alternatively, amorphous silicon may be used but in order to enhance conductivity, polysilicon (polycrystalline silicon), single crystalline silicon, and the like may be used. Further, in many cases, the first electrode contains an impurity (a p-type impurity or an n-type impurity) such as phosphorus, boron, gallium, or arsenic to further enhance the conductivity.

The reason of using a semiconductor material containing silicon for the first electrode 102 is that silicon has high transmittance. In addition, since the first electrode 102 is thin, it can transmit light. The transmittance is preferably 50% or more, more preferably, 80% or more, so that higher visibility can be achieved.

Note that an insulating layer or a conductive layer may be provided between the substrate 100 and the first electrode 102. For example, an insulating layer for blocking an impurity intruding from the substrate 100, a gate electrode, a gate wiring, a gate insulating film, and the like may be provided.

An insulating film 106 is formed over the first electrode 102. Note that the insulating film 106 may have a single-layer structure or a stacked-layer structure.

An inorganic material or an organic material can be used for the insulating film 106. As an organic material, polyimide, acrylic, polyamide, polyimide amide, resist, siloxane, polysilazane, or the like can be used. As an inorganic material, an insulating substance containing oxygen or nitrogen, such as silicon oxide ($SiO_x$), silicon nitride ($SiN_x$), silicon oxynitride ($SiO_xN_y$:x>y), or silicon nitride oxide ($SiN_xO_y$:x>y) can be used. Alternatively, a stacked-layer film in which a plurality of these films are stacked may be used. Further alternatively, a stacked-layer film in which an organic material and an inorganic material are combined may be used.

Note that when an inorganic material is used for the insulating film, intrusion of moisture or an impurity can be prevented. In particular, a layer containing nitrogen can block moisture or an impurity efficiently.

Note that when an organic material is used for the insulating film, a surface thereof can be planarized. Accordingly, the insulating film can have a good effect on a layer provided thereover. For example, the layer formed over the organic material can be planarized, so that disturbance of orientation of the liquid crystal can be prevented, cutting of a wiring can be prevented, and a resist can be formed with accuracy.

A second electrode 108 is formed overt the insulating film 106. The second electrode 108 may be formed of a material with a high light-transmitting property. For example, one or more elements selected from indium (In), tin (Sn), and oxygen (O); or a compound or an alloy material containing one or more of the aforementioned elements as a component (such as indium tin oxide (ITO), indium zinc oxide (IZO), or indium tin oxide doped with silicon oxide (ITSO)) are desirable. In particular, IZO is preferable since it is easy to be patterned and formed into a minute shape with accuracy, although it is not limited thereto.

Note that the second electrode 108 has an opening pattern (slit). The opening pattern is for generating an electric field in a direction generally parallel to the substrate, between the first electrode 102 and the second electrode 108. Accordingly, as long as an electric field having a part which is generally parallel to the substrate can be generated, the opening pattern can have various shapes. Here, "generally parallel" refers to a parallel direction with small deviation. Therefore, the direction may be deviated from the parallel direction as long as the display is not disturbed. The direction may have a deviation of, for example, approximately ±10°, or desirably, approximately ±5°.

The opening pattern includes not only a closed opening pattern such as a slit, but also a space which is located between conductive patterns and in which the conductive pattern is not formed, such as a space between comb-teeth of a comb-shaped electrode. In other words, a gap or an interspace is needed between portions functioning as an electrode.

As described above, the electric field is generated between the second electrode 108 and the first electrode 102, so that an alignment state of liquid crystal molecules can be controlled.

Note that in a case where electrodes are provided in each pixel, an electrode to which a signal different among pixels depending on an image signal is provided, that is, a pixel electrode can be either the second electrode 108 or the first electrode 102. Accordingly, it is possible to set the second electrode 108 to be the pixel electrode and the first electrode 102 to be a common electrode. Alternatively, it is possible to set the second electrode 108 to be the common electrode and the first electrode 102 to be the pixel electrode.

Since the pixel electrode is connected to a source or drain of a transistor in many cases, when the first electrode 102 or the second electrode 108 functions as the pixel electrode, the structure can be simplified. Further, since the common electrodes in all pixels are connected to one another in many cases, when the first electrode 102 or the second electrode 108 functions as the common electrode, the structure can be simplified.

Figure 2A:
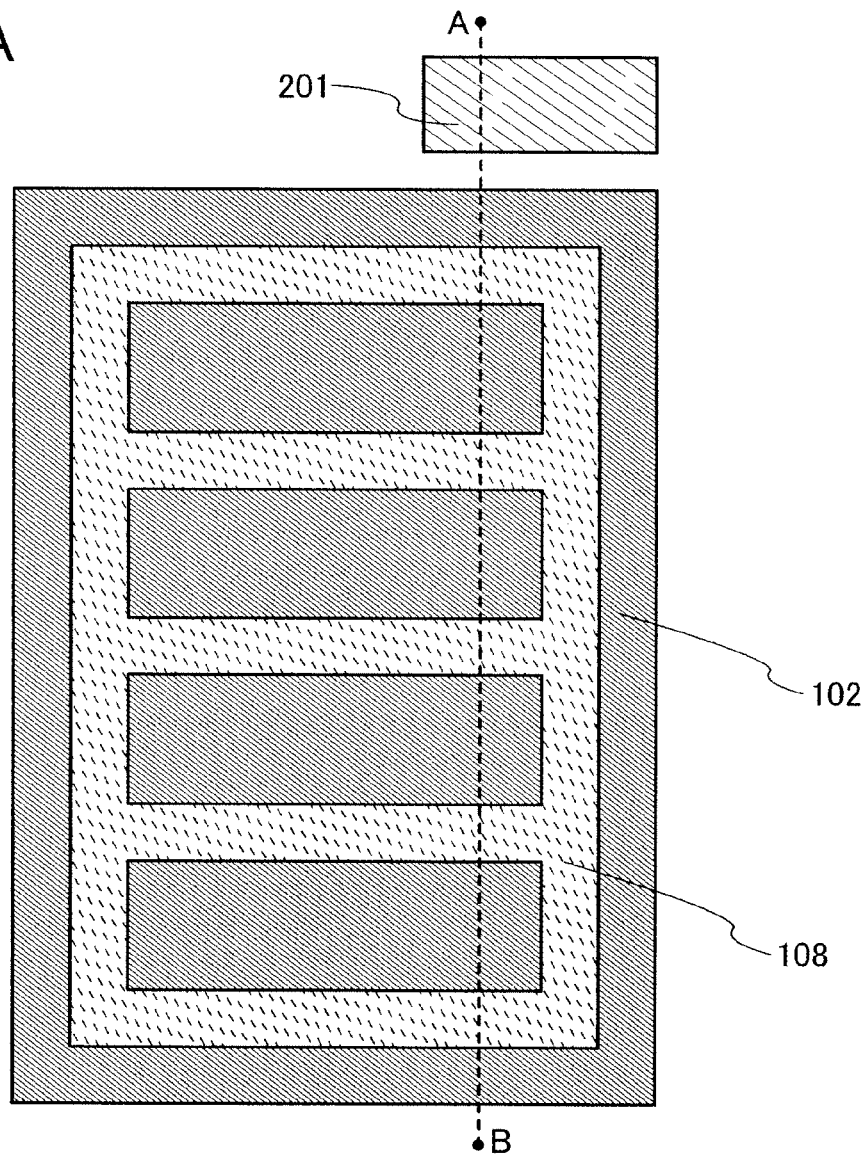
FIG. 2A is a plan view for illustrating a structure of a liquid crystal display device according to the present invention.
Figure 2B:
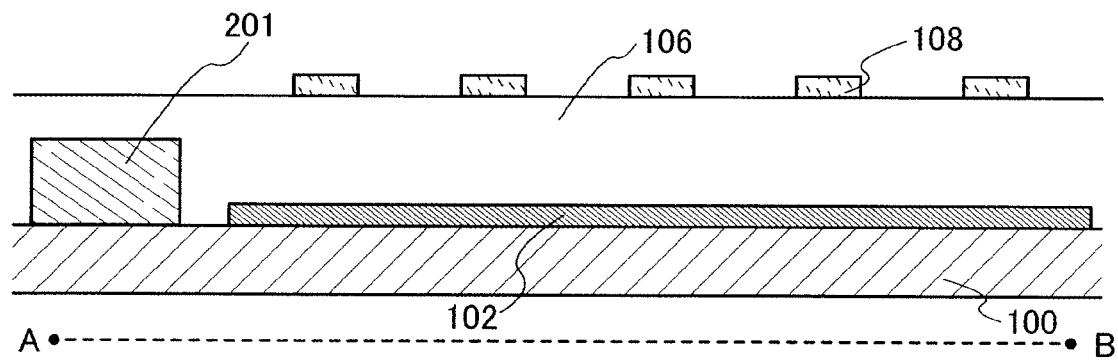
FIG. 2B is a cross-sectional view along a line A-B of FIG. 2A.

FIG. 2A is a plan view and FIG. 2B is a cross-sectional view of a case where a transistor 201 is provided. The transistor 201 is located near the first electrode 102 and the second electrode 108.

In this case, a film in the transistor 201 and the first electrode 102 can be formed at the same time. As a result, the first electrode can be manufactured without increasing the numbers of masks (reticles) and manufacturing steps.

For example, a semiconductor layer in the transistor 201 and the first electrode 102 can be formed at the same time. The semiconductor layer in the transistor 201 and the first electrode 102 can be formed at the same time and etched at the same time, whereby patterning can be carried out at the same time. Further, in the case where the semiconductor layer is formed of polysilicon, the semiconductor layer and the first electrode 102 are crystallized at the same time.

Accordingly, the semiconductor layer in the transistor 201 and the first electrode 102 contain the same material.

Note that in a case of adding an impurity (a p-type impurity or an n-type impurity) such as phosphorus, boron, gallium, or arsenic to a part of the semiconductor layer in the transistor 201, it is desirable that the impurity is also introduced to the first electrode 102 at the same time. In a case of adding the impurity at the same time to portions, the concentration thereof is influenced by a thickness and a quality of a material of a film over the portions. When being formed under the similar layer structures, the semiconductor layer in the transistor 201 and the first electrode 102 have the impurity (a p-type impurity or an n-type impurity) at approximately the same concentration, at least partially. For example, a layer forming a source region or a drain region in the semiconductor layer in the transistor 201 and a semiconductor layer forming the first electrode 102 have impurity regions at approximately the same concentration.

Note that the semiconductor layer in the transistor 201 has a channel forming region in many cases. A gate electrode is located over the channel forming region with a gate insulating film therebetween. An impurity (a p-type impurity or an n-type impurity) is not introduced to the channel forming region to form a high-concentration impurity region, normally. However, there is a case where an impurity (a p-type impurity or an n-type impurity) is introduced to the channel forming region to form an extremely low-impurity region in order to adjust a value of a threshold voltage. Further, an impurity (a p-type impurity or an n-type impurity) is introduced to the semiconductor layer in the transistor 201 to form a low-concentration impurity region (LDD: Lightly Doped Drain) in some cases. Accordingly, in many cases, the semiconductor layer in the transistor 201 has a plurality of regions where impurities (p-type impurities or n-type impurities) are contained at various concentrations.

Note that in a case where an impurity (a p-type impurity or an n-type impurity) is introduces to the semiconductor layer in the transistor 201 and the first electrode 102 at the same time, the semiconductor layer in the transistor 201 and the first electrode 102 may be located extremely close to each other. It is because the same impurity (a p-type impurity or an n-type impurity) is introduced thereto in many cases. Thus, the layout of the transistor 201 and the first electrode 102 can be significantly effective, which leads to improvement in aperture ratio.

Note that the conductivity of a part of the semiconductor layer in the transistor 201 and that of the first electrode 102 may differ from each other. In such a case, an impurity (a p-type impurity or an n-type impurity) is introduced to the first electrode 102 at the same as a transistor other than the transistor 201. Accordingly, in that case, the semiconductor layer in the transistor other than the transistor 201 and the first electrode 102 have the impurity (a p-type impurity or an n-type impurity) at approximately the same concentration, at least partially. For example, the transistor other than the transistor 201 is provided as a part of a source signal line driver circuit or a gate signal line driver circuit.

The transistor 201 and one of the first electrode 102 and the second electrode 108 are electrically connected in many cases. In addition, the electrode which is electrically connected to the transistor 201 functions as the pixel electrode in many cases. The transistor 201 and one of the first electrode 102 and the second electrode 108 are electrically connected through a contact hole, a wiring, or the like.

Note that in FIGS. 2A and 2B, a case in which the first electrode 102 is formed at the same time as the film in the transistor 201 is described; however, it is not limited thereto. The first electrode 102 may be formed at the same time as another film, such as a film in a wiring, a resistor, or a capacitor.

Figure 3A:
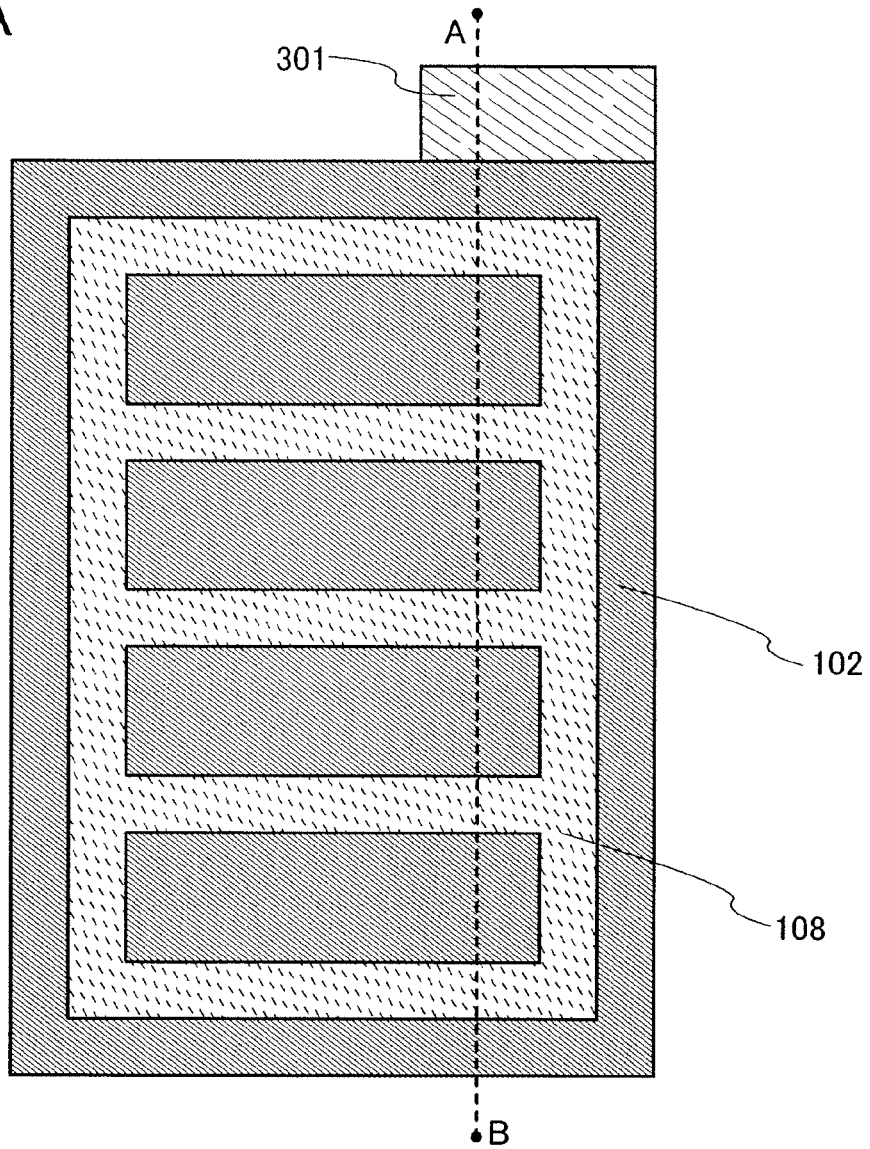
FIG. 3A is a plan view for illustrating a structure of a liquid crystal display device according to the present invention.
Figure 3B:
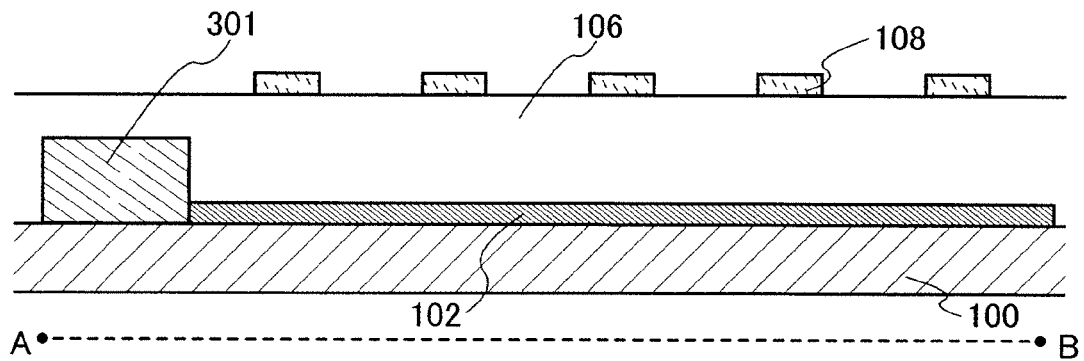
FIG. 3B is a cross-sectional view along a line A-B of FIG. 3A.

FIGS. 3A and 3B illustrate a case in which a transistor 301 is provided and a part of the transistor 301 and the first electrode 102 are contiguous with each other to form one island. FIG. 3A shows a plan view and FIG. 3B shows a cross-sectional view. Note that in this specification, "contiguous" refers to a case in which elements are formed continuously.

At this time, a film in the transistor 301 and the first electrode 102 are connected to each other as one film; therefore, they can be formed at the same time. As a result, the first electrode can be manufactured without increasing the numbers of masks (reticles) and manufacturing steps.

For example, a semiconductor layer in the transistor 301 and the first electrode 102 are connected to each other and can be formed at the same time. The semiconductor layer in the transistor 301 and the first electrode 102 can be formed at the same time and etched at the same time, whereby patterning can be carried out at the same time. Further, if the semiconductor layer is formed of polysilicon, the semiconductor layer and the first electrode 102 are crystallized at the same time. In this case, a crystal grain boundary of the semiconductor layer in the transistor 301 and that of the semiconductor layer forming the first electrode 102 extend in substantially the same direction. Here, the description "crystal grain boundaries extend in substantially the same direction" refers to a case in which, for example, grain boundaries with a longitudinal direction and a direction perpendicular to the longitudinal direction (also referred to as a short direction) have uniform longitudinal direction alignment.

Accordingly, the semiconductor layer in the transistor 301 and the first electrode 102 contain the same material.

Note that since the semiconductor layer in the transistor 301 and the first electrode 102 are contiguous and connected to each other; therefore, in some cases, it is difficult to clearly distinguish where the semiconductor layer in the transistor 301 ends and where the first electrode 102 begins.

Note that in a case where an impurity (a p-type impurity or an n-type impurity) such as phosphorus, boron, gallium, or arsenic is introduced to a part of the semiconductor layer in the transistor 301, it is desirable that the impurity is also introduced to the first electrode 102 at the same time. When the impurity is introduced to the semiconductor layer in the transistor 301 and the first electrode 102 at the same time, since they are contiguous with each other, they can be electrically connected to each other.

In that case, it is not necessary to provide a contact hole and to use another wiring in order to connect the semiconductor layer in the transistor 301 and the first electrode 102. Therefore, the layout can be significantly effective, which leads to improvement in aperture ratio.

Note that since the transistor 301 and the first electrode 102 are contiguous, they are electrically connected to each other in many cases. The electrode which is electrically connected to the transistor 301 functions as the pixel electrode in many cases.

Note that in a case of adding the impurity at the same time to portions, the concentration thereof is influenced by a thickness or a quality of a material of a film over the portions. When being formed under the similar layer structures, the semiconductor layer in the transistor 301 and the first electrode 102 have the impurity (a p-type impurity or an n-type impurity) at approximately the same concentration, at least partially.

Note that the semiconductor layer in the transistor 301 has a channel forming region in many cases. A gate electrode is located over the channel forming region with a gate insulating film therebetween. An impurity (a p-type impurity or an n-type impurity) is not introduced to the channel forming region to form a high-concentration impurity region, normally. However, there is a case where an impurity (a p-type impurity or an n-type impurity) is introduced to the channel forming region to form an extremely low-impurity region in order to adjust a value of a threshold voltage. Further, an impurity (a p-type impurity or an n-type impurity) is introduced to the semiconductor layer in the transistor 301 to form a low-concentration impurity region (LDD: Lightly Doped Drain) in some cases. Accordingly, in many cases, the semiconductor layer in the transistor 301 has a plurality of regions where impurities (p-type impurities or n-type impurities) are contained at various concentrations.

Note that the conductivity of a part of the semiconductor layer in the transistor 301 and that of the first electrode 102 may differ from each other. In such a case, an impurity (a p-type impurity or an n-type impurity) is introduced to the first electrode 102 at the same as a transistor other than the transistor 301. Accordingly, in that case, the semiconductor layer in the transistor other than the transistor 301 and the first electrode 102 have the impurity (a p-type impurity or an n-type impurity) at approximately the same concentration, at least partially. For example, the transistor other than the transistor 301 is provided as a part of a source signal line driver circuit or a gate signal line driver circuit.

The transistor 301 and the first electrode 102 are electrically connected in many cases. In addition, the electrode which is electrically connected to the transistor 301, that is, the first electrode 102 functions as the pixel electrode in many cases. Accordingly, the electrode and the transistor can be efficiently located, which is favorable.

Note that in FIGS. 3A and 3B, a case in which the first electrode 102 is formed at the same time as the film in the transistor 301 is described; however, it is not limited thereto. The first electrode 102 may be formed at the same time as another film, such as a film in a wiring, a resistor, a capacitor, or the like.

Figure 4A:
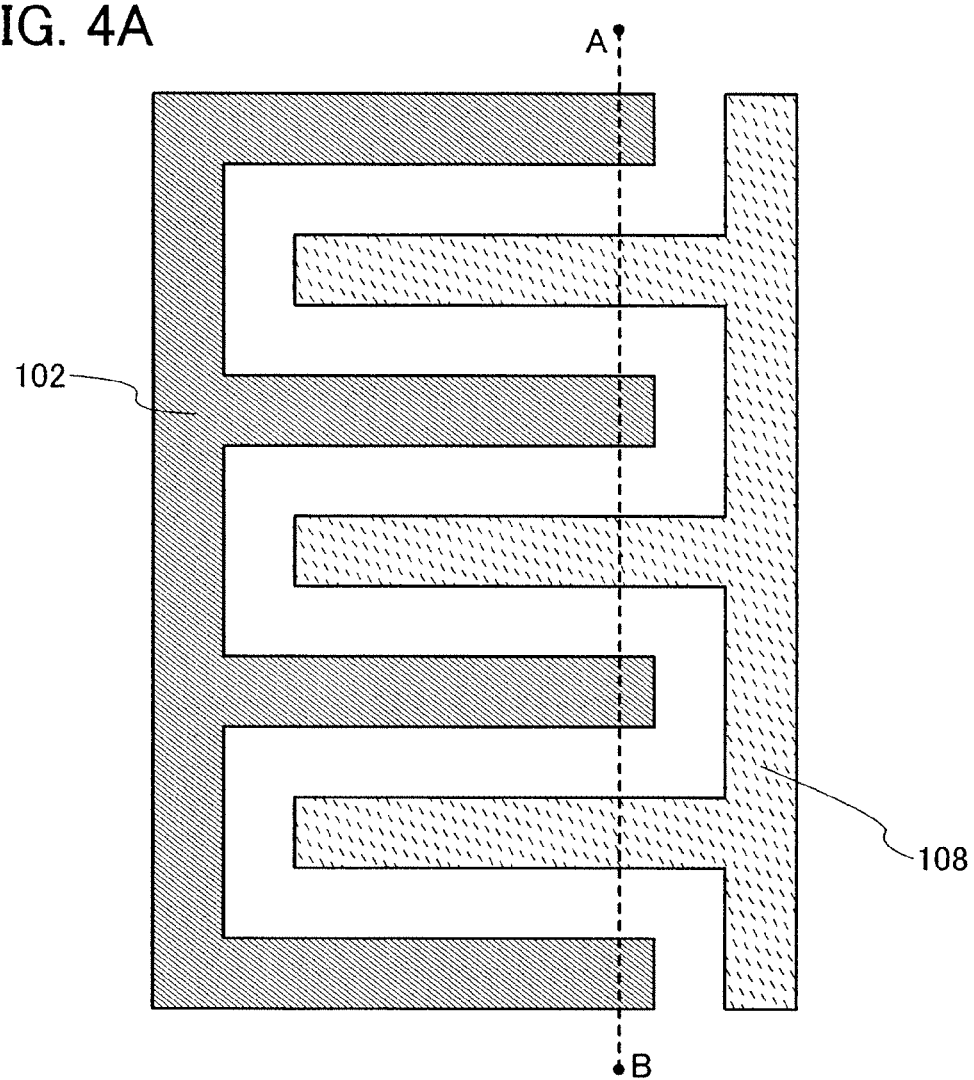
FIG. 4A is a plan view for illustrating a structure of a liquid crystal display device according to the present invention.
Figure 4B:
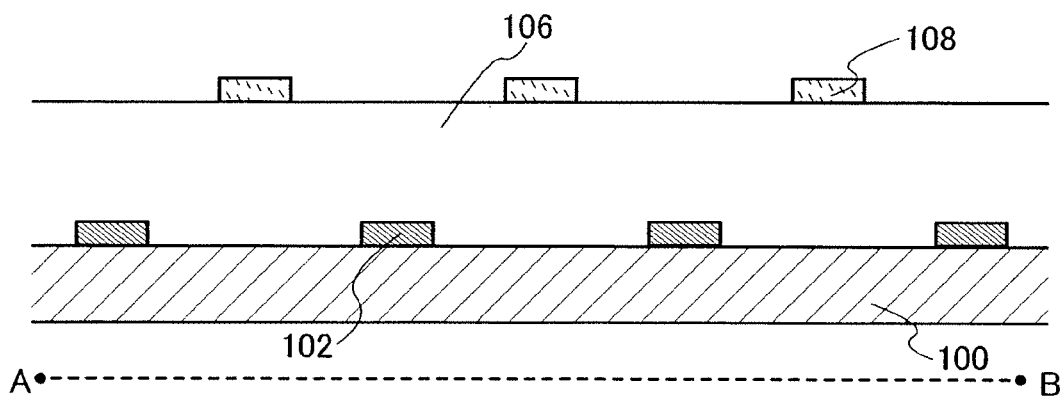
FIG. 4B is a cross-sectional view along a line A-B of FIG. 4A.
Figure 5A:
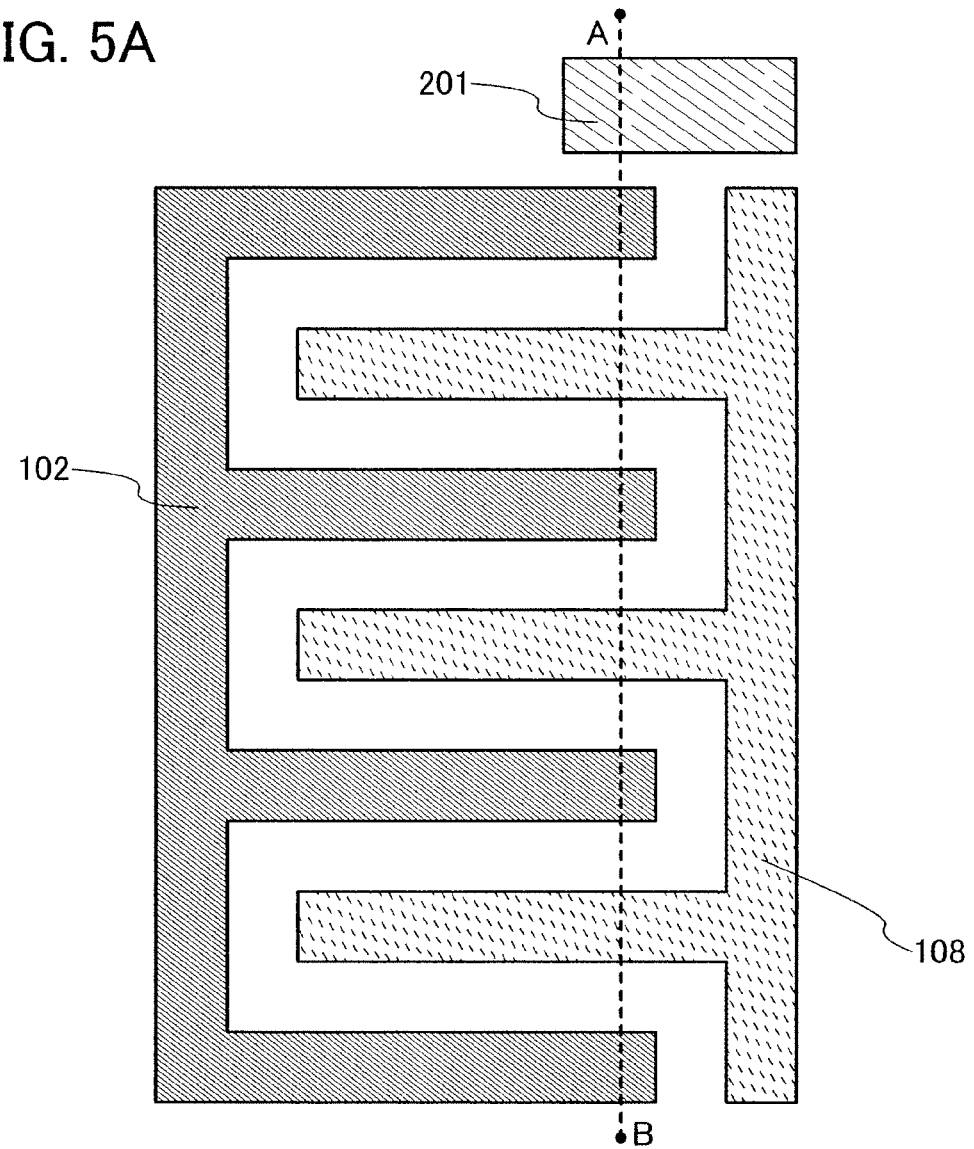
FIG. 5A is a plan view for illustrating a structure of a liquid crystal display device according to the present invention.
Figure 5B:
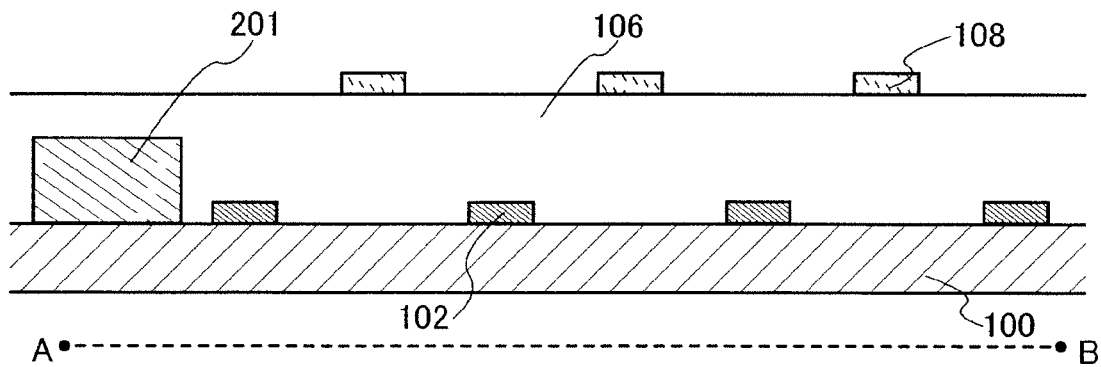
FIG. 5B is a cross-sectional view along a line A-B of FIG. 5A.
Figure 6A:
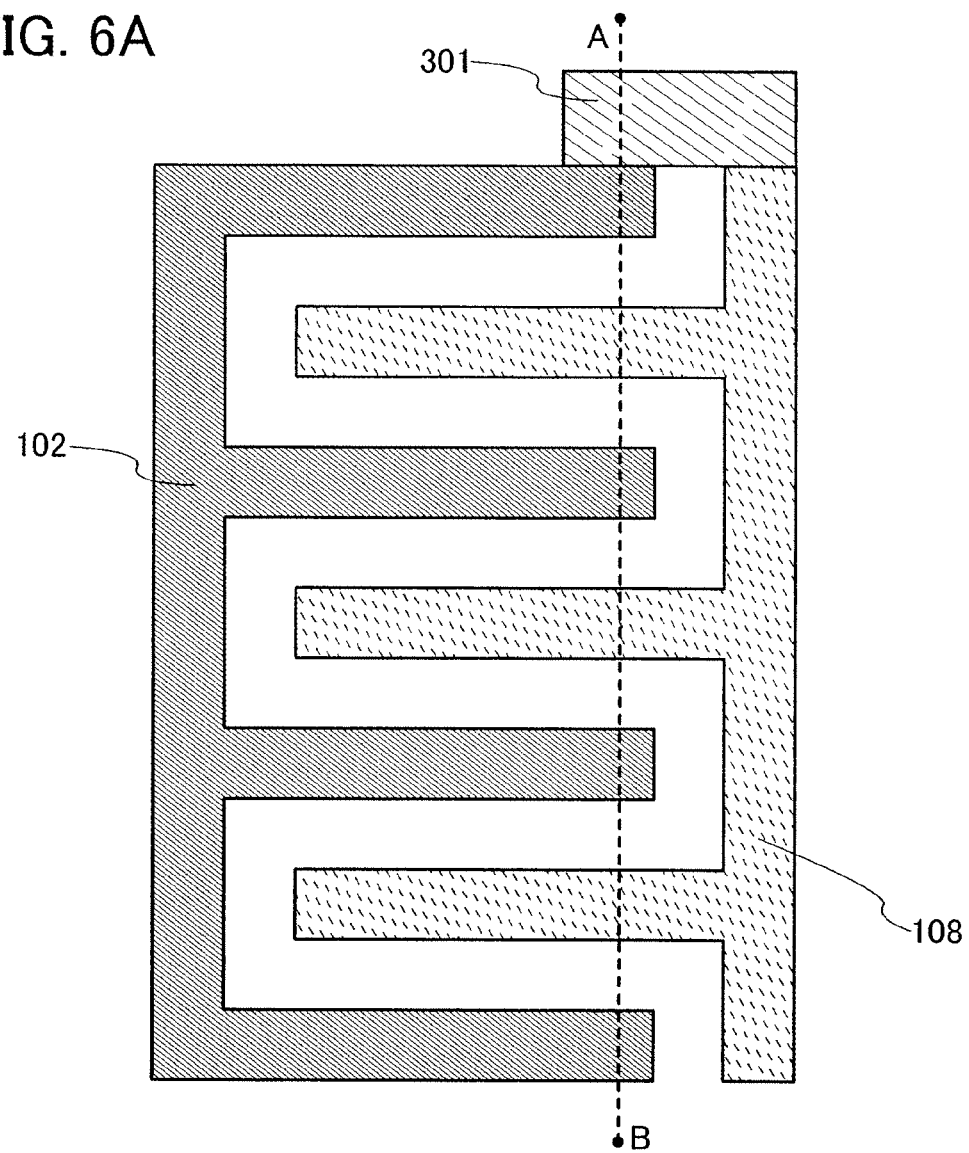
FIG. 6A is a plan view for illustrating a structure of a liquid crystal display device according to the present invention.
Figure 6B:
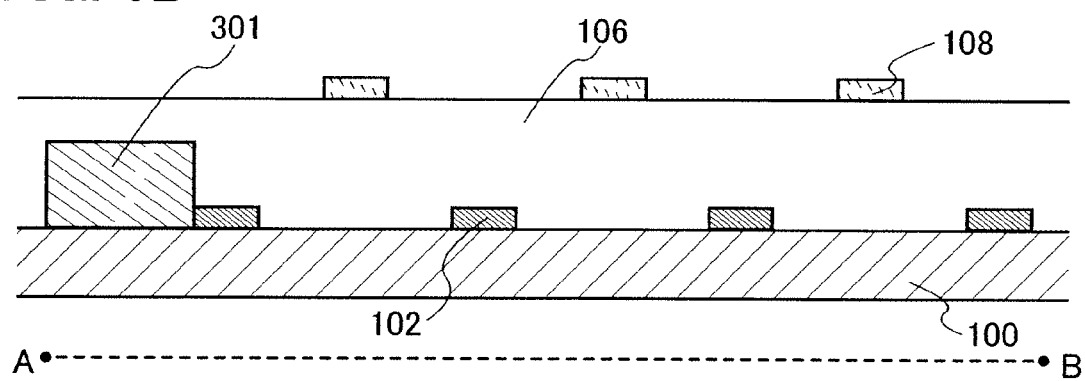
FIG. 6B is a cross-sectional view along a line A-B of FIG. 6A.

Note that in FIGS. 1A to 3B, a case in which only the second electrode 108 has an opening pattern is described, but it is not limited thereto. The first electrode 102 may also have an opening pattern. Accordingly, an electric field generally parallel to the substrate is generated, and orientation of the liquid crystal molecules can be controlled. FIGS. 4A to 6B show such cases. FIGS. 4A and 4B correspond to a case shown in FIGS. 1A and 1B, in which the first electrode 102 also has an opening pattern. FIGS. 5A and 5B correspond to a case shown in FIGS. 2A and 2B, in which the first electrode 102 also has an opening pattern. FIGS. 6A and 6B correspond to a case shown in FIGS. 3A and 3B, in which the first electrode 102 also has an opening pattern.

When the first electrode 102 has an opening pattern as shown in FIGS. 4A to 6B, the amount of light transmitting through a portion of the opening pattern is increased. This is because the first electrode 102 and the second electrode 108 are not overlapped with each other. When the first electrode 102 and the second electrode 108 are overlapped, the amount of light transmitted therethrough is decreased unless the light transmittance is 100%. On the other hand, in a portion where the first electrode 102 and the second electrode 108 are not overlapped, light does not attenuate, which leads to increase in amount of light transmitted therethrough. As a result, it is possible to increase luminance and to reduce power consumption.

Figure 7A:
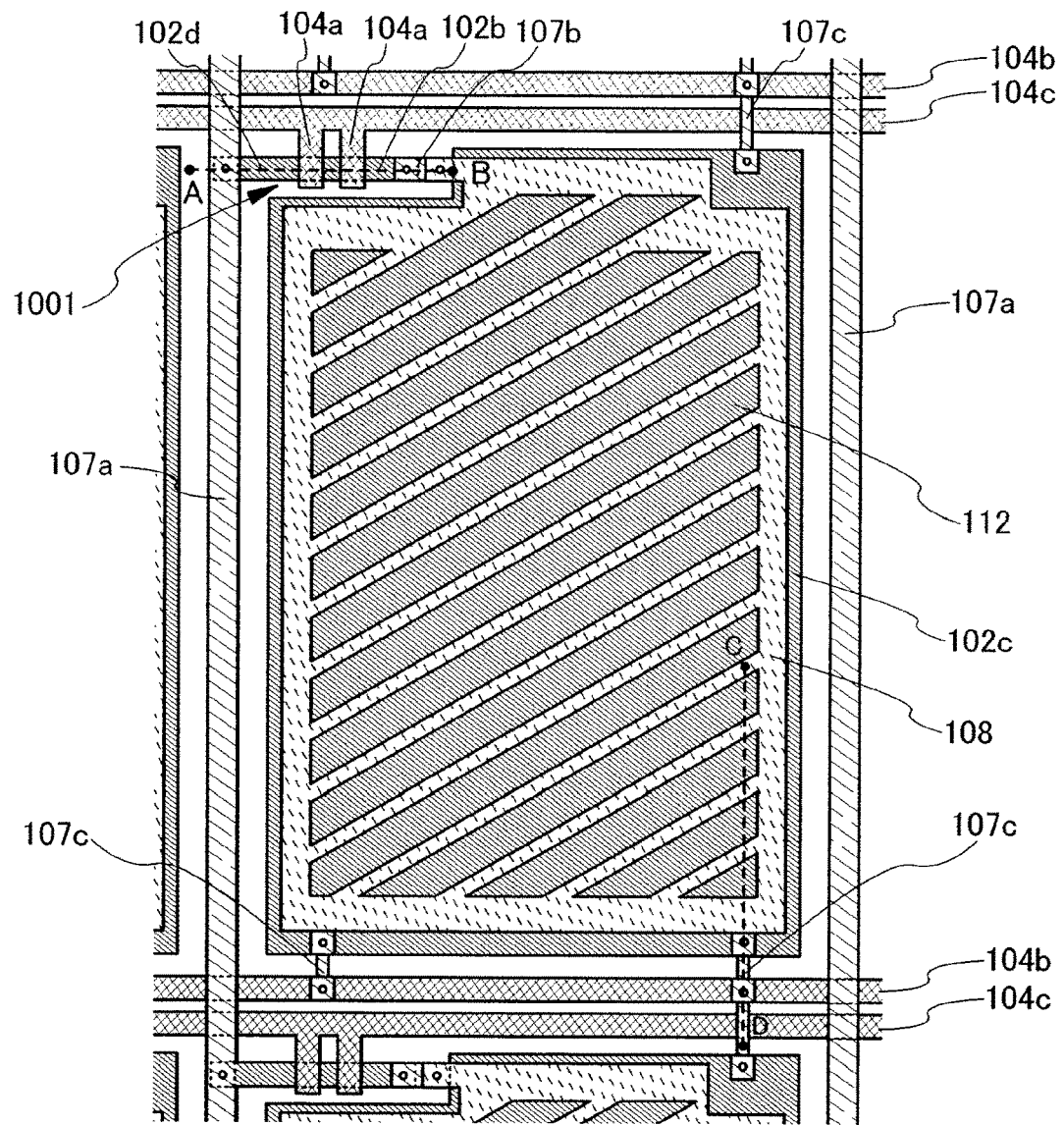
FIG. 7A is a plan view for illustrating a structure of a liquid crystal display device according to Embodiment Mode 1.

FIG. 7A is a plan view for illustrating a structure of a liquid crystal display device according to Embodiment Mode 1 in the present invention. In FIG. 7A, one of a plurality of pixels provided in the liquid crystal display device is illustrated. This liquid crystal display device is a device in which an orientation of a liquid crystal is controlled by an FFS mode. In FIG. 7A, a plurality of source wirings 107a are located parallel to one another (extending up and down in FIG. 7A) and separately from one another, whereas a plurality of gate wirings 104c are located extending in a direction generally perpendicular to the source wirings 107a (from side to side in FIG. 7A) and are separated from one another. Auxiliary wirings 104b are located adjacent to each of the plurality of gate wirings 104c and extended to a direction generally parallel to the gate wirings 104c, that is, in a direction generally perpendicular (from side to side in FIG. 7A) to the source wirings 107a. A space which is substantially rectangle is surrounded by the source wiring 107a, the auxiliary wiring 104b, and the gate wiring 104c. The pixel electrode of the liquid crystal display device is located in the space. A thin film transistor for driving the pixel electrode is located on the upper-left corner of FIG. 7A.

As a material to be used for the gate wiring 104c, the auxiliary wiring 104b, and the source wiring 107a, one or more elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or an alloy material containing one or more of the aforementioned elements (for example, indium tin oxide (ITO), indium zinc oxide (IZO), indium tin oxide doped with silicon oxide (ITSO), zinc oxide (ZnO), aluminum neodymium (Al—Nd), or magnesium silver (Mg—Ag)); a substance obtained by combining such compounds; or the like can be given. Alternatively, a compound (silicide) of silicon and the aforementioned material (such as aluminum silicon, molybdenum silicon, or nickel silicide) or a compound of nitride and the aforementioned material (such as titanium nitride, tantalum nitride, or molybdenum nitride) can be used. Note that silicon (Si) may contain a large amount of n-type impurities (phosphorus or the like) or p-type impurities (boron or the like). When such an impurity is contained, conductivity of silicon is improved and silicon functions similarly to normal conductor, so that it becomes easy to use silicon as a wiring or an electrode. Silicon may be single crystalline silicon, polycrystalline silicon (polysilicon), or amorphous silicon. When single crystalline silicon or polycrystalline silicon is used, resistance can be reduced. When amorphous silicon is used, a manufacturing process can be simplified. Aluminum and silver have high conductivity, so that signal delay can be reduced, and minute processing is possible since they are easy to be etched and patterned. Copper has high conductivity, so that signal delay can be reduced. Molybdenum is desirable because it can be manufactured without a problem such as a defect of a material, even if molybdenum is in contact with an oxide semiconductor such as ITO or IZO, or silicon; and because it is easily patterned and etched, and has high heat resistance. Titanium is desirable because it can be manufactured without a problem such as a defect of a material, even if titanium is in contact with an oxide semiconductor such as ITO or IZO, or silicon; and it is easily patterned and etched, and has high heat resistance. Tungsten is desirable because it has high heat resistance. Neodymium is desirable because it has high heat resistance. In particular, an alloy of neodymium and aluminum is desirable because heat resistance is improved and hillocks of aluminum are hardly generated. Silicon is desirable because it can be manufactured at the same time as the semiconductor layer in the transistor and has high heat resistance. Indium tin oxide (ITO), indium zinc oxide (IZO), indium tin oxide doped with silicon oxide (ITSO), zinc oxide (ZnO), and silicon (Si) are desirable because they have a light-transmitting property and can be used for a portion which is required to transmit light, such as the pixel electrode and the common electrode.

Note that a wiring or an electrode may have a single layer or a multilayer structure of these materials. If a single-layer structure is employed, the manufacturing process can be simplified and the number of steps can be reduced; which leads to reduction in cost. If a multilayer structure is employed, advantage of a material can be derived and disadvantage of the material can be reduced, so that a wiring and an electrode with favorable characteristics can be formed. For example, when a material with low resistance (such as aluminum) is included in the multilayer structure, the resistance of the wiring can be reduced. In addition, if a material with high heat resistance is used, for example, to be interposed between a material with low heat resistance and another advantage in a stacked-layer structure, the heat resistance of wiring or electrode as a whole can be improved. For example, a stacked-layer structure in which a layer containing aluminum is interposed between layers containing molybdenum or titanium is desirable. In addition, there is a case in which a material is directly in contact with another wiring or another electrode of another material, so that the materials are adversely affected. For example, a material may enter another material and change its characteristics; therefore, the material cannot serve its original purpose or a problem occurs in manufacturing and the material cannot be manufactured normally. In such a case, a problem can be solved when the layer is interposed between or covered with another layer. For example, if indium tin oxide (ITO) and aluminum are required to be in contact with each other, it is desirable that titanium or molybdenum is interposed therebetween. Also, if silicon and aluminum are required to be in contact with each other, it is desirable that titanium or molybdenum is interposed therebetween.

Note that it is desirable that the material of the gate wiring 104c and the auxiliary wiring 104b have heat resistance higher than that of the source wiring 107a. It is because the gate wiring 104c and the auxiliary wiring 104b are located in a higher temperature in their manufacturing steps.

Note that it is desirable that the material of the source wiring 107a has resistance lower than that of the gate wiring 104c. It is because only signals of two values, that is, High-signal and Low-signal are given to the gate wiring 104c, whereas an analog signal which contributes display is introduced to the source wiring 107a. Accordingly, it is desirable that a material with low resistance is used for the source wiring 107a so that a signal can be applied with accuracy thereto.

Note that the auxiliary wiring 104b is not necessarily provided but a potential of the common electrode in each pixel can be stabilized when the auxiliary wiring 104b is provided. Note that in FIGS. 7A and 7B, the auxiliary wiring 104b and the gate wiring 104c are located to be generally parallel to each other, but it is not limited thereto. The auxiliary wiring 104b and the source wiring 107a may be located to be generally parallel to each other. In this case, the auxiliary wiring 104b is desirably formed of a material with the same quality as the source wiring 107a.

However, it is favorable that the auxiliary wiring 104b is located generally parallel to the gate wiring 104c because an aperture ratio can be increased and the layout can be efficient.

Figure 7B:
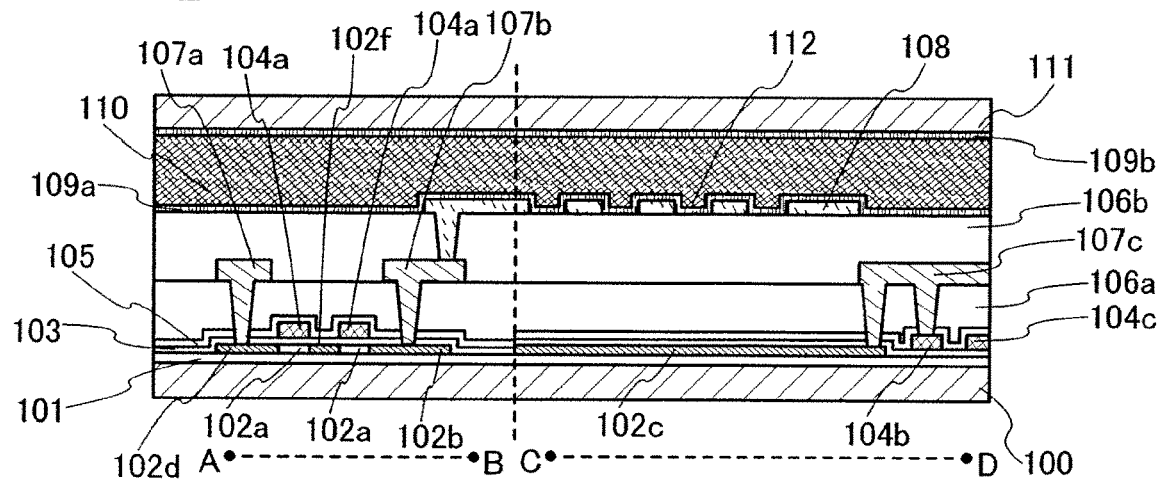
FIG. 7B is a cross-sectional view along lines A-B and C-D of FIG. 7A.

FIG. 7B is a cross-sectional view along a line A-B and a line C-D in FIG. 7A. As shown in the drawing, a base insulating film 101 is formed over the substrate 100 so as to prevent diffusion of an impurity from the substrate 100. The base insulating film 101 is formed of, for example, an insulating substance containing oxygen or nitrogen, such as silicon oxide ($SiO_x$), silicon nitride ($SiN_x$), silicon oxynitride ($SiO_xN_y$:x>y), or silicon nitride oxide ($SiN_xO_y$:x>y). Alternatively, a stacked-layer film including a plurality of films thereof may be used.

Note that the substrate 100 is a glass substrate, a quartz substrate, a substrate formed of an insulator such as alumina, a plastic substrate with enough heat resistance to withstand a processing temperature of subsequent steps, a silicon substrate, or a metal substrate. Alternatively, polysilicon may be used.

Note that when the liquid crystal display device functions as a transmissive display device, it is desirable that the substrate 100 has a light-transmitting property.

A semiconductor film 102f and a first electrode 102c controlling the orientation of the liquid crystal are formed over the base insulating film 101. The semiconductor film 102f and the first electrode 102c are, for example, polysilicon films, which are formed by selectively etching a film in the same step. In other words, the semiconductor film 102f and the first electrode 102c are formed over the baser film 101 and in the same layer. However, the present invention is not limited to film formation at the same time and etching in one step. In the semiconductor film 102f, an impurity region 102d to be a source region or a drain region and an impurity region 102b to be a drain region or a source region of the thin film transistor are formed. The impurity regions 102d and 102b are n-type impurity regions to which, for example, phosphorus or arsenic is introduced, but the impurity regions may be p-type impurity regions. An impurity for imparting n-type conductivity, phosphorus (P) and arsenic (As) are given as an example; and as an impurity for imparting p-type conductivity, boron (B) and gallium (Ga) are given as an example. However, it is desirable that the impurity regions 102d and 102b are n-type impurity regions having high conductivity. On the other hand, when a driver circuit only includes p-type transistors, it is desirable that the impurity regions 102d and 102b also have p-type conductivity type so that the manufacturing cost can be reduced.

The first electrode 102c functions as the common electrode to which common voltage which is same as other pixels is applied and is formed of, for example, a polysilicon film to which an impurity is introduced. The resistance of the first electrode 102 is lowered since an impurity is introduced thereto, and functions as an electrode. As shown in a dotted line in FIG. 7A, the first electrode 102c has a rectangular shape with a portion 1001 in which one corner (the upper-left corner of the drawing) is lacked, and is formed over almost the whole surface of the pixel. Note that in the portion 102e of which one corner is lacked, a thin film transistor is located. When a thin film transistor is located in the portion 102e in which one corner is lacked, a region which can be used to display can be formed more efficiently, which leads to improvement in aperture ratio. The first electrode 102c has a thickness of, for example, 45 nm to 60 nm, and has sufficiently high light transmittance. In order to further improve the light transmittance, it is desirable to set the thickness of the first electrode 102 to be 40 nm or less.

The first electrode 102c is formed of polysilicon, for example, but may be another semiconductor material such as amorphous silicon, single crystalline silicon, organic semiconductor, or a carbon nanotube. In this case, an amorphous silicon film, an organic semiconductor film, or the like is used in the thin film transistor instead of the semiconductor film 102f. Note that the semiconductor film 102f and the first electrode 102c forming the transistor are desirably formed by selectively etching one film in the same step. In this case, the numbers of masks (reticles) and steps can be reduced, so that the manufacturing cost can be reduced. In addition, it is desirable that impurity elements of the same type are introduced to the impurity regions 102b and 102d at the same time. This is because when the impurity elements of the same type are introduced, the impurity elements can be introduced without a problem even if the impurity regions 102b and 102d are located close to each other, so that dense layout becomes possible. It is desirable to add impurity elements of either p-type or n-type because the manufacturing cost can be low compared with a case in which impurity elements of different types are introduced.

A gate insulating film 103 in the transistor is formed over the whole surface including over the semiconductor film 102f.

However, there is a case in which the gate insulating film 103 is located only in the vicinity of the channel forming region and is not located in other parts. In addition, a thickness or a stacked-layer structure of the gate insulating film 103 may differ according to location. For example, the gate insulating film 103 may be thicker or include more layers in the vicinity of the channel forming region and may be thinner or include less layers in another location. Therefore, it becomes easy to control the addition of an impurity to the source region or the drain region. Further, when the thickness or the number of layers of the gate insulating film 103 in the vicinity of the channel forming region differs, the amount of impurity introduced to the semiconductor layer can be different by location, so that an LDD region or the like can be formed. When the LDD region is formed, leak current and generation of hot carriers can be suppressed, which can improve the reliability.

The gate insulating film 103 is formed of, for example, an insulating substance containing oxygen or nitrogen, such as silicon oxide ($SiO_x$), silicon nitride ($SiN_x$), silicon oxynitride ($SiO_xN_y$:x>y), or silicon nitride oxide ($SiN_xO_y$:x>y). Alternatively, a stacked-layer film including a plurality of these films may be used. A gate electrode 104a is formed over the gate insulating film 103 and is located above the channel forming region 102a. As shown in FIGS. 7A and 7B, the gate electrode 104a is in the same wiring layer as the auxiliary wiring 104b and the gate wiring 104c, and is connected to the gate wiring 104c. In the semiconductor film 102f, a region 102a located under the gate electrode 104a functions as a channel forming region. Note that, to a semiconductor region between the two channel forming regions 102a, an impurity which is the same as that in the impurity regions 102b and 102d is introduced. Note that in this embodiment mode, a multigate structure having two gate electrodes is employed, but the present invention is not limited to this structure.

An insulating film 105 and a first interlayer insulting film 106a are sequentially formed over the gate insulating film 103 and the gate electrode 104a.

Note that only one of the insulating film 105 and the first interlayer insulating film 106a may be formed, alternatively, each of the insulating films has a multilayer structure. An inorganic material or an organic material can be used for the insulating films. As an organic material, polyimide, acrylic, polyamide, polyimide amide, resist, siloxane, polysilazane, or the like can be used. As an inorganic material, an insulating substance containing oxygen or nitrogen, such as silicon oxide ($SiO_x$), silicon nitride ($SiN_x$), silicon oxynitride ($SiO_xN_y$:x>y), or silicon nitride oxide ($SiN_xO_y$:x>y) can be used. Alternatively, a stacked-layer film in which a plurality of these films are stacked may be used. Further alternatively, a stacked-layer film in which an organic material and an inorganic material are combined may be used.

In the gate insulating film 103, the insulating film 105, and the first interlayer insulating film 106a, a contact hole located over the impurity region 102b, a contact hole located over the impurity region 102d, a contact hole located over the first electrode 102c, and a contact hole located over the auxiliary wiring 104b are formed. Over the first interlayer insulating film 106a, the source wiring 107a, a drain wiring 107b, and a connection wiring 107c are formed. When an organic material is used for the insulating film, intrusion of moisture or an impurity can be prevented. In particular, a layer containing nitrogen can block moisture or an impurity efficiently.

Note that when an organic material is used for the insulating film, a surface thereof can be planarized. Accordingly, the insulating film can have a good effect on a layer provided thereover. For example, the layer formed over the organic material can be planarized, so that disturbance of orientation of the liquid crystal can be prevented.

The source wiring 107a is located above a source, that is, the impurity region 102d, and has a part embedded in the contact hole; therefore, the source wiring 107a and the impurity region 102d are electrically connected. Accordingly, the source electrode functions as a part of the source wiring 107a. The drain wiring 107b is located above a drain, that is, the impurity region 102b, and has a part embedded in the contact hole; therefore, the drain wiring 107b and the impurity region 102b are connected.

The connection wiring 107c is extended from above the first electrode 102c to above the auxiliary wiring 104b. The connection wiring 107c has a part embedded in the contact hole; therefore, the connection wiring 107c is electrically connected to both the first electrode 102c and the auxiliary wiring 104b. When the connection wiring 107c is provided in such a manner, the contact hole can be formed with accuracy since it is not required to be deep.

In the example shown in FIG. 7B, the drain wiring 107b is formed at the same time as the source wiring 107a and the connection wiring 107c. In this case, the contact hole in which a part of the drain wiring 107b is embedded and the contact hole in which a part of the second electrode 108 is embedded is not overlapped with each other. Thus, even if the drain wiring 107b and the second electrode 108 have depressions over the contact holes, the depressions are not overlapped with each other. Therefore, a deep depressed portion is not formed in the second electrode 108, so that generation of a defect in shape of the resist pattern formed thereover can be suppressed.

Figure 8:
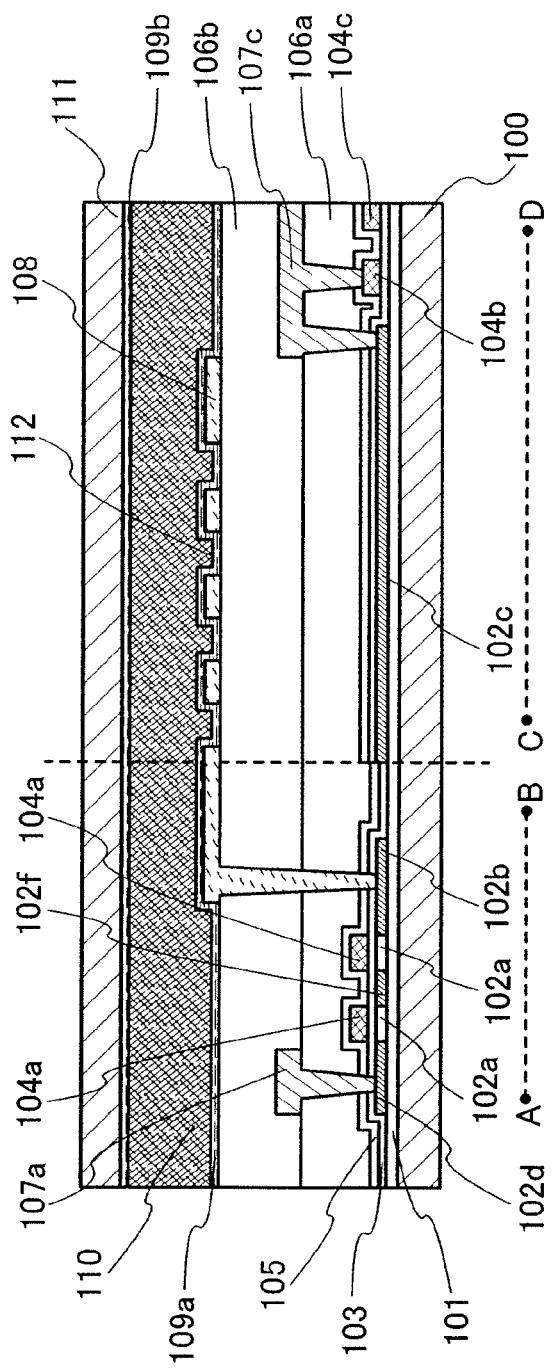
FIG. 8 illustrates another structure of FIG. 7B.

Note that as shown in FIG. 8, the second electrode 108 and the impurity region 102b may be connected directly without the drain wiring 107b. In this case, a contact hole for connecting the second electrode 108 and the impurity region 102b is required to be deep. Since the drain wiring 107bb shown in FIG. 7B is not required, a region for the connection wiring can be utilized for displaying an image as an opening region, which leads to improvement in aperture ratio and reduction in power consumption.

As described above, the first electrode 102c is connected to the auxiliary wiring 104b through the connection wiring 107c. It is desirable that a plurality of connection wirings 107c are provided in order to lower the resistance. Thus, a potential of the first electrode 102c is stabilized. In an example shown in FIG. 7A, the connection wirings 107c are formed above three corners out of four corners of the first electrode 102c, except the one which is close to the thin film transistor. When the connection is made in a plurality of paths, generation of potential distribution in the first electrode 102c is suppressed. Further, when the first electrode 102c and the auxiliary wiring 104b are connected through the connection wiring 107c, the number of forming the contact holes can be reduced, which can simplify the process.

Note that the connection wiring 107c is formed at the same time and with use of the same material as the source wiring 107a, but it is not limited thereto. The connection wiring 107c may be formed at the same time and with use of the same material as the second electrode 108.

A second interlayer insulating film 106b is formed over the source wiring 107a, the drain wiring 107b, the connection wiring 107c, and the first interlayer insulating film 106a. Note that a structure in which the second interlayer insulating film 106b is not formed may be employed. An inorganic material or an organic material can be used for the second interlayer insulating film 106b. As an organic material, polyimide, acrylic, polyamide, polyimide amide, resist, siloxane, polysilazane, or the like can be used. As an inorganic material, an insulating substance containing oxygen or nitrogen, such as silicon oxide ($SiO_x$), silicon nitride ($SiN_x$), silicon oxynitride ($SiO_xN_y$:x>y), or silicon nitride oxide ($SiN_xO_y$:x>y) can be used. Alternatively, a stacked-layer film in which a plurality of these films are stacked may be used. Further alternatively, a stacked-layer film in which an organic material and an inorganic material are combined may be used. In the second interlayer insulating film 106b, a contact hole is formed over the drain wiring 107b.

The second electrode 108 which controls the orientation of the liquid crystal is formed over the interlayer insulating film 106b. The second electrode 108 functions as a pixel electrode to which voltage specific to each pixel is applied. The second electrode 108 is formed of ITO (indium tin oxide), ZnO (zinc oxide), IZO which is formed by using a target in which ZnO of 2 to 20 wt % is mixed to indium oxide, or the like. Note that the second electrode 108 and the impurity region 102b may be electrically connected through the drain wiring 107b, or may be directly connected.

In a case where the connection wiring is not provided as shown in FIG. 8, the second electrode 108 is directly connected to the impurity region 102b in the thin film transistor.

As shown in FIGS. 7A and 8, the second electrode 108 is substantially rectangle and located above the first electrode 102c and the surroundings thereof. The second electrode 108 has a plurality of opening patterns 112 in a portion located above the first electrode 102c. The opening patterns 112, for example, include many slit-shaped opening patterns parallel to each other. In the example shown in FIG. 7A, the opening patterns are diagonal to the source wiring 107a. Since the opening pattern 112 is provided, an electric field having a component parallel to the substrate is generated above the second electrode 108. Therefore, the orientation of the liquid crystal described later can be controlled by controlling the potential of the second electrode 108. Note that a shape of the opening pattern is not limited to that in this embodiment mode. A shape of opening pattern described in Embodiment Mode 2 or later can be employed. In other words, the opening pattern includes a space where a conductive pattern is not formed, such as a space between the comb-teeth of a comb-shaped electrode.

If opening patterns with different orientations are provided, a plurality of regions with different moving directions of liquid crystal molecules can be provided. In other word, a multidomain (also referred to as alignment division) structure can be realized. When a multidomain structure is employed, it can be prevented that an image cannot be displayed properly if seen from a certain direction. Accordingly, the viewing angle can be improved.

As shown in FIG. 7A, a periphery of the first electrode 102c functioning as the common electrode extends out of the second electrode 108 functioning as the pixel electrode when seen from a direction perpendicular to the substrate 100. Thus, the second electrode 108 which is in a floating state after receiving a signal is less influenced by a signal transmitted to another pixel through the source wiring 107a. Accordingly, a defect of image quality, such as crosstalk can be suppressed. Note that the present invention is not limited to such an electrode structure and the first electrode 102c may have a portion in which its periphery does not extend out of the second electrode 108.

Next, an alignment film 109a and a liquid crystal 110 are stacked over the second interlayer insulating film 106b and the second electrode 108.

As the liquid crystal 110, a ferroelectric liquid crystal (FLC), a nematic liquid crystal, a smectic liquid crystal, a liquid crystal which is to be homogeneously aligned, a liquid crystal which is to be homeotropically aligned, or the like can be used. An opposite substrate 111 provided with the second alignment film 109b is located over the liquid crystal 110. Note that the opposite substrate 111 is provided with a color filter in many cases. In addition, a polarizing plate is provided on each outer side of the substrate 100 and the opposite substrate 111. Note that a retardation plate or a quarter-wave plate is provided as well as the polarizing plate in many cases.

Note that a stacked-layer structure according to the present invention is not limited to the one described in this embodiment mode.

An example of a manufacturing method of a semiconductor device or a liquid crystal display device is described. First, the base insulating film 101 is formed over the substrate 100. Subsequently, a semiconductor film such as a polysilicon film or an amorphous silicon film is formed over the base insulating film 101. A resist pattern (not shown) is formed over the semiconductor film. Then, the semiconductor film is selectively etched with use of the resist pattern as a mask. In such a manner, the semiconductor film 102f and the first electrode 102c are formed in the same step. The resist pattern is removed thereafter.

Subsequently, the gate insulating film 103 is formed over the semiconductor film 102f, the first electrode 102c, and the base insulating film 101. The gate insulating film 103 is, for example, a silicon oxynitride film or a silicon oxide film, and formed by a plasma CVD method. Note that the gate insulating film 103 may be formed of a silicon nitride film, or a multilayer film containing silicon nitride and silicon oxide. Then, a conductive film is formed over the gate insulating film 103. The conductive film is selectively removed by etching using a resist pattern as a mask, and is patterned. Thus, two gate electrodes 104a are formed over the gate insulating film 103 which is located over the semiconductor film 102f. In addition, the auxiliary wiring 104b and the gate wiring 104c are formed at the same time as the gate electrode 104a.

As described above, the potential of the first electrode 102c and the second electrode 108 in each pixel can be stabilized when the auxiliary wiring 104b is provided. In addition, the auxiliary wiring 104b is not necessarily formed. Alternatively, the auxiliary wiring 104b may be formed in the same layer as another layer (for example, in the same layer as the source wiring 107a, in the same layer as the first electrode 102c, or in the same layer as the second electrode 108) or may be formed in a plurality of layers. In addition, although in FIG. 7A, the auxiliary wiring 104b extends in the direction perpendicular to the source wiring 107a, a structure in which the auxiliary wiring 104b extends in the same direction as the source wiring 107a may be employed.

As a material to be used for the conductive film, one or more elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or an alloy material containing one or more of the aforementioned elements (for example, indium tin oxide (ITO), indium zinc oxide (IZO), indium tin oxide doped with silicon oxide (ITSO), zinc oxide (ZnO), aluminum neodymium (Al—Nd), or magnesium silver (Mg—Ag)); a substance obtained by combining such compounds; or the like can be given. Alternatively, a compound (silicide) of silicon and the aforementioned material (such as aluminum silicon, molybdenum silicon, or nickel silicide) or a compound of nitride and the aforementioned material (such as titanium nitride, tantalum nitride, or molybdenum nitride) can be used. Note that silicon (Si) may contain a large amount of n-type impurities (phosphorus or the like) or p-type impurities (boron or the like).

Note that the wiring or the electrode may have a single layer or a multilayer structure of these materials. If a single-layer structure is employed, the manufacturing process can be simplified and the number of steps can be reduced; which leads to reduction in cost. If a multilayer structure is employed, advantage of a material can be derived and disadvantage of the material can be reduced, so that a wiring and an electrode with favorable characteristics can be formed. For example, when a material with low resistance (such as aluminum) is included in the multilayer structure, the resistance of the wiring can be reduced. In addition, if a material with high heat resistance is used, for example, to be interposed between a material with low heat resistance and another advantage in a stacked-layer structure, the heat resistance of the whole wiring or electrode can be improved. For example, a stacked-layer structure in which a layer containing aluminum is interposed between layers containing molybdenum or titanium is desirable. In addition, there is a case in which a material is directly in contact with another wiring or another electrode of another material, so that the materials are adversely affected. For example, a material may enter another material and change its characteristics; therefore, the material cannot serve its original purpose or a problem occurs in manufacturing of the material and the material cannot be manufactured normally. In such a case, a problem can be solved when the layer is interposed between or covered with another layer. For example, if indium tin oxide (ITO) and aluminum are in contact with each other, it is desirable that titanium or molybdenum is interposed therebetween. Also, if silicon and aluminum are in contact with each other, it is desirable that titanium or molybdenum is interposed therebetween.

Next, an impurity is injected into the semiconductor film 102f with use of the gate electrode 104a and a resist pattern (not shown) as a mask. Therefore, the impurity regions 102b and 102d and an impurity region between the gate electrodes 104a are formed. Note that an impurity element of n-type or p-type may be injected. Alternatively, both an n-type impurity element and a p-type impurity element may be injected into a specific region. In the latter case, it is set so that the injected amount of either the n-type impurity element or the p-type impurity element is more than the other.

Note that at this time, an LDD region may be formed by changing the thickness or the stacked-layer structure of the gate insulating film 103. In order to form the LDD region, the gate insulating film is thickened or the number of layers is increased in a portion in which the LDD region is to be formed. Accordingly, the injected amount of the impurity is decreased, so that the LDD region can be easily formed.

Note that the resist pattern may be used as a mask in this step.

In addition, in a step of forming the impurity region, an impurity element may be injected into the first electrode 102c. In such a manner, the first electrode 102c can be formed at the same time as the impurity regions 102b and 102d. Therefore, the number of steps is not increased, so that the manufacturing cost of the liquid crystal display device can be low.

Note that the injection of the impurity element into the impurity region may be carried out before forming the gate electrode 104a, for example, before or after forming the gate insulating film 103. In that case, the impurity element is injected with use of the resist pattern as a mask. At this time, the impurity element may be injected into the first electrode 102c. Also in this case, the step of forming the impurity region in the transistor and the step of injecting the impurity element into the first electrode 102c can be the same step. Accordingly, the manufacturing cost of the liquid crystal display device can be low.

Further, in this case, a capacitor can be formed between an electrode in the same layer as the gate and the semiconductor film into which the impurity is injected. Since the gate insulating film is located between the electrode in the same layer as the gate and the semiconductor film into which the impurity is injected, a capacitor with thin thickness and large capacity can be formed.

Then, the first interlayer insulating film 106a and the contact holes are formed. Subsequently, a conductive film (such as a metal film) is formed over the first interlayer insulating film 106a and in the contact holes. The metal film is patterned, in other words, selectively removed. Thus, the source wiring 107a, the drain wiring 107b, and the connection wiring 107c are formed. As described above, the conductive film can be formed of various materials to have various structures. For example, a film formed of aluminum (Al), nickel (Ni), tungsten (W), molybdenum (Mo), titanium (Ti), tantalum (Ta), neodymium (Nd), platinum (Pt), gold (Au), silver (Ag), or the like; a film formed of an alloy thereof; or a stacked-layer film thereof can be used. Alternatively, silicon (Si) to which an n-type impurity is introduced may be used.

Then, the second interlayer insulating film 106b and the contact holes are formed. Thereafter, an ITO film, an IZO film, or a ZnO film is formed over the second interlayer insulating film 106b and in the contact holes. The film is selectively etched with use of a resist pattern. Thus, the second electrode 108 is formed.

Note that the contact hole in which a part of the drain wiring 107b is embedded and the contact hole in which a part of the second electrode 108 is embedded are different from each other in location. Thus, even if the drain wiring 107b and the second electrode 108 have depressions in portions located over the contact holes, the depressions are not overlapped with each other. Therefore, a deep depressed portion is not formed in the second electrode 108, so that generation of a defect in shape of the aforementioned resist pattern can be suppressed. Thereafter, the resist pattern is removed.

However, the present invention is not limited thereto. For example, the contact hole in which a part of the drain wiring 107b is embedded and the contact hole in which a part of the second electrode 108 is embedded may be overlapped with each other. In this case, the contact holes can be accommodated in one location, therefore the layout can be efficient. Accordingly, the aperture ratio can be improved.

Subsequently, the first alignment film 109a is formed, and the liquid crystal is sealed between the first alignment film 109a and the opposite substrate 111 provided with the second alignment film 109b. Thereafter, on a side of the opposite substrate 111 or on a side of the substrate 100 which are not in contact with the liquid crystal 110 (that is, an outer side of the liquid crystal display device), an optical film or the like such as a polarizing plate, a retardation plate, a quarter-wave plate, a diffusing plate, or a prism sheet is provided. Further, a backlight or a frontlight is provided. As the backlight, a direct type or a sidelight type can be used. As a light source, a cold cathode tube or an LED (light emitting diode) can be used. As the LED, white color LED or single color LED (such as white, red, blue, green, cyan, magenta, or yellow) may be combined to be used. When the LED is used, color purity can be improved since the LED has a sharp peak of light wavelength. In such a manner, a liquid crystal display device is formed.

Note that a liquid crystal display device may only refer to a substrate, an opposite substrate, and a liquid crystal interposed therebetween. Alternatively, a liquid crystal display device may further include an optical film such as a polarizing plate or a retardation plate. Further alternatively, a liquid crystal display device may further include a diffusing plate, a prism sheet, a light source (such as a cold cathode tube or an LED), a light-guide plate, and the like.

According to Embodiment Mode 1 in the present invention, in the liquid crystal display device in which the alignment direction of the liquid crystal is controlled by an FFS mode, the first electrode 102c is formed of a polysilicon film to which an impurity is introduced, and formed in the same step as the semiconductor film 102f including the source region, the drain region, and the channel forming region of the thin film transistor. Therefore, the number of manufacturing steps and the manufacturing cost can be reduced compared with a case in which the common electrode is formed of ITO.

Although the connection wiring 107c is located in the same layer as the source wiring 107a and the drain wiring 107b in this embodiment mode, the connection wiring 107c may be located in another wiring layer (for example, in the same layer as the gate wiring 104c, the first electrode 102c, or the second electrode 108). In addition, the gate insulating film 103 is not necessarily formed over the whole surface.

The auxiliary wiring 104b may be formed in the same layer as the source wiring 107a. In this case, the auxiliary wiring 104b may be located parallel to the gate wiring 104c, and the auxiliary wiring 104b and the gate wiring 104c may be formed in the same layer only in a portion in which the source wiring 107a and the auxiliary wiring 104b are intersected. Alternatively, the auxiliary wiring 104b and the source wiring 107a may be located in parallel.

The gate electrode 104a and the gate wiring 104c may be formed of different materials or in the different layers.

Although a so-called top gate thin film transistor in which the gate electrode is located above the channel forming region is described in this embodiment mode, the present invention is not particularly limited thereto. A so-called bottom gate thin film transistor in which the gate electrode is located under the channel forming region or a transistor having a structure in which the gate electrodes are located over and under the channel forming region may be formed.

Embodiment Mode 2

Figure 9A:
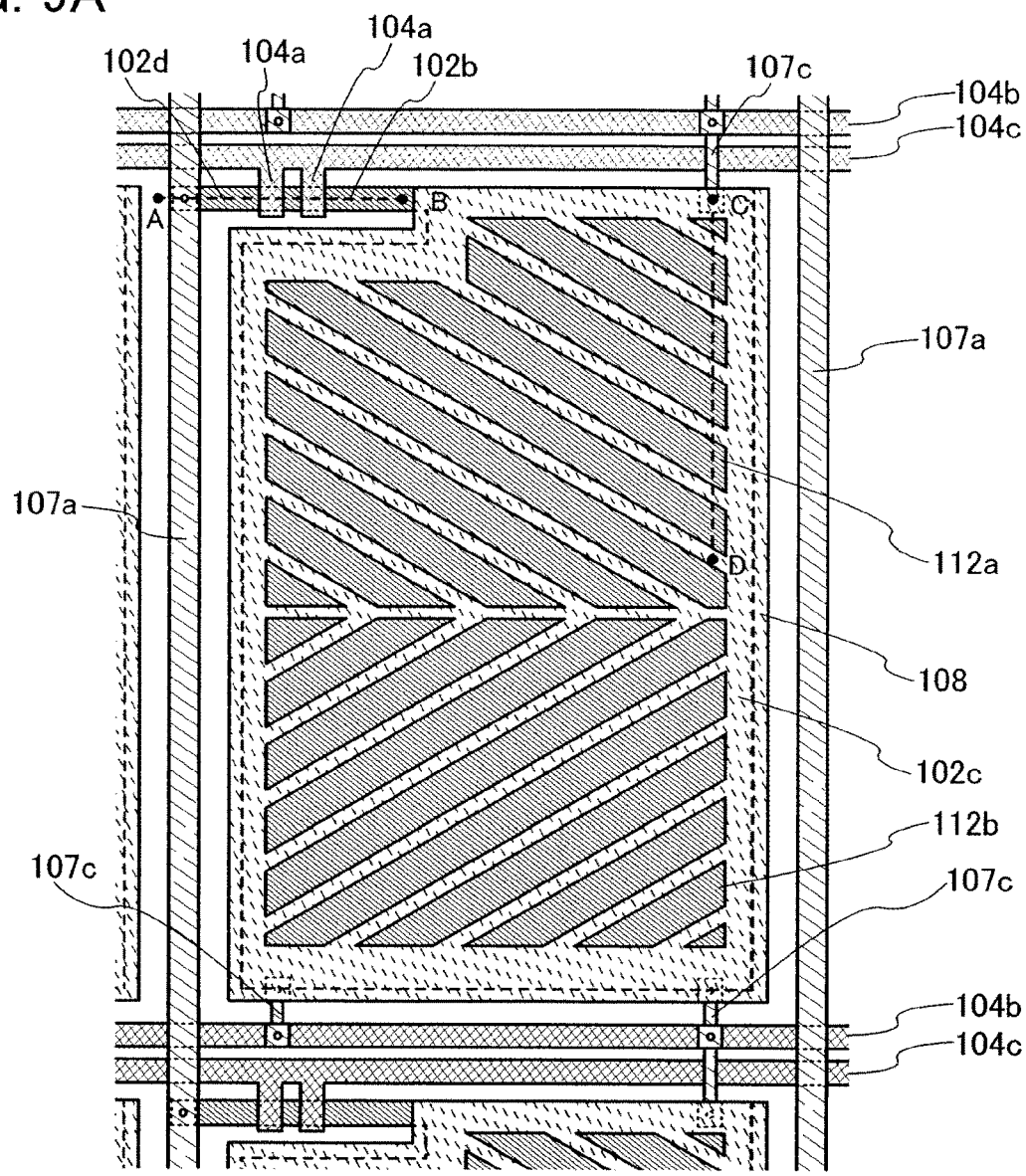
FIG. 9A is a plan view for illustrating a structure of a liquid crystal display device according to Embodiment Mode 2.
Figure 9B:
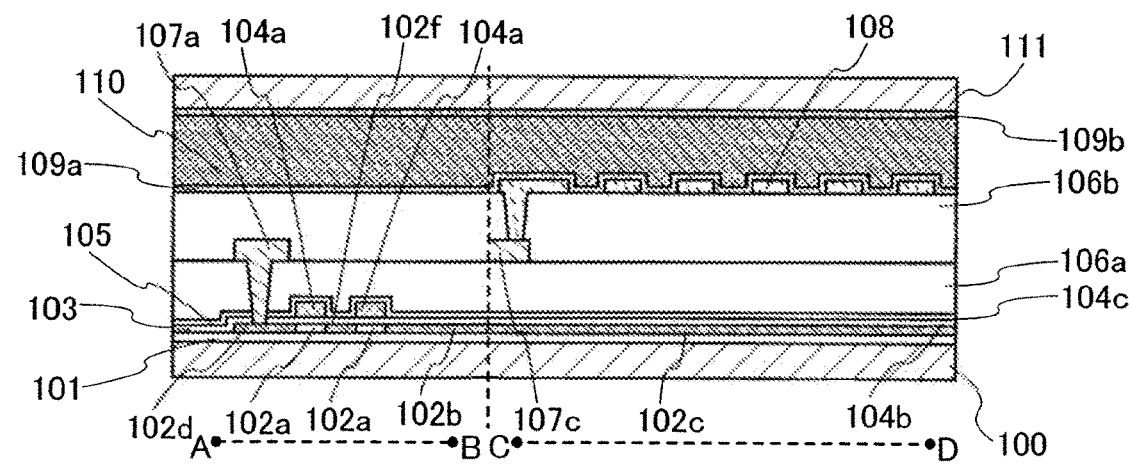
FIG. 9B is a cross-sectional view along lines A-B and C-D of FIG. 9A.

FIG. 9A is a plan view illustrating a structure of an FFS mode liquid crystal display device according to Embodiment Mode 2 in the present invention. FIG. 9B is a cross-sectional view along a line A-B and a line C-D of FIG. 9A. A structure of this embodiment mode is similar to that of Embodiment Mode 1, except that the first electrode 102c is electrically connected to the source wiring 107a through the transistor and functions as the pixel electrode, the second electrode 108 is electrically connected to the auxiliary wiring 104b and functions as the common electrode, a shape of the opening pattern 112 formed in the second electrode 108 is different, and connection structures of the first electrode 102c, the second electrode 108, and the wirings are different. Also, a manufacturing method of the liquid crystal display device according to this embodiment mode is almost similar to that in Embodiment Mode 1. Therefore, the description in Embodiment Mode 1 can be applied to this embodiment mode. Hereinafter, the component similar to that of Embodiment Mode 1 is denoted by the same reference numeral and description thereof is omitted.

The impurity region 102b to be a drain or a source of the transistor is directly connected to the first electrode 102c. In other words, the semiconductor layer in the transistor and the first electrode 102c are contiguous with each other to form one island. In addition, unlike Embodiment Mode 1, the contact hole located over the impurity region 102b and the contact hole located over the first electrode 102c are not formed in the first interlayer insulating film 106a. Accordingly, the region for the contact holes can be utilized for displaying an image, which leads to improvement in aperture ratio.

Note that since the impurity region 102b functioning as the drain or the source of the transistor and the first electrode 102 are contiguous and connected to each other; therefore, in some cases, it is difficult to clearly see where the impurity region 102b in the transistor ends and where the first electrode 102 begins.

Note that in a case where an impurity (a p-type impurity or an n-type impurity) such as phosphorus, boron, gallium, or arsenic is introduced to the impurity region to be as the drain or the source of the transistor, it is desirable that an impurity having the same conductivity is also introduced to the first electrode 102c at the same time. When the impurity is introduced to the impurity region and the first electrode 102c at the same time, since they are contiguous with each other, they can be electrically connected to each other. At this time, the concentration of the impurity introduced to portions is influenced by a thickness or a quality of a material of the film over the portions. When being formed under the similar layer structures, the impurity region functioning as a drain or a source of the transistor and the first electrode 102c have the impurity (a p-type impurity or an n-type impurity) at approximately the same concentration, at least partially.

A contact hole located over the connection wiring 107c is formed in the second interlayer insulating film 106b. The second electrode 108 has a part embedded in the contact hole, so as to be connected to the connection wiring 107c.

As shown in FIG. 9A, in this embodiment mode, the second electrode 108 has two kinds of opening patterns 112a and 112b. The opening pattern 112a formed in an upper region in the drawing and the opening pattern 112b formed in a lower region in the drawing have different orientations from each other.

If opening patterns 112a and 112b with different orientations are provided, a plurality of regions with different moving directions of liquid crystal molecules can be realized. In other word, a multidomain structure can be employed. When a multidomain structure is employed, it can be prevented that an image cannot be displayed properly if seen from a certain direction. Accordingly, the viewing angle can be improved.

In addition, as shown in FIGS. 9A and 9B, the first electrode 102c functions as the pixel electrode and the second electrode 108 functions as the common electrode, and the liquid crystal is located closer to the common electrode than to the pixel electrode. Accordingly, even if voltage of the pixel electrode varies among pixels, an electric field in a portion where the liquid crystal exists hardly changes due to an image; therefore, adjacent pixels are less affected each other, so that crosstalk can be reduced.

With this embodiment mode, an effect similar to Embodiment Mode 1 can be obtained. In addition, the opening patterns 112a and 112b with different orientations are formed in the second electrode 108. Therefore, the direction of electrical field gradient generated between the first electrode 102c and the second electrode 108 and in the liquid crystal 110 can be divided into two in a plane parallel to the substrate. Therefore, the viewing angle of the liquid crystal display device can be further improved.

Note that in Embodiment Mode 1, the shape of the second electrode 108 may be similar to that in this embodiment mode. In addition, in this embodiment mode, the shape of the opening pattern in the second electrode 108 may be similar to that in Embodiment Mode 1. Although only one pixel is shown in FIGS. 9A and 9B, a plurality of pixels are arranged in matrix in practice. In practice, the second electrodes 108 in pixels may be connected to each other through the connection wiring 107c. Accordingly, the resistance can be lowered, so that the sufficient voltage can be applied to the second electrode 108.

Note that this embodiment mode shows an example in a case in which the description in Embodiment Mode 1 is partially changed, improved, or transformed. Therefore, the description in Embodiment Mode 1 can be applied to or combined with this embodiment mode.

In addition, description is made with reference to various drawings. One drawing includes various components. Therefore, another structure can be made by combining components selected from different drawings.

Embodiment Mode 3

Figure 10A:
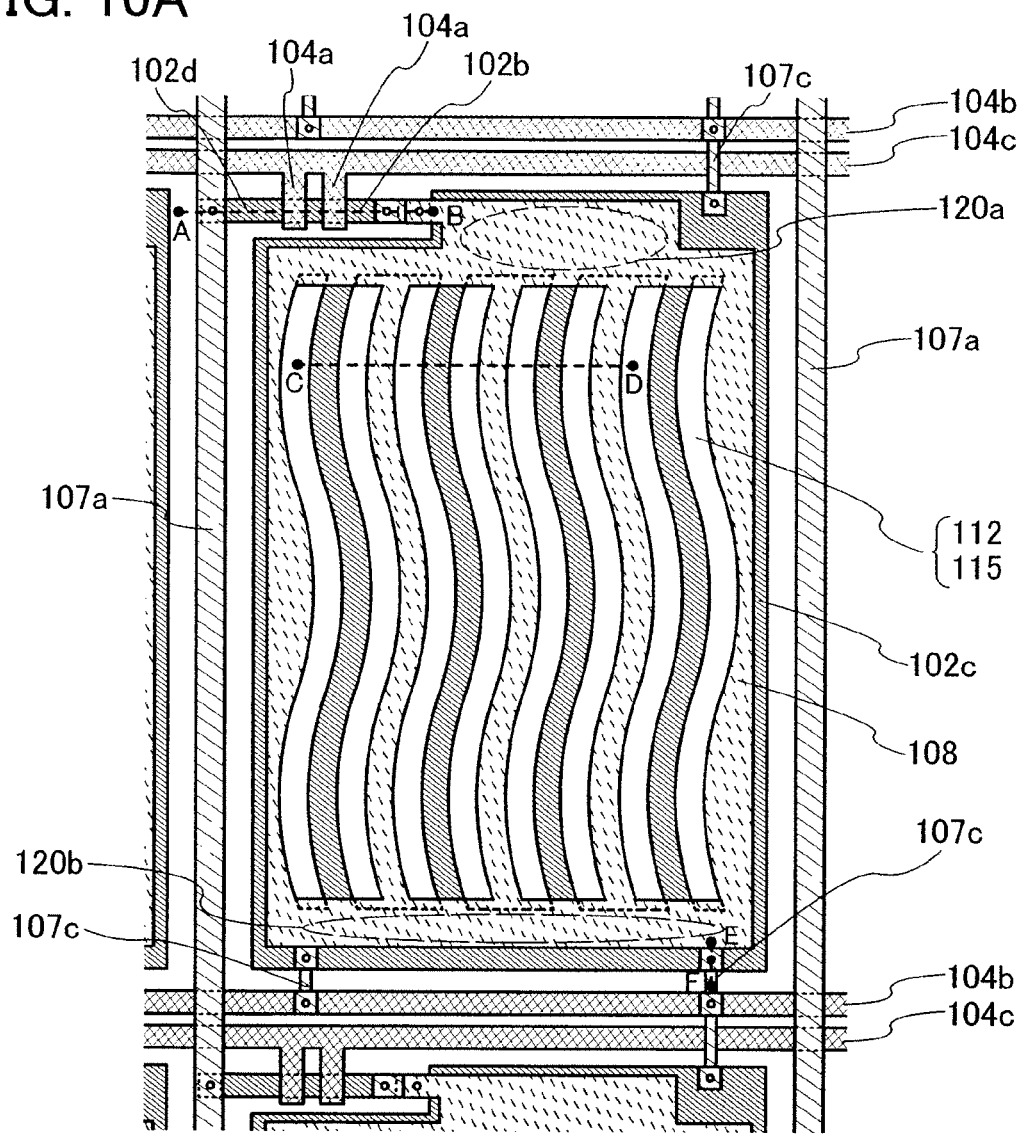
FIG. 10A is a plan view for illustrating a structure of a liquid crystal display device according to Embodiment Mode 3.
Figure 10B:
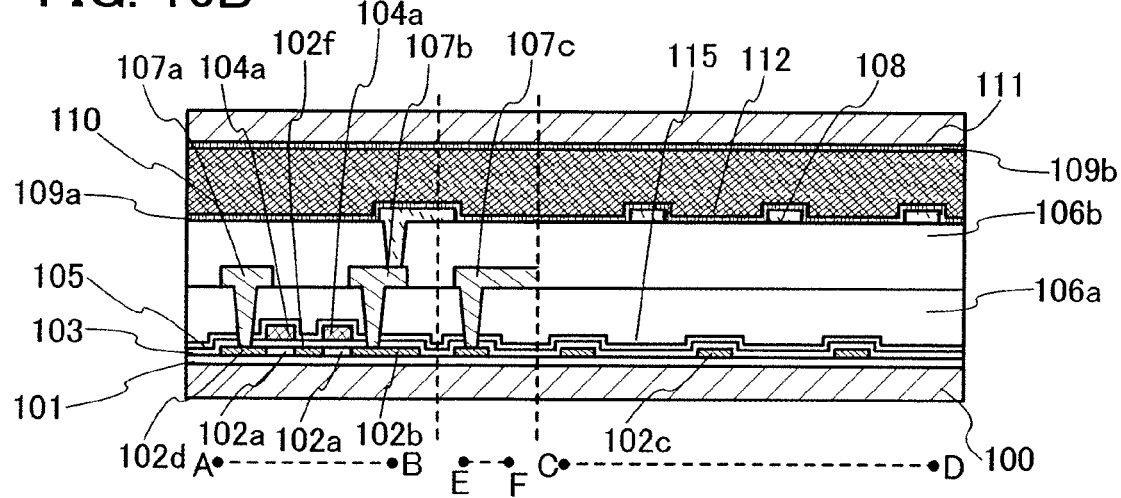
FIG. 10B is a cross-sectional view along lines A-B, C-D, and E-F of FIG. 10A.

FIG. 10A is a plan view illustrating a structure of a liquid crystal display device according to Embodiment Mode 3 in the present invention. FIG. 10B is a cross-sectional view along a line A-B, a line C-D, and a line E-F of FIG. 10A. A structure of this embodiment mode is similar to that of Embodiment Mode 1, except that an opening pattern 115 is formed in the first electrode 102c and except for the shape of the opening pattern 112. In other words, the liquid crystal display device according to this embodiment mode is a device in which the alignment direction of the liquid crystal is controlled by an IPS mode. The pixel portion and the common electrode are alternately arranged and are generally in parallel in a main portion, when seen from a direction perpendicular to the substrate 100 of the liquid crystal display device. In the aforementioned FFS mode, a lower electrode of the pixel electrode and the common electrode does not have an opening pattern. Note that a manufacturing method of the liquid crystal display device according to this embodiment mode is generally similar to that of Embodiment Mode 1. Accordingly, the description in Embodiment Mode 1 can be applied to this embodiment mode. Hereinafter, the component similar to that of Embodiment Mode 1 is denoted by the same reference numeral and description thereof is omitted.

The opening pattern 115 is located under a region of the second electrode 108, in which the opening pattern 112 is not formed, and the surroundings thereof. Accordingly, the first electrode 102c functioning as the common electrode and the second electrode 108 functioning as the pixel electrode are alternately arranged and generally parallel except in the periphery portions. With the aforementioned electrode structure, an electric field parallel to the substrate can be generated between the first electrode 102c and the second electrode 108, and an effect such as improvement in viewing angle which is characteristics of an IPS mode can be obtained. The opening patterns 112 and 115 have waveshapes in this embodiment mode.

If the opening patterns are thus provided to have different orientations, a plurality of regions with different moving directions of liquid crystal molecules can be realized. In other word, a multidomain structure can be employed. When a multidomain structure is employed, it can be prevented that an image cannot be displayed properly if seen from a certain direction. Accordingly, the viewing angle can be improved.

In this embodiment mode, a portion of the first electrode 102c and a portion of the second electrode 108 (portions denoted by reference numerals 120a and 120b) interpose the gate insulating film 103, the insulating film 105, the first interlayer insulating film 106a, and the second interlayer insulating film 106b. Therefore, in each portion denoted by the reference numerals 120a and 120b, the first electrode 102c, the second electrode 108, and the insulating film therebetween function as a capacitor. With provision of the capacitors 120a and 120b, the storage capacitance can be increased. Therefore, when a thin film transistor is turned off, the potential of the second electrode 108 can be easily kept.

With this embodiment mode, an effect similar to Embodiment Mode 1 can be obtained. Note that in this embodiment mode, the opening pattern 112 formed in the second electrode 108 may have the shape of the opening pattern 112 shown in FIGS. 7A and 7B or 9A and 9B. In this case, the opening pattern 115 included in the first electrode 102c has a shape similar to the opening pattern 112 shown in FIGS. 7A and 7B, or 9A and 9B. Note that the opening patterns 112 and 115 are required to be arranged so that the first electrode 102c and the second electrode 108 are alternately arranged and are generally in parallel except in the periphery portions, when seen from the direction perpendicular to the substrate 100 of the liquid crystal display device.

In addition, in Embodiment Mode 1 or 2, the opening pattern 112 may have a shape similar to that in this embodiment mode. In this case, an FFS mode liquid crystal display device in which the opening pattern 112 has the shape shown in FIGS. 10A and 10B can be obtained.

Note that the first electrode 102c has the opening pattern 115 in this embodiment mode. Therefore, in a portion of the opening pattern, the amount of light transmitted therethrough is increased. This is because the first electrode 102 is not provided in that portion. In a portion where the first electrode 102 is provided, the amount of light transmitted therethrough is decreased because the light transmittance is not 100%. On the other hand, in a portion where the first electrode 102 is not provided, the light does not attenuate, which leads to increase in amount of light transmitted therethrough. As a result, it is possible to increase luminance and to reduce power consumption.

Note that this embodiment mode shows an example in a case where the description in Embodiment Modes 1 and 2 is partially changed, improved, or transformed. Therefore, the description in Embodiment Modes 1 and 2 can be applied to or combined with this embodiment mode.

In addition, description is made with reference to various drawings. One drawing includes various components. Therefore, another structure can be made by combining components selected from different drawings.

Embodiment Mode 4

Figure 11A:
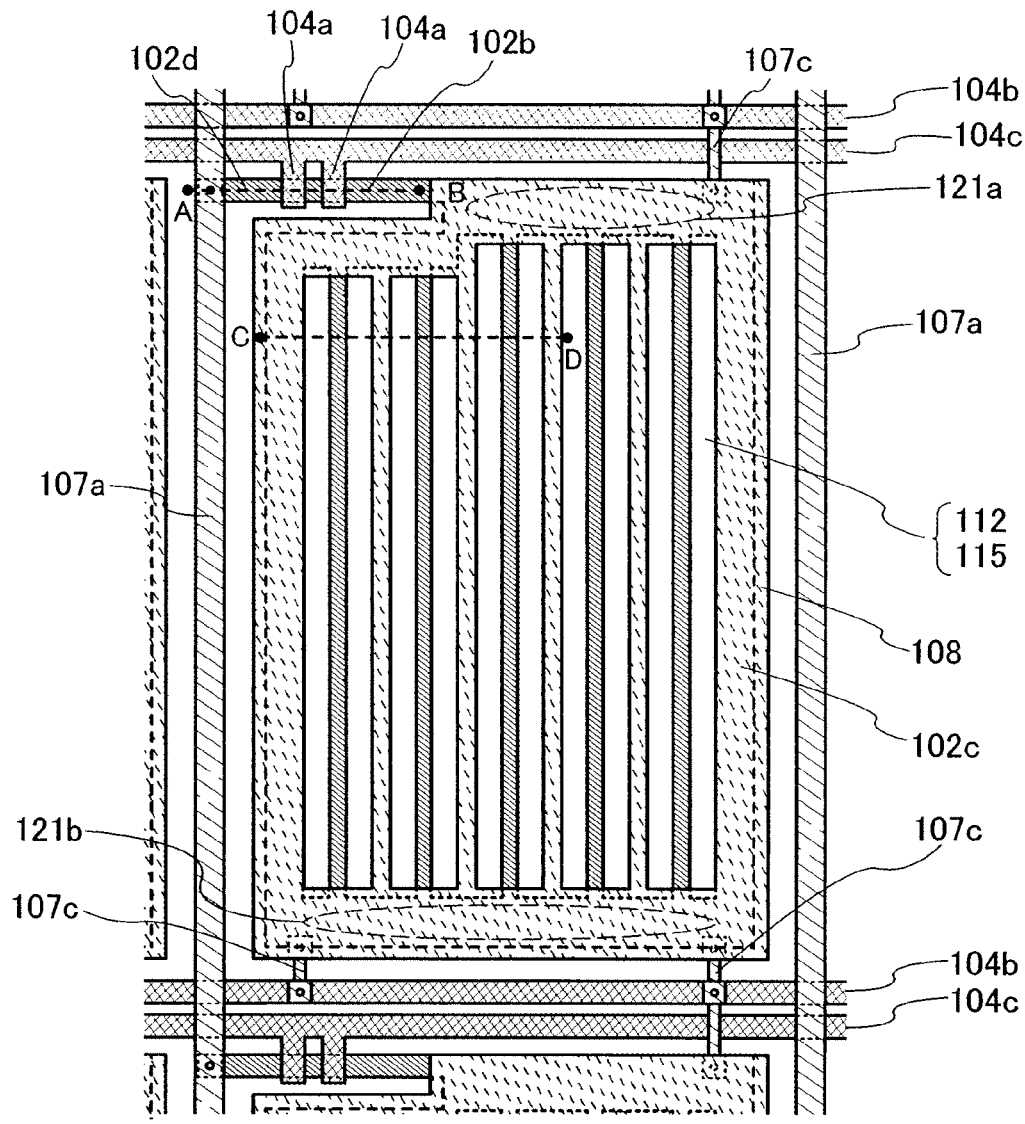
FIG. 11A is a plan view for illustrating a structure of a liquid crystal display device according to Embodiment Mode 4.
Figure 11B:
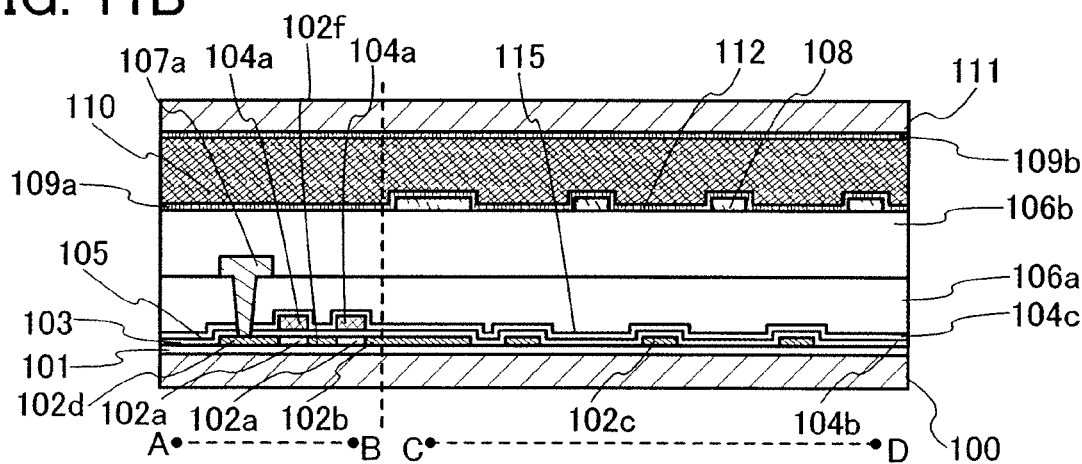
FIG. 11B is a cross-sectional view along lines A-B and C-D of FIG. 11A.

FIG. 11A is a plan view illustrating a structure of an IPS mode liquid crystal display device according to Embodiment Mode 4 in the present invention. FIG. 11B is a cross-sectional view along a line A-B and a line C-D of FIG. 11A. A structure in this embodiment mode is similar to Embodiment Mode 2, except that the opening pattern 115 is formed in the first electrode 102c and except for the shape of the opening pattern 112. Also, a manufacturing method of the liquid crystal display device according to this embodiment mode is generally similar to that in Embodiment Mode 2.

Accordingly, the description in Embodiment Mode 2 can be applied to this embodiment mode. Hereinafter, the component similar to that of Embodiment Mode 2 is denoted by the same reference numeral and description thereof is omitted.

The impurity region 102b to be a drain or a source of the transistor is directly connected to the first electrode 102c. In other words, the semiconductor layer in the transistor and the first electrode 102c are contiguous with each other to form one island. In addition, unlike Embodiment Mode 1, the contact hole located over the impurity region 102b and the contact hole located over the first electrode 102c are not formed in the first interlayer insulating film 106a. Accordingly, the region for the contact holes can be utilized for displaying an image, which leads to improvement in aperture ratio.

The opening pattern 115 is located under a region of the second electrode 108, in which the opening pattern 112 is not formed and the surroundings thereof. Accordingly, the first electrode 102c functioning as the pixel electrode and the second electrode 108 functioning as the common electrode are alternately arranged and are generally in parallel except in the periphery portions. With the aforementioned electrode structure, a lateral electric field can be generated between the first electrode 102c and the second electrode 108, and an effect such as improvement in viewing angle which is characteristics of an IPS mode can be obtained. The opening patterns 112 and 115 are generally parallel to the source wiring 107a in this embodiment mode.

In this embodiment mode, a portion of the first electrode 102c and a portion of the second electrode 108 (portions denoted by reference numerals 121a and 121b) interpose the gate insulating film 103, the insulating film 105, the first interlayer insulating film 106a, and the second interlayer insulating film 106b. Therefore, in each portion denoted by the reference numerals 121a and 121b, the first electrode 102c, the second electrode 108, and the insulating film therebetween function as a capacitor. With provision of the capacitors 121a and 121b, the storage capacitance can be increased. Therefore, when a thin film transistor is turned off, the potential of the first electrode 102c can be easily kept.

In this embodiment mode, an effect similar to Embodiment Mode 1 can be obtained. Note that in this embodiment mode, the opening patterns 112 and 115 may have the shape shown in FIGS. 10A and 10B. Alternatively, the opening pattern 112 may have the shape shown in FIGS. 7A and 7B, or 9A and 9B. In this case, the opening pattern 115 has a shape similar to the opening pattern 112 shown in FIGS. 7A and 7B, or 9A and 9B. Note that the opening patterns 112 and 115 are required to be arranged so that the first electrode 102c and the second electrode 108 are alternately arranged and are generally in parallel except in the periphery portions, when seen from the direction perpendicular to the substrate 100 of the liquid crystal display device.

In addition, the opening patterns 112 and 115 in the IPS mode liquid crystal display device shown in Embodiment Mode 3 may have the shape shown in FIGS. 11A and 11B. Alternatively, in Embodiment Mode 1 or 2, the opening pattern 112 may have a shape similar to that in this embodiment mode. In the latter case, an FFS mode liquid crystal display device in which the opening pattern 112 has the shape shown in FIGS. 11A and 11B can be obtained.

Note that the first electrode 102c has the opening pattern 115 in this embodiment mode. Therefore, in a portion of the opening pattern, the amount of light transmitted therethrough is increased. This is because the first electrode 102 is not provided in that portion. In a portion where the first electrode 102 is provided, the amount of light transmitted therethrough is decreased because the light transmittance is not 100%. On the other hand, in a portion where the first electrode 102 is not provided, the light does not attenuate, which leads to increase in the amount of light transmitted therethrough. As a result, it is possible to increase luminance and to reduce power consumption.

Note that this embodiment mode shows an example in a case where the description in Embodiment Modes 1 to 3 is partially changed, improved, or transformed. Therefore, the description in Embodiment Modes 1 to 3 can be applied to or combined with this embodiment mode.

In addition, description is made with reference to various drawings. One drawing includes various components. Therefore, another structure can be made by combining components selected from different drawings.

Embodiment Mode 5

Figure 12A:
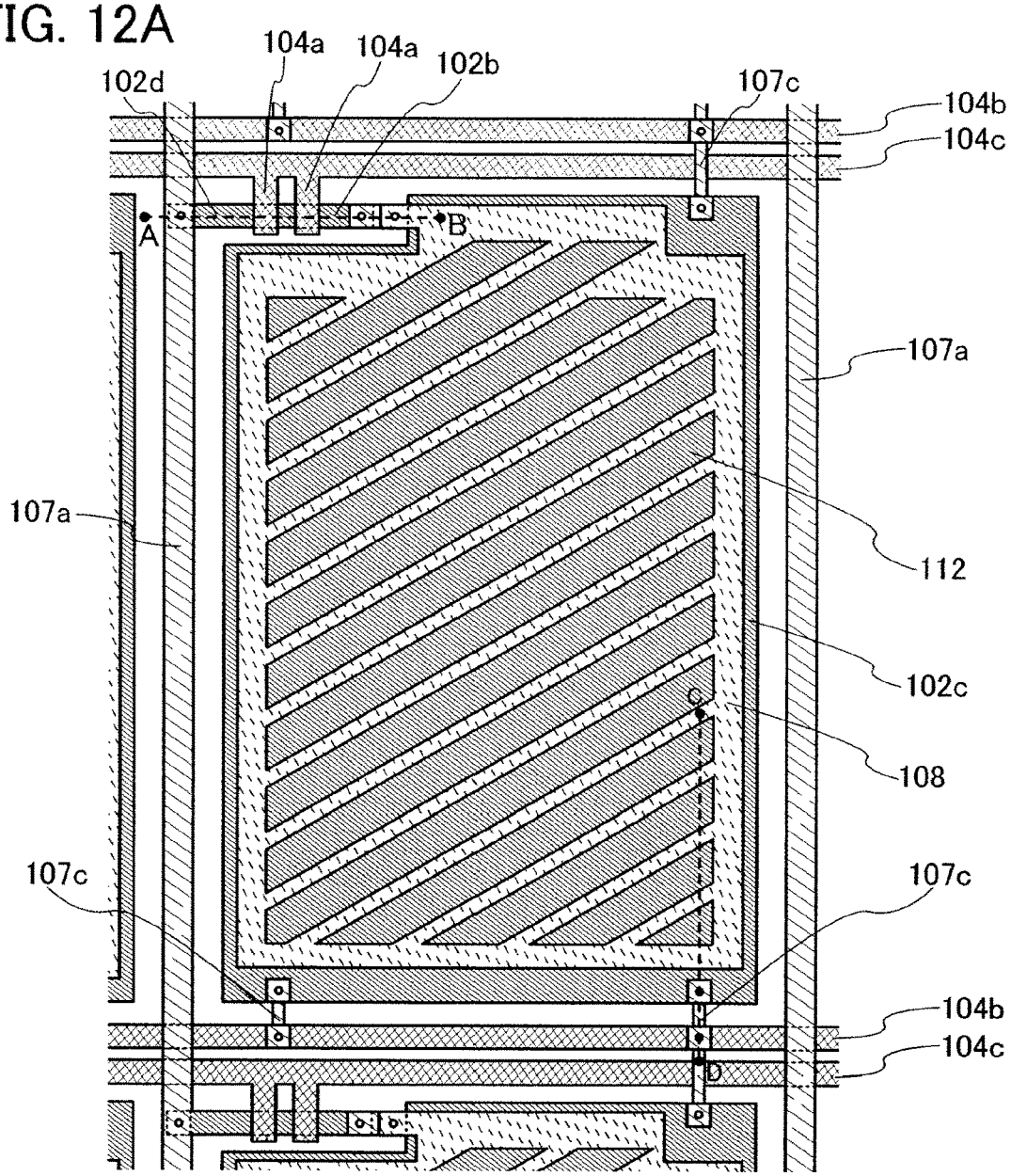
FIG. 12A is a plan view for illustrating a structure of a liquid crystal display device according to Embodiment Mode 5.
Figure 12B:
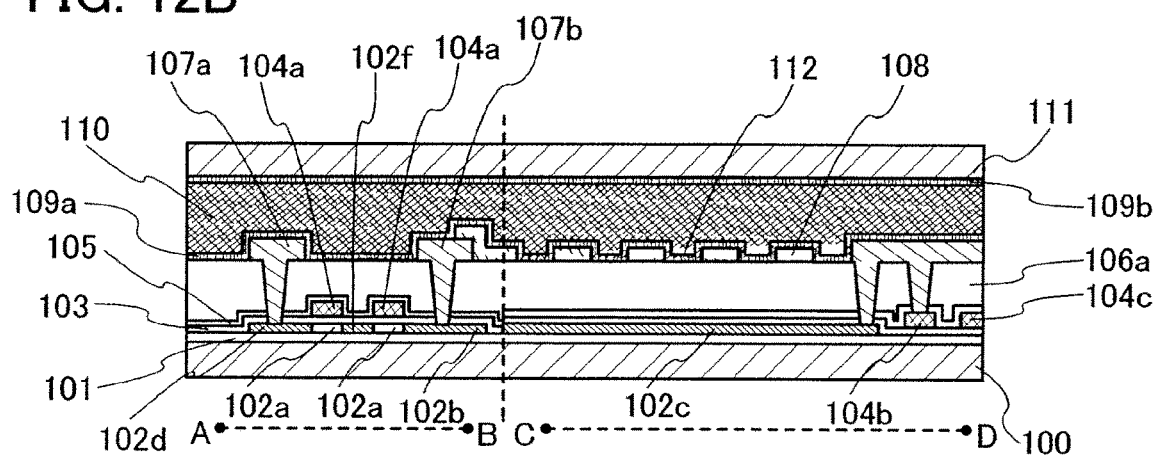
FIG. 12B is a cross-sectional view along lines A-B and C-D of FIG. 12A.

FIG. 12A is a plan view illustrating a structure of an FFS mode liquid crystal display device according to Embodiment Mode 5 in the present invention. FIG. 12B is a cross-sectional view along a line A-B and a line C-D of FIG. 12A. A structure of this embodiment mode is similar to that of Embodiment Mode 1, except that the second interlayer insulating film 106b is not formed, and the second electrode 108 is formed over the first interlayer insulating film 106a. A part of the second electrode 108 is located over the drain wiring 107b and the second electrode 108 and the drain wiring 107b are directly connected therethrough.

The second electrode 108 is formed after the source wiring 107a, the drain wiring 107b, and the connection wiring 107c are formed. By forming the second electrode 108 after forming the drain wiring 107b, residue of etching of the drain wiring 107b is prevented from remaining on a surface of the second electrode 108, which can planarize the surface of the second electrode 108. Note that a structure in which the second electrode 108 covers the drain wiring 107b may be employed.

Note that the second electrode 108 may be formed at the same time as the source wiring 107a and the drain wiring 107b. That is, they may be formed of a similar material and by patterning at the same time. Accordingly, a step of forming a light-transmitting electrode can be omitted, so that the cost can be reduced.

Therefore, the second electrode 108 does not necessarily have a light-transmitting property. In other words, the second electrode 108 may reflect light.

A manufacturing method of the liquid crystal display device according to this embodiment mode is generally similar to that in Embodiment Mode 1, except that the step of forming the second interlayer insulating film 106b is omitted. Therefore, the description in Embodiment Mode 1 can be applied to this embodiment mode. Note that since the step of forming the second interlayer insulating film 106b is omitted, the manufacturing cost of the liquid crystal display device is lowered. Hereinafter, the component similar to that of Embodiment Mode 1 is denoted by the same reference numeral and description thereof is omitted.

With this embodiment mode, an effect similar to Embodiment Mode 1 can be obtained. Note that in this embodiment mode, the number of the interlayer insulating films is smaller by one than that of Embodiment Mode 1, an electrical field gradient between the first electrode 102c and the second electrode 108 becomes large. Therefore, a potential gradient of the same level can be obtained with low voltage, whereby power consumption of the liquid crystal display device can be reduced. This effect is enhanced when the first interlayer insulating film 106a is formed of a material with high dielectric constant (such as silicon nitride, aluminum oxide, hafnium oxide, or tantalum oxide). In the case of forming the first interlayer insulating film 106a of a material with high dielectric constant, an effect in which storage capacitance can be increased can be also obtained. In addition, since the step of forming the second interlayer insulating film 106b is omitted, the manufacturing cost is low compared with Embodiment Mode 1.

Note that in this embodiment mode, a structure similar to Embodiment Mode 2 may be employed, in which the first electrode 102c and the impurity region 102b to be a drain may be connected, so that the first electrode 102c may function as the pixel electrode. In this case, there is an advantage over Embodiment Mode 2 in that the second interlayer insulating film 106b is not required. In addition, the second electrode 108 is directly connected to the connection wiring 107c in the same manner of the drain wiring 107b and the second electrode 108 in FIGS. 12A and 12B where the second electrode 108 is partially located over the drain wiring 107b. Thus, the second electrode 108 functions as the common electrode.

In this embodiment mode, the second electrode 108 and the opening pattern 112 may have the shapes shown in FIGS.

9A and 9B, 10A and 10B, or 11A and 11B. If the second electrode 108 and the opening pattern 112 have the shapes shown in FIGS. 10A and 10B, or 11A and 11B, the capacitors denoted by the reference numerals 120a and 120b in FIGS. 10A and 10B or the capacitors denoted by the reference numerals 121a and 121b in FIGS. 11A and 11B are formed, so that the storage capacitance can be increased. Therefore, when a thin film transistor is turned off, the potential of the second electrode 108 can be easily kept.

Note that this embodiment mode shows an example in a case where the description in Embodiment Modes 1 to 4 is partially changed, improved, or transformed. Therefore, the description in Embodiment Modes 1 to 4 can be applied to or combined with this embodiment mode.

In addition, description is made with reference to various drawings. One drawing includes various components. Therefore, another structure can be made by combining components selected from different drawings.

Embodiment Mode 6

Figure 13A:
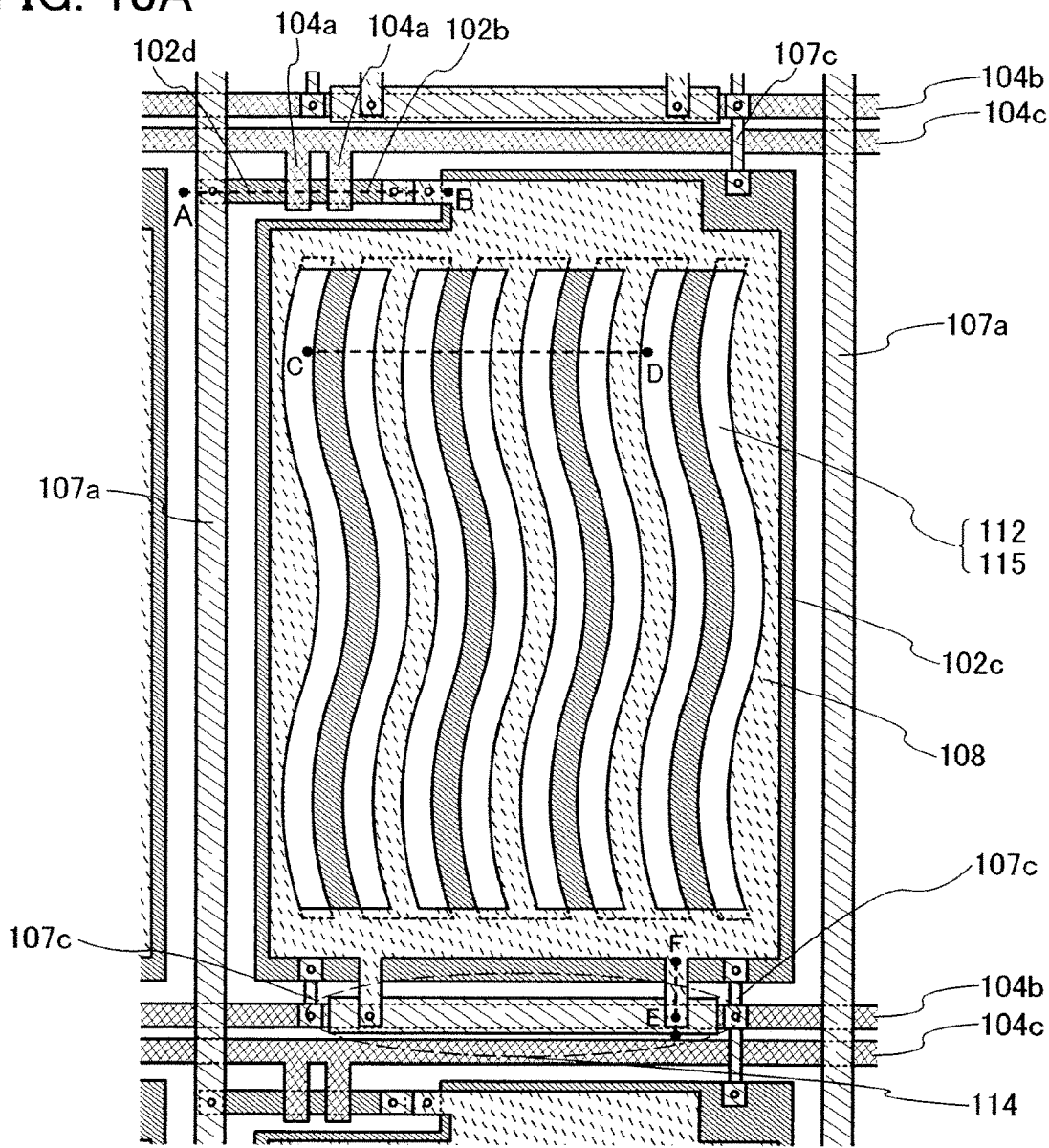
FIG. 13A is a plan view for illustrating a structure of a liquid crystal display device according to Embodiment Mode 6.
Figure 13B:
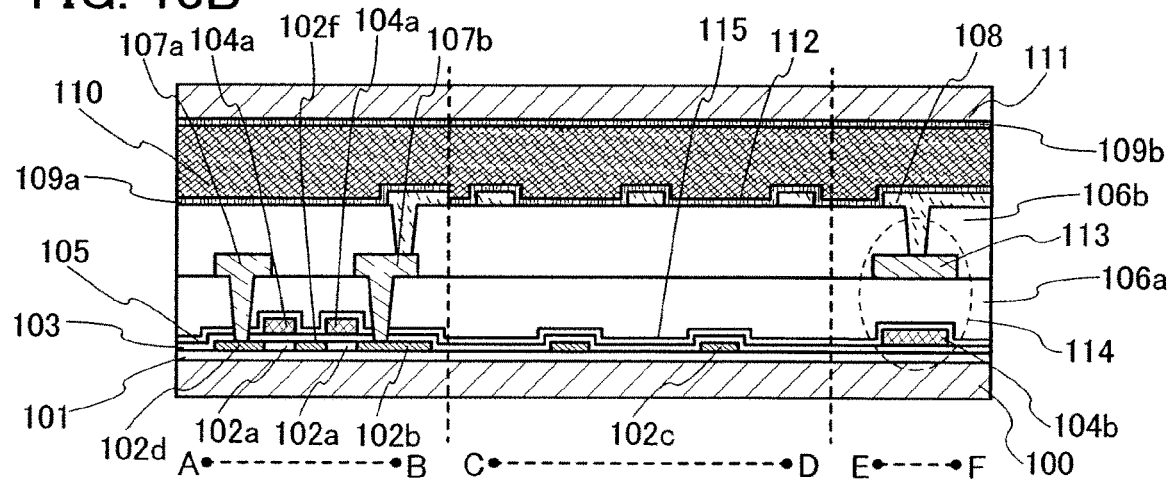
FIG. 13B is a cross-sectional view along lines A-B, C-D, and E-F of FIG. 13A.

FIG. 13A is a plan view illustrating a structure of an IPS mode liquid crystal display device according to Embodiment Mode 6 in the present invention. FIG. 13B is a cross-sectional view along a line A-B, a line C-D, and a line E-F of FIG. 13A. A liquid crystal display device according to this embodiment mode is similar to that of Embodiment Mode 3, except that a capacitor 114 connected to the second electrode 108 is provided. Note that as long as a structure in which the capacitor is connected to the auxiliary wiring 104b and the second electrode 108, the present invention is not limited to the structure shown in this embodiment mode. In addition, a manufacturing method of the liquid crystal display device according to this embodiment mode is generally similar to that in Embodiment Mode 3. Therefore, the description in Embodiment Mode 3 can be applied to this embodiment mode. Hereinafter, the component similar to that of Embodiment Mode 3 is denoted by the same reference numeral and description thereof is omitted.

An electrode 113 for the capacitor which is located above the auxiliary wiring 104b is formed over the first interlayer insulating film 106a. The electrode 113 for the capacitor is located in the same layer as the source wiring 107a and formed in the same step as the source wiring 107a. The capacitor 114 includes the auxiliary wiring 104b and the electrode 113 for the capacitor with the insulating film 105 and the first interlayer insulating film 106a therebetween. Since the capacitor is formed above the auxiliary wiring 104b, an area of the opening portion is not reduced. Therefore, in a case of providing the capacitor, the aperture ratio is not decreased.

A contact hole located over the electrode 113 for the capacitor is formed in the second interlayer insulating film 106b. The second electrode 108 has a part embedded in the contact hole, so as to be connected to the electrode 113 for the capacitor.

With this embodiment mode, an effect similar to Embodiment Mode 3 can be obtained. In addition, since the capacitor 114 is connected between the second electrode 108 functioning as a pixel electrode and the auxiliary wiring 104b, the voltage of the second electrode 108 is easily kept when the thin film transistor is turned off.

Note that in this embodiment mode, the opening patterns 112 and 115 may have the shape shown in FIGS. 11A and 11B. Alternatively, the opening pattern 112 may have the shape shown in FIGS. 7A and 7B, or 9A and 9B. In this case, the opening pattern 115 in the first electrode 102c may have a shape similar to the opening pattern 112 shown in FIGS. 7A and 7B, or 9A and 9B. Note that the opening patterns 112 and 115 are required to be arranged so that the first electrode 102c and the second electrode 108 are alternately arranged and are generally in parallel except in the periphery portions, when seen from the direction perpendicular to the substrate 100 of the liquid crystal display device.

In Embodiment Mode 1 shown in FIGS. 7A and 7B, an effect similar to this embodiment mode can be obtained if the capacitor 114 is formed and connected to the second electrode 108. In addition, if the electrode 113 for the capacitor is located above the gate wiring 104c, a similar effect can be obtained because the potential of the gate wiring 104c is substantially constant when the pixel is not selected. The capacitor may keep the potential of the pixel electrode; therefore, the capacitor is preferably formed between the pixel electrode and a wiring with a constant potential. It is more preferable that the gate wiring 104c connected to the capacitor is the gate wiring in one preceding row because the potential thereof is substantially constant since its selected state is finished.

If the opening patterns are thus provided to have different orientations and shapes, a plurality of regions with different moving directions of liquid crystal molecules can be provided. In other word, a multidomain structure can be realized. When a multidomain structure is employed, it can be prevented that an image cannot be displayed properly if seen from a certain direction. Accordingly, the viewing angle can be improved.

Note that the first electrode 102c has the opening pattern 115 in this embodiment mode. Therefore, in a portion of the opening pattern, the amount of light transmitted therethrough is increased. This is because the first electrode 102 is not provided in that portion. In a portion where the first electrode 102 is provided, the amount of light transmitted therethrough is decreased because the light transmittance is not 100%. On the other hand, in a portion where the first electrode 102 is not provided, light does not attenuate, which leads to increase in amount of light transmitted therethrough. As a result, it is possible to increase luminance and to reduce power consumption.

Note that this embodiment mode shows an example in a case where the description in Embodiment Modes 1 to 5 is partially changed, improved, or transformed. Therefore, the description in Embodiment Modes 1 to 5 can be applied to or combined with this embodiment mode.

In addition, description is made with reference to various drawings. One drawing includes various components. Therefore, another structure can be made by combining components selected from different drawings.

Embodiment Mode 7

Figure 14A:
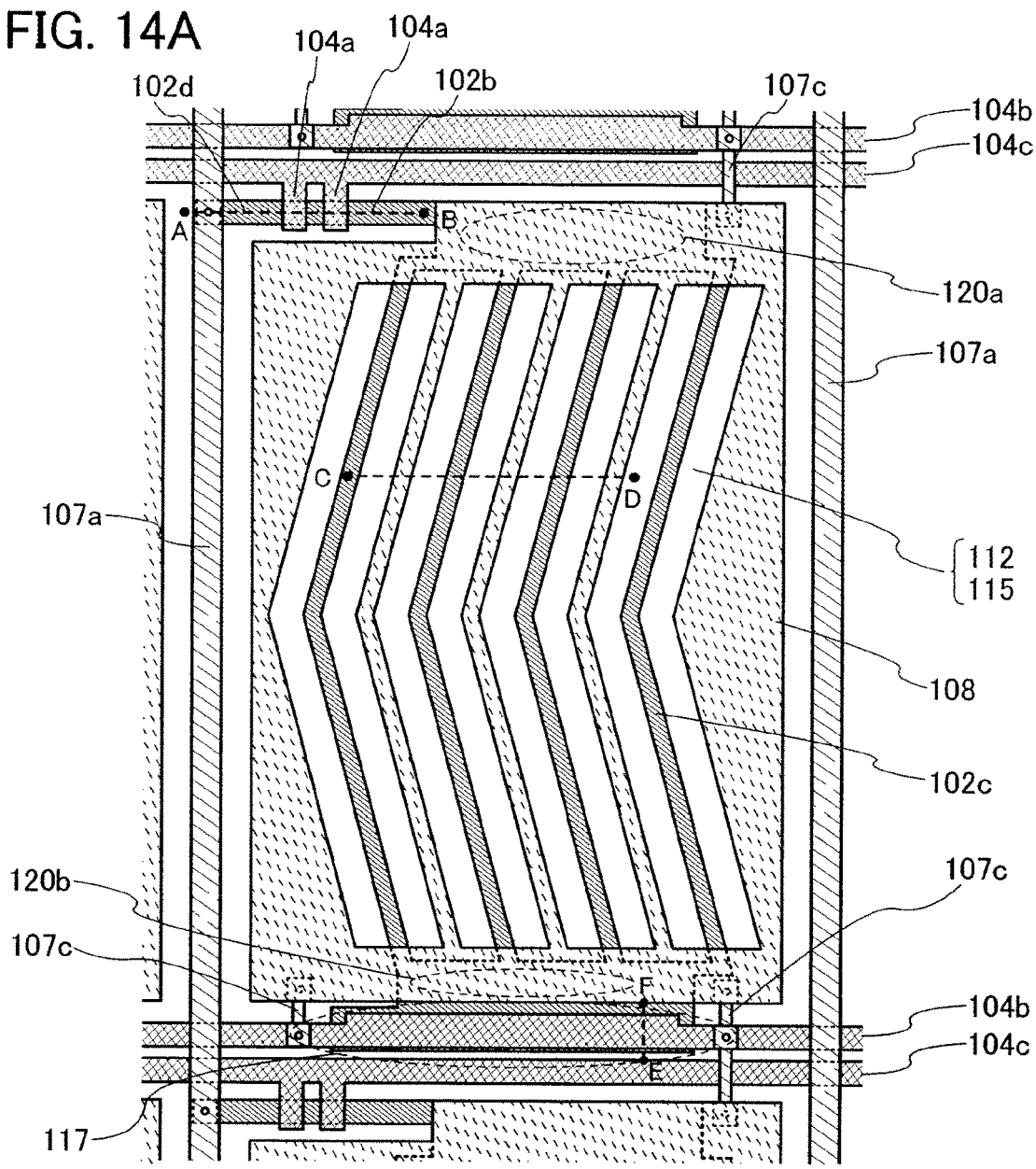
FIG. 14A is a plan view for illustrating a structure of a liquid crystal display device according to Embodiment Mode 7.
Figure 14B:
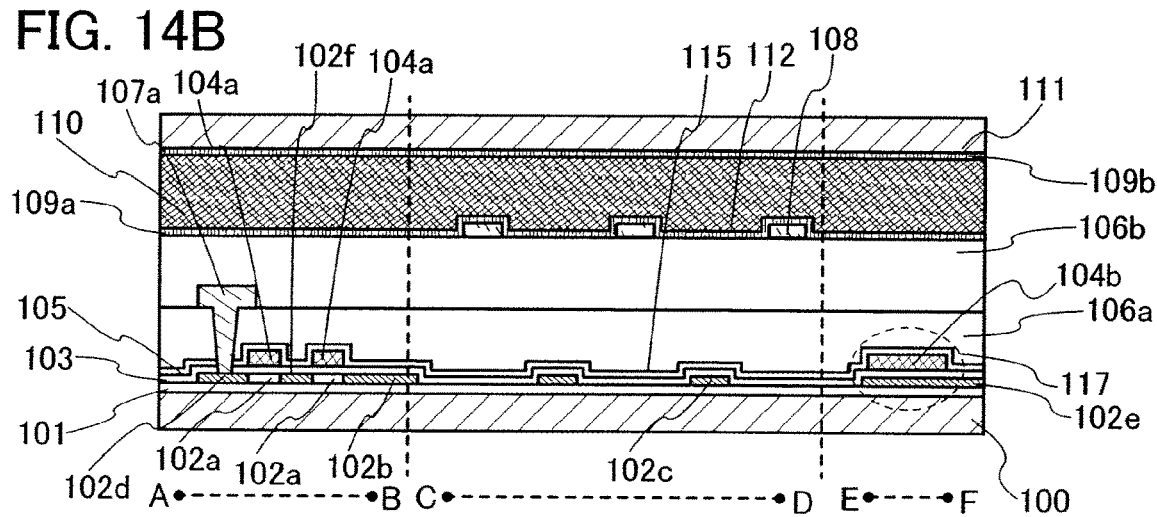
FIG. 14B is a cross-sectional view along lines A-B, C-D, and E-F of FIG. 14A.

FIG. 14A is a plan view illustrating a structure of an IPS mode liquid crystal display device according to Embodiment Mode 7 in the present invention. FIG. 14B is a cross-sectional view along a line A-B, a line C-D, and a line E-F of FIG. 14A. A structure in this embodiment mode is similar to that of the IPS mode liquid crystal display device according to Embodiment Mode 4, except that the opening patterns 115 and 112 have a substantially V-shape and the capacitor 117 electrically connected to the first electrode 102c, and the auxiliary wiring 104b is provided. Accordingly, the description in Embodiment Mode 4 can be applied to this embodiment mode. Hereinafter, the component similar to that of Embodiment Mode 4 is denoted by the same reference numeral and description thereof is omitted.

The capacitance 117 is formed when a part of the first electrode 102c (a lower end in FIG. 14A) is located under the auxiliary wiring 104b. In other words, the capacitance 117 includes the first electrode 102c, the auxiliary wiring 104b, and the gate insulating film 103 therebetween.

A manufacturing method of a liquid crystal display device according to this embodiment mode is similar to Embodiment Mode 3, except that the impurity is injected into the first electrode 102c before forming a conductive film to be the auxiliary wiring 104b, and the impurity is injected into the semiconductor film 102f after forming the gate electrode 104a, the auxiliary wiring 104b, and the like. Accordingly, the resistance of a whole part of the first electrode 102c, which forms the capacitor 117, is lowered and the capacitor 117 operates only by changing the potential of the first electrode 102c with respect to the auxiliary wiring 104b.

With this embodiment mode, an effect similar to Embodiment Mode 4 can be obtained. In addition, since the capacitor 117 is connected between the first electrode 102c functioning as the pixel electrode and the auxiliary wiring 104b, the voltage of the second electrode 102c is easily kept when the thin film transistor is turned off.

Note that the capacitor 117 may be provided in Embodiment Mode 2. In this case, an effect similar to this embodiment mode can be obtained.

In this embodiment mode, the opening patterns 112 and 115 may have the shape shown in FIGS. 10A and 10B, or 11A and 11B. Alternatively, the opening pattern 112 may have the shape shown in FIGS. 7A and 7B, or 9A and 9B. In this case, the opening pattern 115 has the shape of the opening pattern 112 shown in FIGS. 7A and 7B, or 9A and 9B. Note that the opening patterns 112 and 115 are required to be arranged so that the first electrode 102c and the second electrode 108 are alternately arranged and generally in parallel except in the periphery portions, when seen from the direction perpendicular to the substrate 100 of the liquid crystal display device.

In the IPS mode liquid crystal display device according to Embodiment mode 3, 4, or 6, the opening patterns 112 and 115 may have the shape shown in FIGS. 14A and 14B. In addition, in the FFS mode liquid crystal display device according to Embodiment mode 1, 2, or 5, the opening pattern 112 may have the shape shown in FIGS. 14A and 14B.

The impurity region 102b functioning as a drain or a source of the transistor is directly connected to the first electrode 102c. In other words, the semiconductor layer in the transistor and the first electrode 102c are contiguous with each other to form one island. In addition, unlike Embodiment Mode 1, the contact hole located over the impurity region 102b and the contact hole located over the first electrode 102c are not formed in the first interlayer insulating film 106a. Accordingly, the region for the contact holes can be utilized for displaying an image, which leads to improvement in aperture ratio.

If the opening patterns are thus provided to have different orientations, a plurality of regions with different moving directions of liquid crystal molecules can be provided. In other word, a multidomain structure can be realized. When a multidomain structure is employed, it can be prevented that an image cannot be displayed properly if seen from a certain direction. Accordingly, the viewing angle can be improved.

Note that the first electrode 102c has the opening pattern 115 in this embodiment mode. Therefore, in a portion of the opening pattern, the amount of light transmitted therethrough is increased. This is because the first electrode 102 is not provided in that portion. In a portion where the first electrode 102 is provided, the amount of light transmitted therethrough is decreased because the light transmittance is not 100%. On the other hand, in a portion where the first electrode 102 is not provided, light does not attenuate, which leads to increase in amount of light transmitted therethrough. As a result, it is possible to increase luminance and to reduce power consumption.

Note that this embodiment mode shows an example in a case where the description in Embodiment Modes 1 to 6 is partially changed, improved, or transformed. Therefore, the description in Embodiment Modes 1 to 6 can be applied to or combined with this embodiment mode.

In addition, description is made with reference to various drawings. One drawing includes various components. Therefore, another structure can be made by combining components selected from different drawings.

Embodiment Mode 8

Figure 15A:
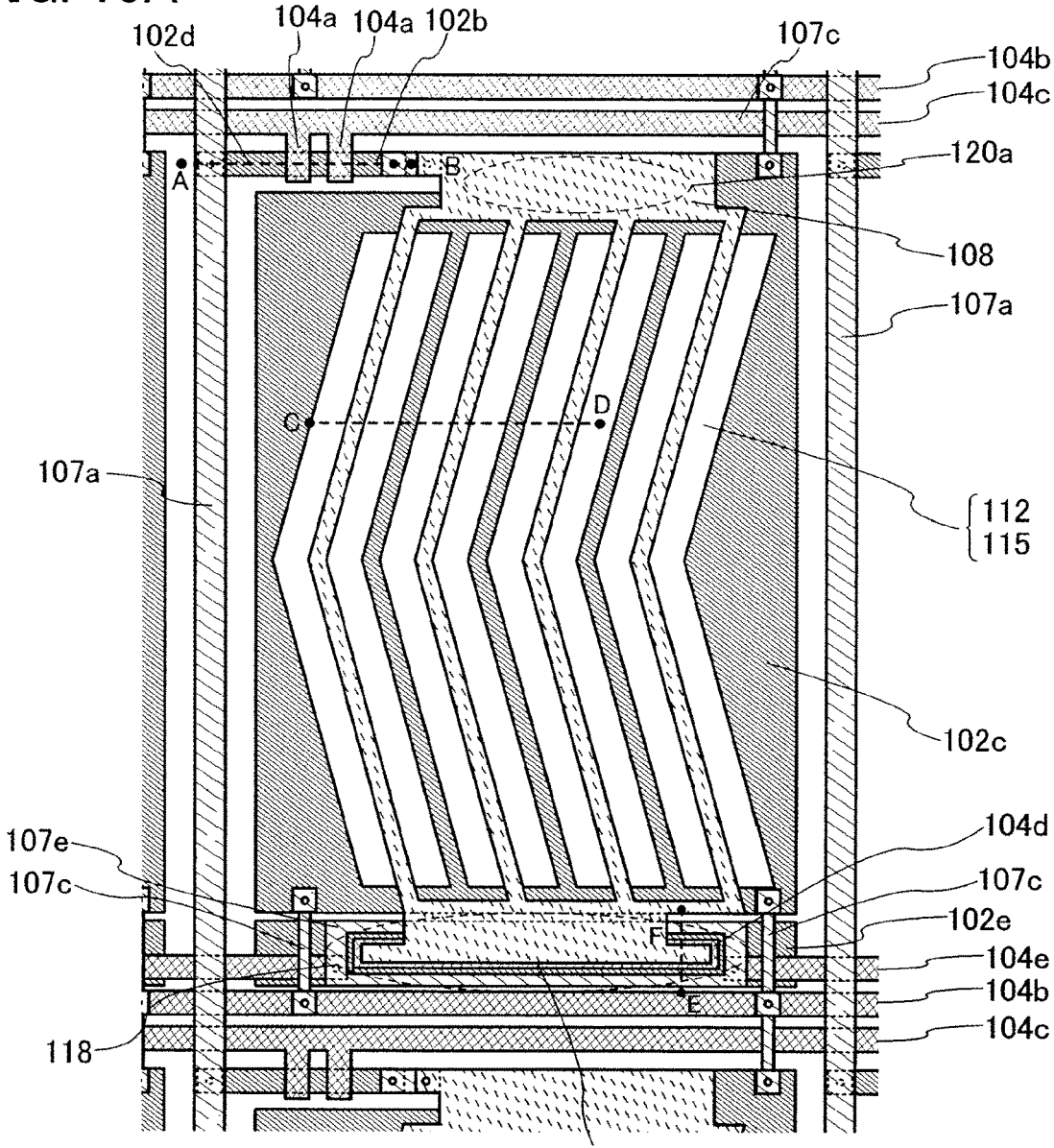
FIG. 15A is a plan view for illustrating a structure of a liquid crystal display device according to Embodiment Mode 8.
Figure 15B:
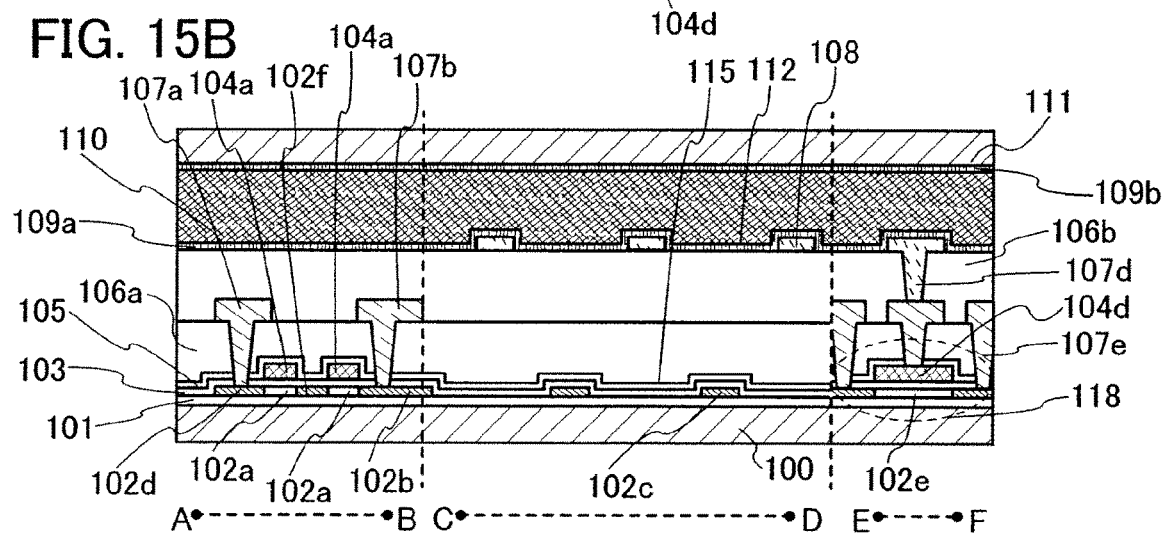
FIG. 15B is a cross-sectional view along lines A-B, C-D, and E-F of FIG. 15A.

FIG. 15A is a plan view illustrating a structure of an IPS mode liquid crystal display device according to Embodiment Mode 8 in the present invention. FIG. 15B is a cross-sectional view along a line A-B, a line C-D, and a line E-F of FIG. 15A. A structure in this embodiment mode is similar to that of the IPS mode liquid crystal display device according to Embodiment Mode 3, except that a capacitor 118 is provided instead of the capacitor 120b, a second auxiliary wiring 104e is formed, and the opening patterns 112 and 115 have substantially V-shapes. Accordingly, the description in Embodiment Mode 3 can be applied to this embodiment mode. Hereinafter, the component similar to that of Embodiment Mode 3 is denoted by the same reference numeral and description thereof is omitted.

The capacitor 118 is connected between the second electrode 108 and the second auxiliary wiring 104e. The capacitor 118 includes the semiconductor film 102e located over the base insulating film 101, the gate insulating film 103 located over the semiconductor film 102e, and a conductive pattern 104d which is formed over the gate insulating film 103 and located above a part of the semiconductor film 102e. The capacitor 118 is located so as not to overlap with the first electrode 102c. The semiconductor film 102e and the conductive pattern 104d are rectangles and are located adjacent to and generally parallel to the auxiliary wiring 104b. The same impurity as in the first electrode 102c is introduced to the semiconductor film 102e except in the region under the conductive pattern 104d.

The contact hole located above the conductive pattern 104d and the contact hole located above the semiconductor film 102e are formed in the first interlayer insulating film 106a. Conductive patterns 107d and 107e are formed over the first interlayer insulating film 106a. The conductive pattern 107d is electrically connected to the conductive pattern 104d through the contact hole, and the conductive pattern 107e is electrically connected to the region of the semiconductor film 102e, in which an impurity is introduced, through the contact hole. The conductive pattern 107d is an elongated rectangle and is located generally parallel to the auxiliary wiring 104b. The conductive pattern 107e has a substantially frame shape and surrounds the conductive pattern 107d.

The contact hole located above the conductive pattern 107d is formed in the second interlayer insulating film 106b. The second electrode 108 is electrically connected to the conductive patterns 107d and 104d through the contact hole.

The second auxiliary wiring 104e is formed over the gate insulating film 103. The second auxiliary wiring 104e is located adjacent to the auxiliary wiring 104b and extended parallel to the auxiliary wiring 104b. A plurality of contact holes located over the second auxiliary wiring 104e are formed in the first interlayer insulating film 106a. The conductive pattern 107e is electrically connected to the second auxiliary wiring 104e through the contact hole.

The second auxiliary wiring 104e is located in the same layer as the conductive pattern 104d but is separated. In a region in which the second auxiliary wiring 104e is separated, the conductive pattern 104d is located. The separated portions of the second auxiliary wiring 104e are electrically connected to each other through the conductive pattern 107e. In the case where an n-type impurity is introduced to the semiconductor film 102e the potential of the second auxiliary wiring 104e is lower than the lowest potential of the source wiring 107a. In the case where a p-type impurity is introduced to the semiconductor film 102e, the potential of the second auxiliary wiring 104e is higher than the highest potential of the source wiring 107a.

In the liquid crystal display device with such a structure, when a driving thin film transistor is turned on, charge is accumulated in a part of the conductive pattern 104e, which is located under the conductive pattern 104d. The capacitor 118 functions in such a manner.

The semiconductor film 102e is formed in the same step as the semiconductor film 102f. The conductive pattern 104d and the second auxiliary wiring 104e are formed in the same step as the auxiliary wiring 104b. In a step of forming the impurity regions 102b and 102d by injecting an impurity into the semiconductor film 102f, the impurity is injected into a region in the semiconductor film 102e which is not covered with the conductive pattern 104d. The conductive patterns 107d and 107e are formed in the same step as the source wiring 107a. In addition, the contact holes formed in the first interlayer insulating film 106a are formed in the same step, and the contact holes formed in the second interlayer insulating film 106b are formed in the same step. Other steps of the manufacturing steps of the liquid crystal display device are similar to those of the liquid crystal display device according to Embodiment Mode 3.

With this embodiment mode, an effect similar to Embodiment Mode 3 can be obtained. In addition, since the capacitor 118 is connected between the second electrode 108 functioning as the pixel electrode and the second auxiliary wiring 104e, the voltage of the second electrode 108 is easily kept when the thin film transistor is turned off. In addition, in the step of forming the impurity regions 102b and 102d by injecting an impurity into the semiconductor film 102f, since the impurity is injected into a region in the semiconductor film 102e, which is not covered with the conductive pattern 104d and the impurity is not required to be injected into a region in the semiconductor film 102e, which is covered with the conductive pattern 104d; the number of manufacturing steps is not necessarily increased.

Note that the capacitor 118 may be provided in Embodiment Mode 1. In that case, an effect similar to this embodiment mode can be obtained.

In embodiment mode, the opening patterns 112 and 115 may have the shape shown in FIGS. 10A and 10B, or 11A and 11B. Alternatively, the opening pattern 112 may have the shape shown in FIGS. 7A and 7B, or 9A and 9B. In this case, the opening pattern 115 has a shape of the opening pattern 112 shown in FIGS. 7A and 7B, or 9A and 9B. Note that the opening patterns 112 and 115 are required to be arranged so that the first electrode 102c and the second electrode 108 are alternately arranged and are generally in parallel except in the periphery portions, when seen from the direction perpendicular to the substrate 100 of the liquid crystal display device.

The impurity region 102b functioning as a drain or a source of the transistor is directly connected to the first electrode 102c. In other words, the semiconductor layer in the transistor and the first electrode 102c are contiguous with each other to form one island. In addition, unlike Embodiment Mode 1, the contact hole located over the impurity region 102b and the contact hole located over the first electrode 102c are not formed in the first interlayer insulating film 106a. Accordingly, the region for the contact holes can be utilized for displaying an image, which leads to improvement in aperture ratio.

If the opening patterns are thus provided to have different orientations, a plurality of regions with different moving directions of liquid crystal molecules can be provided. In other word, a multidomain structure can be realized. When a multidomain structure is employed, it can be prevented that an image cannot be displayed properly if seen from a certain direction. Accordingly, the viewing angle can be improved.

Note that the first electrode 102c has the opening pattern 115 in this embodiment mode. Therefore, in a portion of the opening pattern, the amount of light transmitted therethrough is increased. This is because the first electrode 102 is not provided in that portion. In a portion where the first electrode 102 is provided, the amount of light transmitted therethrough is decreased because the light transmittance is not 100%. On the other hand, in a portion where the first electrode 102 is not provided, light does not attenuate, which leads to increase in amount of light transmitted therethrough. As a result, it is possible to increase luminance and to reduce power consumption.

Note that this embodiment mode shows an example in a case where the description in Embodiment Modes 1 to 7 is partially changed, improved, or transformed. Therefore, the description in Embodiment Modes 1 to 7 can be applied to or combined with this embodiment mode.

In addition, description is made with reference to various drawings. One drawing includes various components. Therefore, another structure can be made by combining components selected from different drawings.

Embodiment Mode 9

Figure 16A:
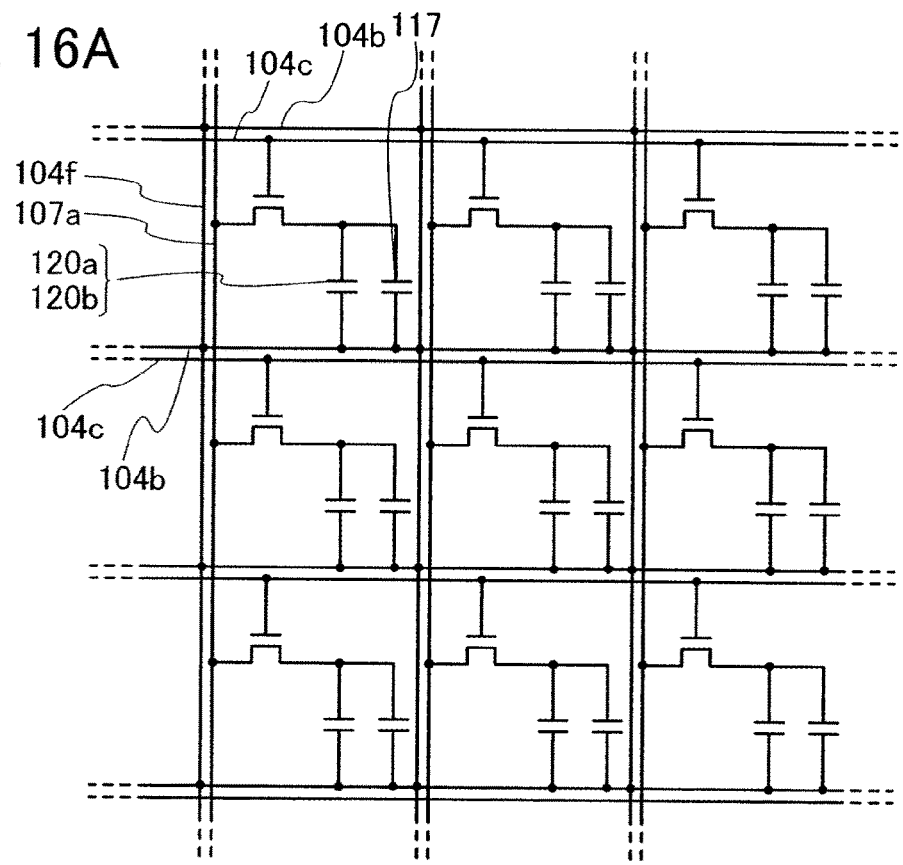
FIG. 16A is a circuit diagram of a liquid crystal display device according to Embodiment Mode 9 and FIG. 16B is a circuit diagram of a liquid crystal display device according to Embodiment Mode 10.

FIG. 16A is a circuit diagram of a liquid crystal display device according to Embodiment Mode 9. In the liquid crystal display device according to this embodiment mode, a plurality of pixels are arranged in matrix. A structure of each pixel is similar to the structure of the liquid crystal display device according to Embodiment Mode 7, except that a second auxiliary wiring 104f extended in a longitudinal direction is formed. The second auxiliary wiring 104f is formed in the same layer as the auxiliary wiring 104b and is electrically connected to the auxiliary wirings 104b at each intersection with the auxiliary wirings 104b.

According to this embodiment mode, an effect similar to Embodiment Mode 7 can be obtained. Further, by provision of the second auxiliary wiring 104f, the potential of the common electrode can be easily held at the same value in all pixels. Note that the liquid crystal display device according to this embodiment mode may be the FFS mode or the IPS mode. Although opening patterns included in the pixel electrode and the common electrode may have a shape similar to those shown in Embodiment Modes 1 to 8, it is not limited thereto.

Note that this embodiment mode shows an example in a case where the description in Embodiment Modes 1 to 8 is partially changed, improved, transformed, or is described from a different perspective. Therefore, the description in Embodiment Modes 1 to 8 can be applied to or combined with this embodiment mode.

In addition, description is made with reference to various drawings. One drawing includes various components. Therefore, another structure can be made by combining components selected from different drawings.

Embodiment Mode 10

Figure 16B:
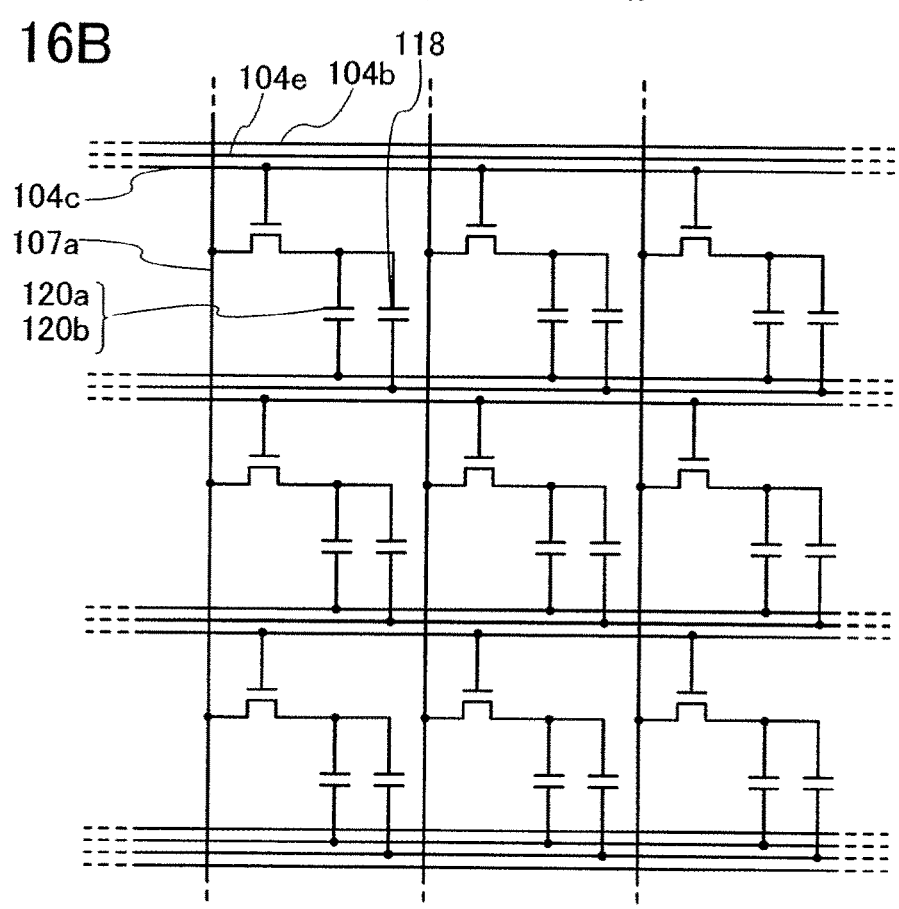

FIG. 16B is a circuit diagram of a liquid crystal display device according to Embodiment Mode 10. In the liquid crystal display device according to this embodiment mode, a plurality of pixels are arranged in matrix. A structure of each pixel is similar to the structure of the liquid crystal display device according to Embodiment Mode 8.

According to this embodiment mode, an effect similar to Embodiment Mode 8 can be obtained. Note that the liquid crystal display device according to this embodiment mode may be the FFS mode or the IPS mode. Although opening patterns included in the pixel electrode and the common electrode may have a shape similar to those shown in Embodiment Modes 1 to 8, it is not limited thereto.

Note that this embodiment mode shows an example in a case where the description in Embodiment Modes 1 to 9 is partially changed, improved, transformed, or is described from a different perspective. Therefore, the description in Embodiment Modes 1 to 9 can be applied to or combined with this embodiment mode.

In addition, description is made with reference to various drawings. One drawing includes various components. Therefore, another structure can be made by combining components selected from different drawings.

Embodiment Mode 11

Figure 17A:
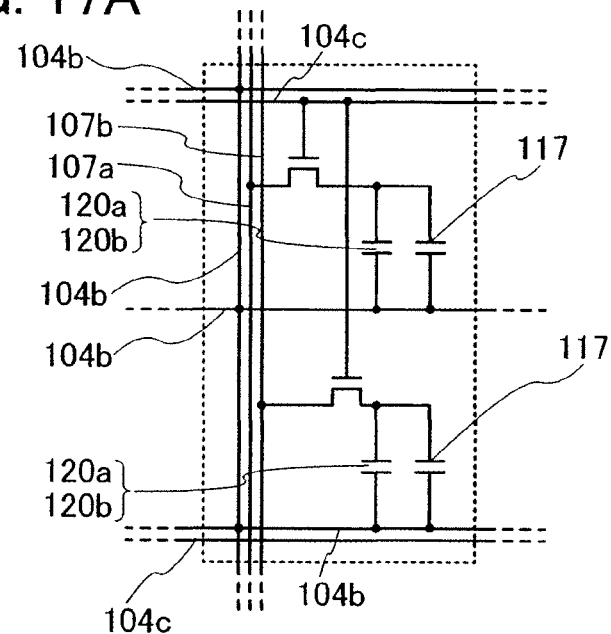
FIG. 17A is a circuit diagram of a liquid crystal display device according to Embodiment Mode 11 and FIG. 17B is a circuit diagram of a liquid crystal display device according to Embodiment Mode 12.

FIG. 17A is a circuit diagram of a liquid crystal display device according to Embodiment Mode 11. The liquid crystal display device according to this embodiment mode is the FFS mode or the IPS mode, and one pixel includes a plurality of (for example, two) subpixels. A structure of each subpixel is similar to any of the structures of the pixel shown in Embodiment Modes 1 to 10. Therefore, the description in Embodiment Modes 1 to 10 can be applied to this embodiment mode. FIG. 17A shows an example where the pixel has a structure similar to that shown in Embodiment Mode 7. Hereinafter, the component similar to that of Embodiment Mode 7 is denoted by the same reference numeral and description thereof is omitted.

A plurality of subpixels forming one pixel are electrically connected to the same gate wiring 104c and are electrically connected to the different auxiliary wirings 104b from each other.

According to this embodiment mode, an effect similar to the liquid crystal display device shown in Embodiment Modes 1 to 10 can be obtained. Furthermore, since one pixel includes a plurality of subpixels, a viewing angle can be further increased. Effects in which the pixel can have redundancy and area gray scale display can be realized can be obtained as well.

Note that this embodiment mode shows an example in a case where the description in Embodiment Modes 1 to 10 is partially changed, improved, transformed, or is described from a different perspective. Therefore, the description in Embodiment Modes 1 to 10 can be applied to or combined with this embodiment mode.

In addition, description is made with reference to various drawings. One drawing includes various components. Therefore, another structure can be made by combining components selected from different drawings.

Embodiment Mode 12

Figure 17B:
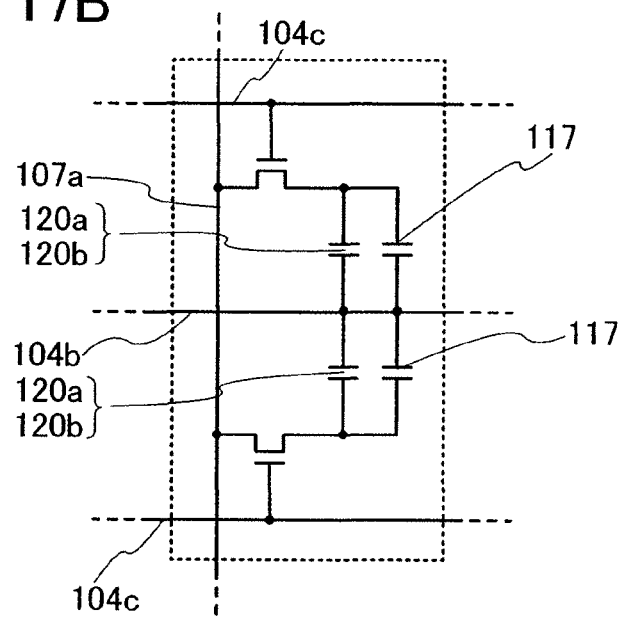

FIG. 17B is a circuit diagram of a liquid crystal display device according to Embodiment Mode 12. The liquid crystal display device according to this embodiment mode is the FFS mode or the IPS mode. A structure is similar to that of Embodiment Mode 11, except that a plurality of subpixels forming one pixel are electrically connected to the different gate wirings 104c from each other and are electrically connected to the same auxiliary wiring 104b. A structure of each of subpixels is similar to any of the structures of the pixel shown in Embodiment Modes 1 to 10. Therefore, the description in Embodiment Modes 1 to 10 can be applied to this embodiment mode. FIG. 17B shows an example where the pixel has a structure similar to that shown in Embodiment Mode 7. Hereinafter, the component similar to that of Embodiment Mode 7 is denoted by the same reference numeral and description thereof is omitted. According to this embodiment mode, an effect similar to Embodiment Mode 11 can be obtained.

Note that this embodiment mode shows an example in a case where the description in Embodiment Modes 1 to 11 is partially changed, improved, transformed, or is described from a different perspective. Therefore, the description in Embodiment Modes 1 to 11 can be applied to or combined with this embodiment mode.

In addition, description is made with reference to various drawings. One drawing includes various components. Therefore, another structure can be made by combining components selected from different drawings.

Embodiment Mode 13

Figure 18A:
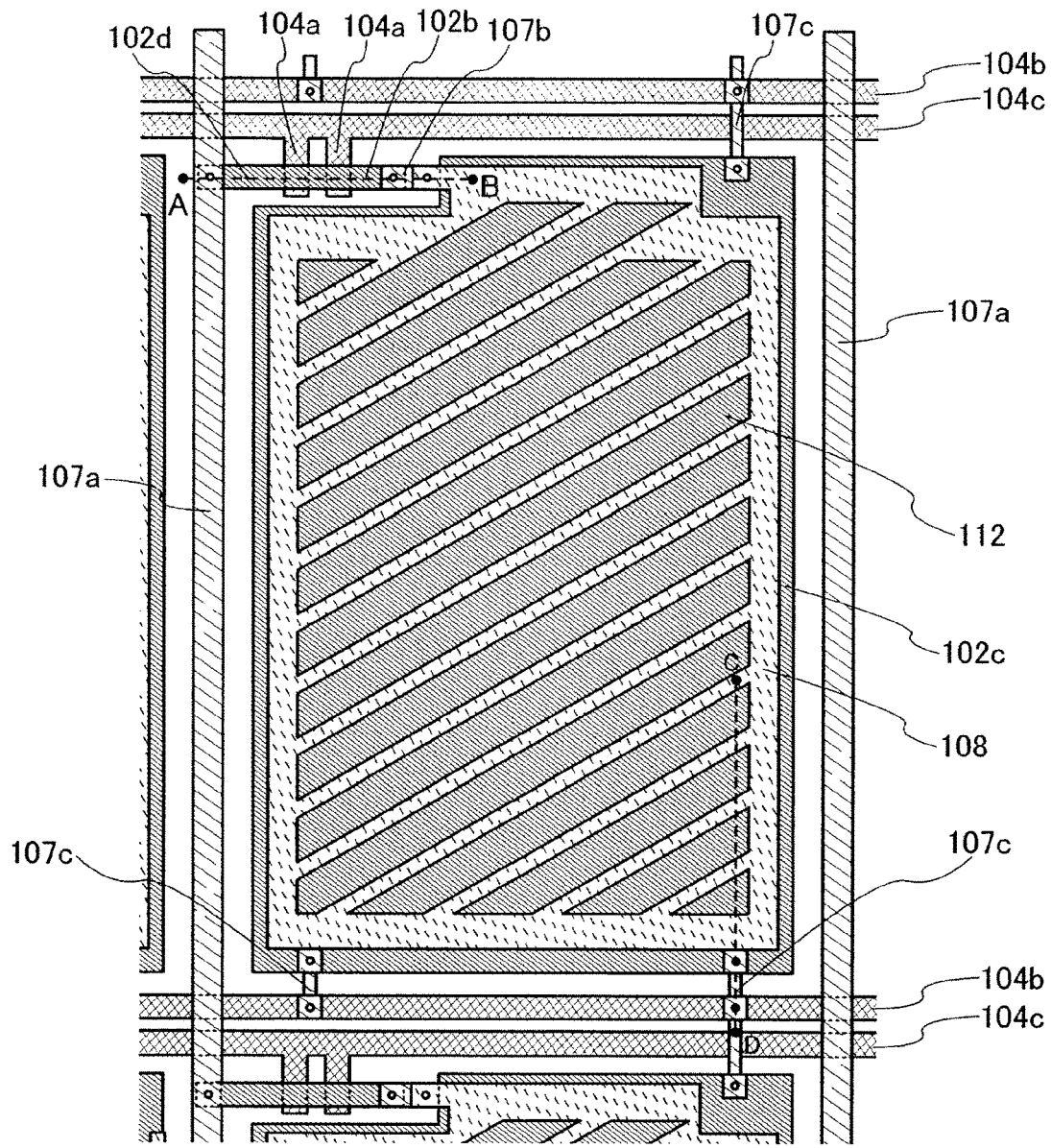
FIG. 18A is a plan view for illustrating a structure of a liquid crystal display device according to Embodiment Mode 13.
Figure 18B:
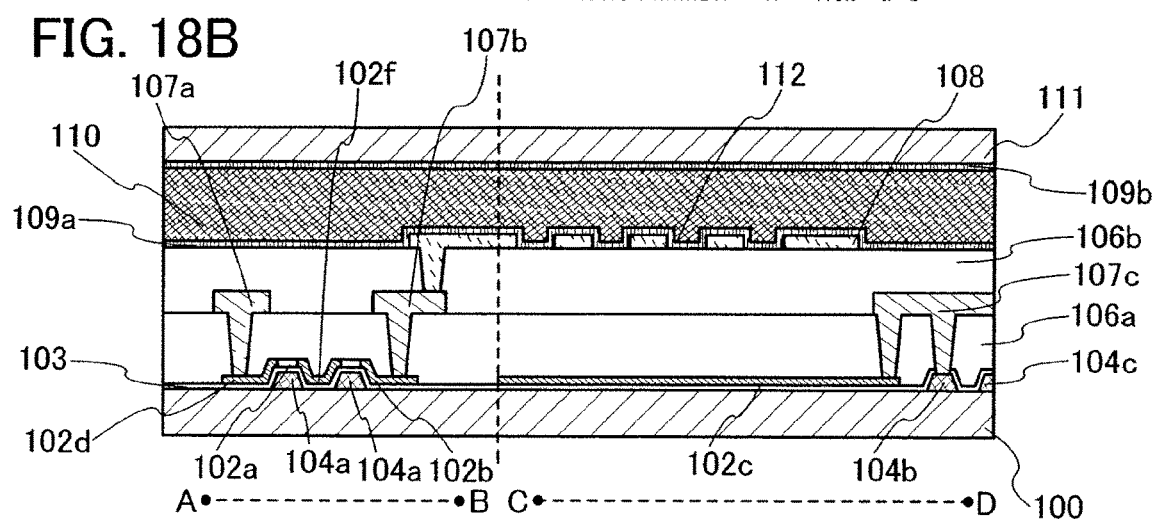
FIG. 18B is a cross-sectional view along lines A-B and C-D of FIG. 18A.

FIG. 18A is a plan view illustrating a structure of a liquid crystal display device according to Embodiment Mode 13 in the present invention. FIG. 18B is a cross-sectional view along a line A-B and a line C-D of FIG. 18A. A structure of this embodiment mode is similar to that of Embodiment Mode 1, except that a transistor for driving a pixel is a bottom gate transistor and the base insulating film 101 is not formed. That is, the liquid crystal display device in this embodiment mode is the FFS mode. Therefore, the description in Embodiment Mode 1 can be applied to this embodiment mode. Hereinafter, the component similar to that of Embodiment Mode 1 is denoted by the same reference numeral and description thereof is omitted.

In this embodiment mode, the gate electrode 104a, the auxiliary wiring 104b, and the gate wiring 104c are formed over the substrate 100. The gate insulating film 103 is formed over the substrate 100, the gate electrode 104a, the auxiliary wiring 104b, and the gate wiring 104c. The semiconductor film 102f and the first electrode 102c are formed over the gate insulating film 103.

A manufacturing method of the liquid crystal display device according to this embodiment mode is as follows. First, a conductive film is formed over the substrate 100 and is selectively etched. Therefore, the two gate electrodes 104a, the auxiliary wiring 104b, and the gate wiring 104c are formed over the substrate 100. Note that as the conductive film, a film formed of aluminum (Al), nickel (Ni), tungsten (W), molybdenum (Mo), titanium (Ti), tantalum (Ta), neodymium (Nd), platinum (Pt), gold (Au), silver (Ag), or the like; a film formed of an alloy thereof; or a stacked-layer film thereof can be used. Alternatively, silicon (Si) in which an n-type impurity is introduced may be used. Next, the gate insulating film 103 is formed.

Next, a polysilicon film is formed over the gate insulating film 103, and a resist pattern is formed over the polysilicon film. Next, the polysilicon film is etched with use of the resist pattern as a mask. In this manner, the semiconductor film 102f and the first electrode 102c are formed in the same step. Thereafter, the resist pattern is removed.

Next, a mask pattern is formed over the semiconductor film 102f, and an impurity is injected into the semiconductor film 102f with use of the mask pattern as a mask. Therefore, the impurity regions 102b and 102d and an impurity region between the gate electrodes 104a are formed. Note that by this treatment, the impurity is also injected into the first electrode 102c. In a case where the substrate 100 is formed using a light-transmitting material such as glass, a mask may be formed by light exposure from a rear face of the substrate 100 with use of the gate wiring as a light exposure pattern, without using a light exposure mask. In this case, the number of steps can be reduced since a light exposure mask is not used, so that manufacturing cost can be reduced. Further, there is an advantage in that a mask pattern can be formed in a self-aligned manner, so that deviation of a mask pattern is reduced and the deviation is not required to be considered. Subsequent steps are similar to those in Embodiment Mode 1.

According to this embodiment mode, an effect similar to Embodiment Mode 1 can be obtained. Note that in the FFS mode liquid crystal display device shown in Embodiment Mode 2 or 5, the transistor for driving a pixel may be a bottom gate transistor having a structure similar to this embodiment mode. Further, in the IPS mode liquid crystal display device shown in any one of Embodiment Modes 3, 4, and 6 to 12, the transistor for driving a pixel may be a bottom gate transistor having a structure similar to this embodiment mode. In this manner, in any of the aforementioned FFS mode liquid crystal display devices and IPS mode liquid crystal display devices, the bottom gate transistor can be adopted.

In the liquid crystal display device according to this embodiment mode, or in the liquid crystal display device in any of Embodiment Modes 1 to 12, of which transistor for driving the pixel is a bottom gate transistor having a structure similar to this embodiment mode, the gate insulating layer 103 over the substrate 100 may be removed except in a portion around the gate electrode 104a before the polysilicon film is formed over the gate insulating layer 103. In this case, the first electrode 102c is formed directly on the substrate 100.

Note that this embodiment mode shows an example in a case where the description in Embodiment Modes 1 to 12 is partially changed, improved, transformed, or is described from a different perspective. Therefore, the description in Embodiment Modes 1 to 12 can be applied to or combined with this embodiment mode.

In addition, description is made with reference to various drawings. One drawing includes various components. Therefore, another structure can be made by combining components selected from different drawings.

Embodiment Mode 14

Figure 19A:
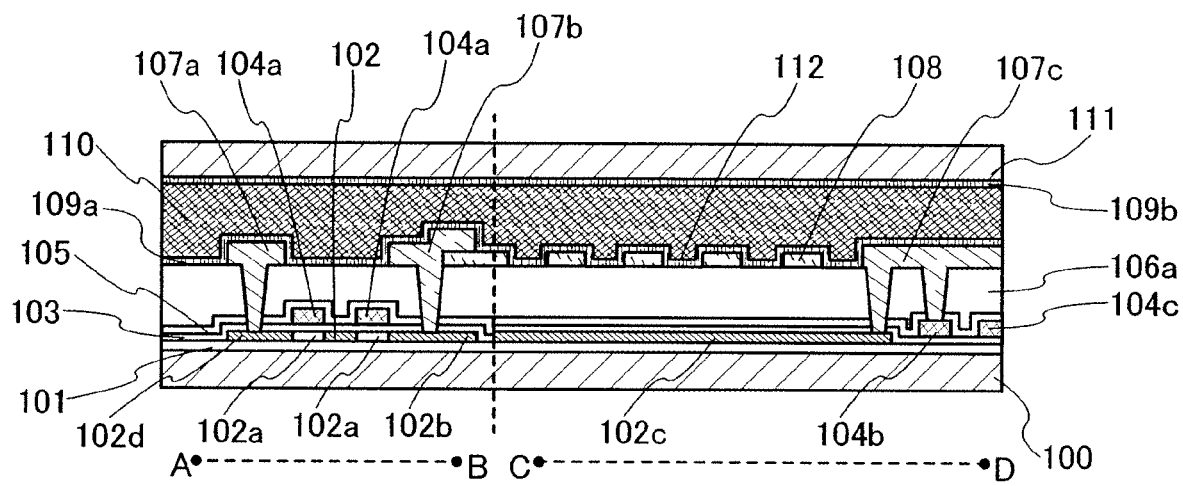
FIG. 19A is a cross-sectional view for illustrating a structure of a liquid crystal display device according to Embodiment Mode 14.

FIG. 19A is a cross-sectional view illustrating a structure of a liquid crystal display device according to Embodiment Mode 14 in the present invention. The cross-sectional view corresponds to a cross section A-B and a cross section C-D of FIGS. 12A and 12B. A structure of this embodiment mode is similar to that of the FFS mode liquid crystal display device in Embodiment Mode 5, except that all parts of the second electrode 108 are provided over the first interlayer insulating film 106a and a part of the drain wiring 107b is provided over the second electrode 108. In this embodiment mode, the drain wiring 107b is formed after the second electrode 108 is formed. Breakage of the second electrode 108 can be prevented by such a structure. That is, if the second electrode 108 is formed over the drain wiring 107b as shown in Embodiment Mode 5, the drain wiring 107b is often made thicker than the second electrode 108, so that breakage of the second electrode 108 might be caused at an end portion of the drain wiring 107b. On the other hand, when the second electrode 108 is formed under the drain wiring 107b as shown in this embodiment mode, the breakage of the second electrode 108 can be prevented. Note that since the drain wiring 107b is often formed to be thick, breakage of the drain wiring 107b is unlikely to be caused.

In addition, a manufacturing method of the liquid crystal display device according to this embodiment mode is generally similar to that of Embodiment Mode 5. Therefore, the description in Embodiment mode 5 can be applied to this embodiment mode. Hereinafter, a component same as Embodiment Mode 5 is denoted by the same reference numeral and description thereof is omitted. Note that although the opening pattern 112 included in the second electrode 108 can have a shape shown in any of Embodiment Modes 1 to 4 and 7, it is not limited thereto.

According to this embodiment mode, an effect similar to Embodiment Mode 5 can be obtained. Note that an opening pattern parallel to the opening pattern 112 included in the second electrode 108 may be formed in the first electrode 102c, so that the IPS mode liquid crystal display device can be realized. The opening pattern can have a shape shown in any of Embodiment Modes 1 to 4 and 7. Note that the opening pattern in the first electrode 102c and the opening pattern 112 are required to be arranged so that the first electrode 102c and the second electrode 108 are alternately arranged and generally in parallel except in the peripheral portions when seen from the direction perpendicular to the substrate 100 of the liquid crystal display device.

Note that this embodiment mode shows an example in a case where the description in Embodiment Modes 1 to 13 is partially changed, improved, transformed, or is described from a different perspective. Therefore, the description in Embodiment Modes 1 to 13 can be applied to or combined with this embodiment mode.

In addition, description is made with reference to various drawings. One drawing includes various components. Therefore, another structure can be made by combining components selected from different drawings.

Embodiment Mode 15

Figure 19B:
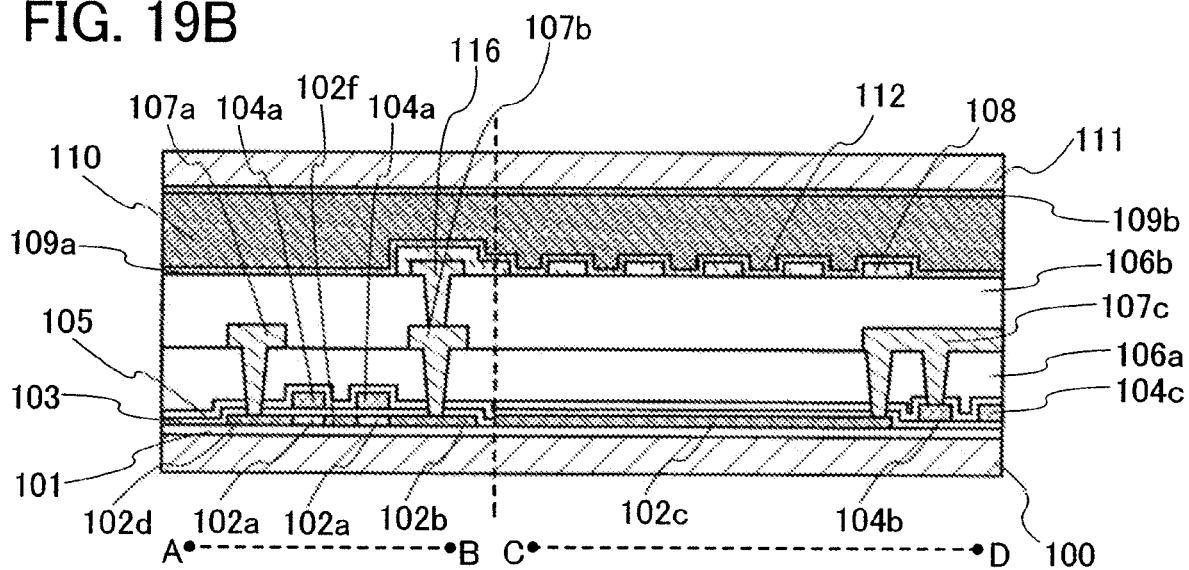
FIG. 19B is a cross-sectional view for illustrating a structure of a liquid crystal display device according to Embodiment Mode 15.

FIG. 19B is a cross-sectional view illustrating a structure of a liquid crystal display device according to Embodiment Mode 15 in the present invention. The cross-sectional view corresponds to a cross section A-B and a cross section C-D of FIGS. 7A and 7B. A structure of this embodiment mode is similar to that of the FFS mode liquid crystal display device in Embodiment Mode 1, except that a second drain wiring 116 is formed over the second interlayer insulating film 106*b* and the second electrode 108 is formed so as to cover the second drain wiring 116. Note that the second electrode 108 may partially overlap the second drain wiring 116. In addition, a manufacturing method of the liquid crystal display device according to this embodiment mode is generally similar to that of Embodiment Mode 1. Therefore, the description in Embodiment mode 1 can be applied to this embodiment mode. Hereinafter, a component same as Embodiment Mode 1 is denoted by the same reference numeral and description thereof is omitted. Note that although the opening pattern 112 included in the second electrode 108 can have a shape shown in any of Embodiment Modes 1 to 4 and 7, it is not limited thereto.

According to this embodiment mode, an effect similar to Embodiment Mode 1 can be obtained. Note that the opening pattern parallel to the opening pattern 112 included in the second electrode 108 may be formed in the first electrode 102*c*, so that the IPS mode liquid crystal display device can be realized. The opening pattern can have a shape shown in any of Embodiment Modes 1 to 4 and 7. Note that the opening pattern in the first electrode 102*c* and the opening pattern 112 are required to be arranged so that the first electrode 102*c* and the second electrode 108 are alternately arranged and generally in parallel except in the peripheral portions when seen from the direction perpendicular to the substrate 100 of the liquid crystal display device.

Note that this embodiment mode shows an example in a case where the description in Embodiment Modes 1 to 14 is partially changed, improved, transformed, or is described from a different perspective. Therefore, the description in Embodiment Modes 1 to 14 can be applied to or combined with this embodiment mode.

In addition, description is made with reference to various drawings. One drawing includes various components. Therefore, another structure can be made by combining components selected from different drawings.

Embodiment Mode 16

Figure 20:
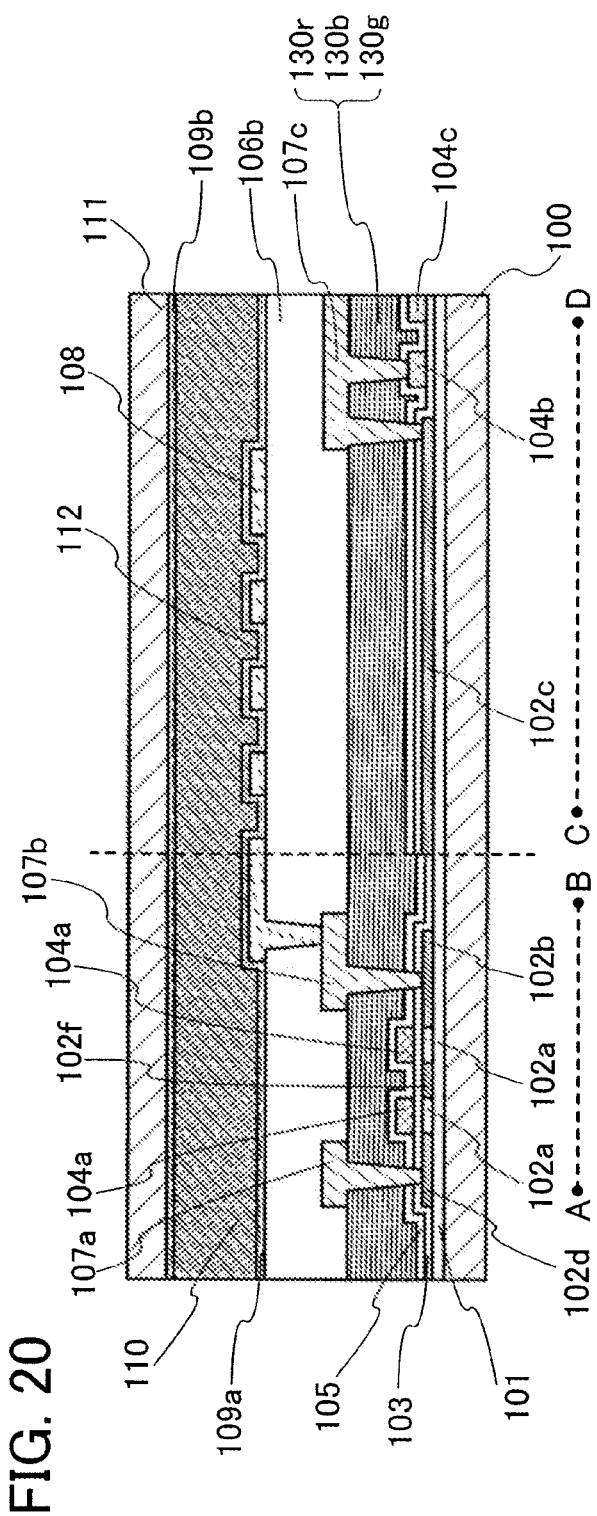
FIG. 20 is a cross-sectional view for illustrating a structure of a liquid crystal display device according to Embodiment Mode 16.

FIG. 20 is a cross-sectional view illustrating a structure of a pixel portion in an FFS mode liquid crystal display device according to Embodiment Mode 16 in the present invention. A structure of the pixel portion of the liquid crystal display device according to this embodiment mode is generally similar to that of the liquid crystal display device in Embodiment Mode 1, except that a red color filter 130*r*, a green color filter 130*g*, and a blue color filter 130*b* are provided instead of the first interlayer insulating film 106*a*. Therefore, the description in Embodiment mode 1 can be applied to this embodiment mode. Hereinafter, the component similar to that of Embodiment Mode 1 is denoted by the same reference numeral and description thereof is omitted. Note that since the insulating film 105 is provided between the semiconductor film 102*f* and the color filters 130*r*, 130*g*, and 130*b*, it also functions to suppress diffusion of impurities from each color filter to the semiconductor film 102*f*.

A manufacturing method of the liquid crystal display device according to this embodiment mode is similar to that of Embodiment Mode 1, except that a step of forming the color filters 130*r*, 130*g*, and 130*b* is added instead of a step of forming the first interlayer insulating film 106*a*. The color filters 130*r*, 130*g*, and 130*b* are formed by repeating the following steps three times: a step of forming a color filter layer, a step of forming a resist pattern over the color filter layer, and a step of selectively dry-etching the color filter layer with use of the resist pattern as a mask. Note that the second interlayer insulating film 106*b* is embedded in a space which is generated between color filters. Alternatively, the color filters 130*r*, 130*g*, and 130*b* can be formed by using a droplet discharging method (such as an ink-jet method).

Accordingly, the number of manufacturing steps can be reduced. Further, since the color filter is provided on the substrate 100 side, reduction in an aperture ratio can be suppressed even when misalignment with the opposite substrate is caused, as compared with a case where a color filter is provided on the opposite substrate side. That is, a margin for the misalignment of the opposite substrate is increased.

Note that colors of the color filter may be a color other than red, blue, and green; or may be more than three colors, for example, four colors or six colors. For example, yellow, cyan, magenta, or white may be added. Further, a black matrix (also called a black mask) may be provided in addition to the color filters.

Figure 21A:
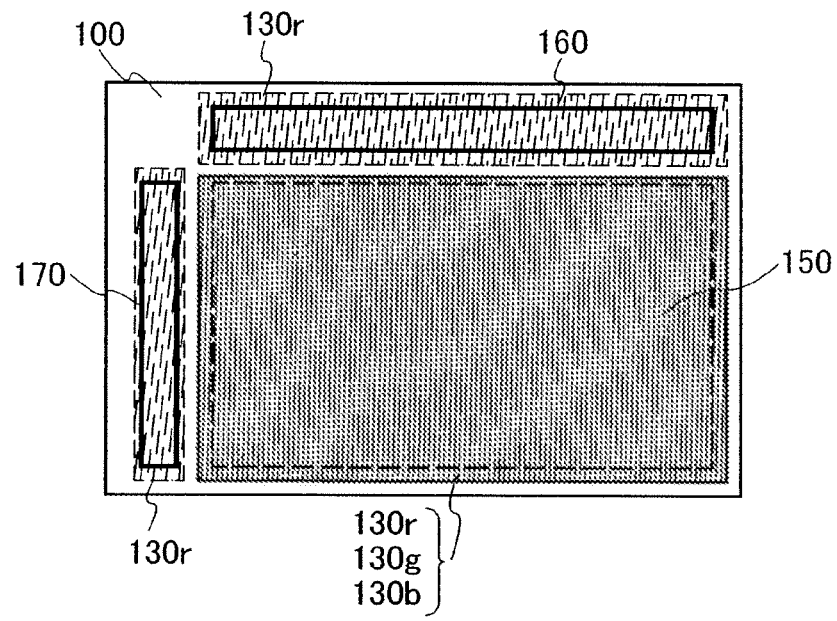
FIG. 21A is a plan view of a liquid crystal display device shown in FIGS. 20 and 21B is an enlarged view of a pixel portion of FIG. 21A.

FIG. 21A is a plan view of the liquid crystal display device shown in FIG. 20. As shown in FIG. 21A, in the liquid crystal display device, a source line driver circuit 160 and a gate line driver circuit 170, which are peripheral driver circuits, are provided in the periphery of a pixel portion 150. The red color filter 130*r* is provided over each of the source line driver circuit 160 and the gate line driver circuit 170. By provision of the red color filter 130*r*, light degradation of an active layer in a thin film transistor included in the source line driver circuit 160 and the gate line driver circuit 170 is prevented, and planarization is realized.

Figure 21B:
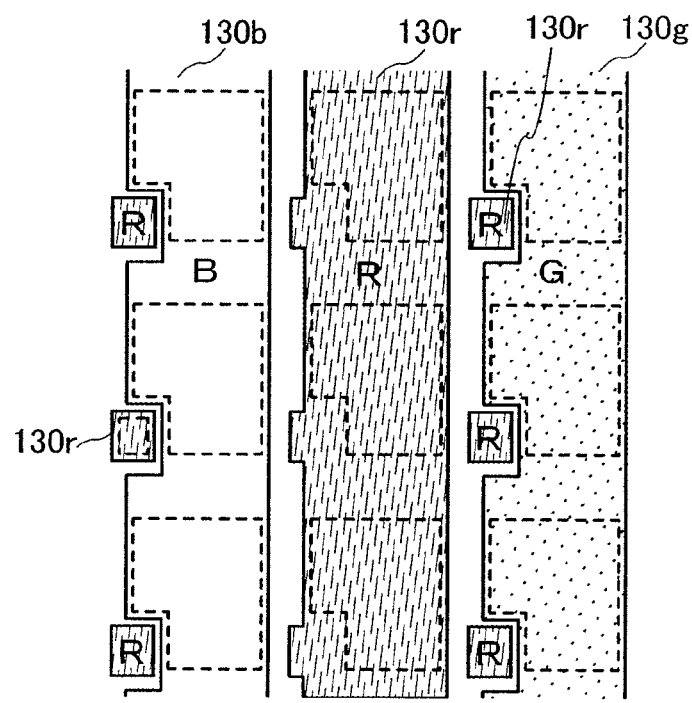

FIG. 21B is an enlarged view of a part of the pixel portion 150 (three rows×three columns) in FIG. 21A. In the pixel portion 150, the red color filter 130*r*, the blue color filter 130*b*, and the green color filter 130*g* are alternately arranged in stripes. Further, the red color filter 130*r* is provided over a thin film transistor included in each pixel.

Since a source wiring (not shown) and a gate wiring (not shown) are arranged so as to overlap with the space between each color filter, light leakage is suppressed.

Since the color filter 130*r* functions as a black mask in this manner, a step of forming a black mask, which is conventionally required, can be omitted.

As described above, according to this embodiment mode, an effect similar to Embodiment Mode 1 can be obtained. Further, since the color filters 130*r*, 130*b*, and 130*g* are provided instead of the first interlayer insulating film 106*a*, the number of manufacturing steps of the liquid crystal display device can be reduced. Moreover, reduction in an aperture ratio can be suppressed even when misalignment with the opposite substrate is caused, as compared with a case where the color filter is provided on the opposite substrate side. That is, a margin for the misalignment of the opposite substrate is increased.

Note that in the FFS mode or the IPS mode liquid crystal display devices shown in Embodiment Modes 2 to 4, 6 to 13, and 15, the color filters 130*r*, 130*b*, and 130*g* may be provided instead of the first interlayer insulating film 106*a* similar to this embodiment mode. In this case, an effect similar to this embodiment mode can be obtained.

Note that although a color filter may be provided between the gate electrode and the source wiring, it is not limited thereto. The color filter may be provided between the source wiring and the second electrode 108.

Further, a black matrix may be provided in addition to a color filter.

Note that an insulating film of an inorganic material may be provided between the color filter and the source wiring, or between the color filter and the second electrode 108. The inorganic material is formed of an insulating substance containing oxygen or nitride, such as silicon oxide ($SiO_x$), silicon nitride ($SiN_x$), silicon oxynitride ($SiO_xN_y$:x>y), or silicon nitride oxide ($SiN_xO_y$:x>y). In order to block intrusion of impurities, a material containing a large amount of nitrogen is preferably employed.

Note that this embodiment mode shows an example in a case where the description in Embodiment Modes 1 to 15 is partially changed, improved, transformed, or is described from a different perspective. Therefore, the description in Embodiment Modes 1 to 15 can be applied to or combined with this embodiment mode.

In addition, description is made with reference to various drawings. One drawing includes various components. Therefore, another structure can be made by combining components selected from different drawings.

Embodiment Mode 17

Figure 22A:
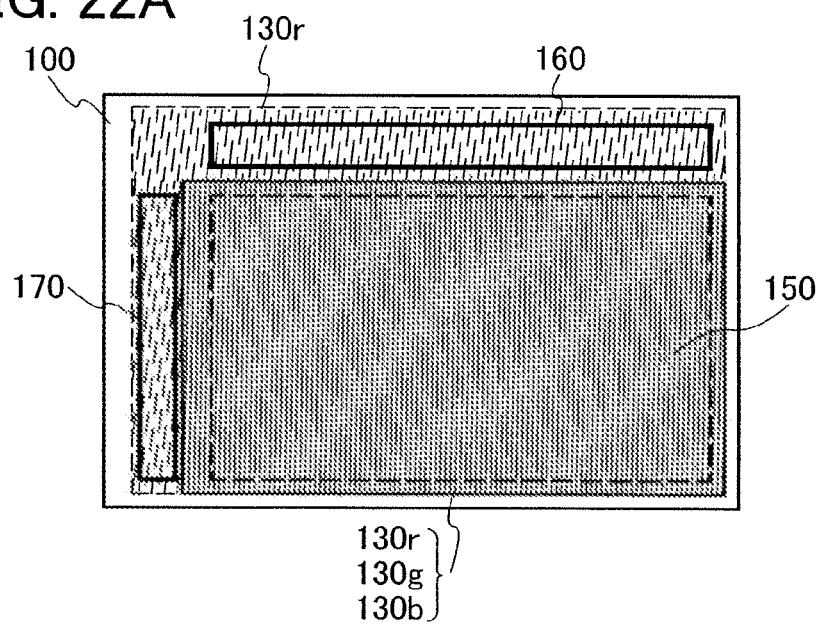
FIG. 22A is a plan view of a liquid crystal display device according to Embodiment Mode 17 and FIG. 22B is an enlarged view of a pixel portion of FIG. 22A.
Figure 22B:
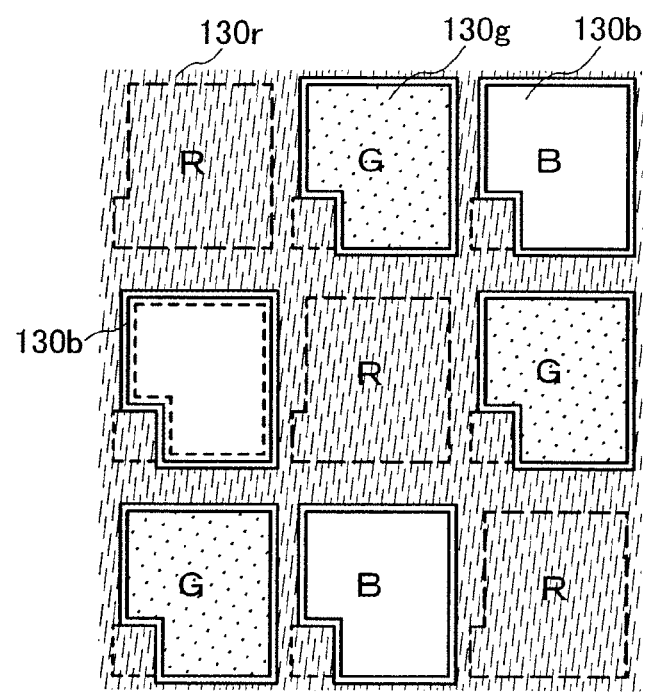

FIG. 22A is a plan view illustrating a structure of an FFS mode liquid crystal display device according to Embodiment Mode 17 in the present invention. FIG. 22B is an enlarged view illustrating a structure of a pixel portion in FIG. 22A. A structure of the liquid crystal display device according to this embodiment mode is similar to that of Embodiment Mode 16, except for the layout of the color filters 130*r*, 130*b*, and 130*g*. Therefore, the description in Embodiment mode 16 can be applied to this embodiment mode. Hereinafter, the component similar to that of Embodiment Mode 16 is denoted by the same reference numeral and description thereof is omitted.

In this embodiment mode, the pixels provided with the color filter 130*r*, 130*b*, or 130*g* are arranged in matrix so that the color filters 130*r*, 130*b*, and 130*g* are alternately arranged. Specifically, the red color filter 130*r* is provided so as to fill a gap between the blue color filter 130*b* and the green color filter 130*g*. Further, the red color filter 130*r* is also provided over the source line driver circuit 160 and the gate line driver circuit 170, which are peripheral driver circuits; and provided in spaces between the pixel portion 150 and each of the source line driver circuit 160 and the gate line driver circuit 170. Therefore, generation of a space between color filters is suppressed.

According to this embodiment mode, an effect similar to Embodiment Mode 16 can be obtained. Note that after the first interlayer insulating film 106*a* is formed, the color filters 130*r*, 130*b*, and 130*g* may be provided instead of the second interlayer insulating film 106*b*. In this case, an effect similar to this embodiment mode can be obtained.

Note that in the FFS mode or the IPS mode liquid crystal display devices shown in Embodiment Modes 2 to 4, 6 to 13, and 15, the color filters 130*r*, 130*b*, and 130*g* may be provided instead of the first interlayer insulating film 106*a* similar to this embodiment mode. In this case, an effect similar to this embodiment mode cart be obtained.

Note that this embodiment mode shows an example in a case where the description in Embodiment Modes 1 to 16 is partially changed, improved, transformed, or is described from a different perspective. Therefore, the description in Embodiment Modes 1 to 16 can be applied to or combined with this embodiment mode.

In addition, description is made with reference to various drawings. One drawing includes various components. Therefore, another structure can be made by combining components selected from different drawings.

Embodiment Mode 18

Figure 23:
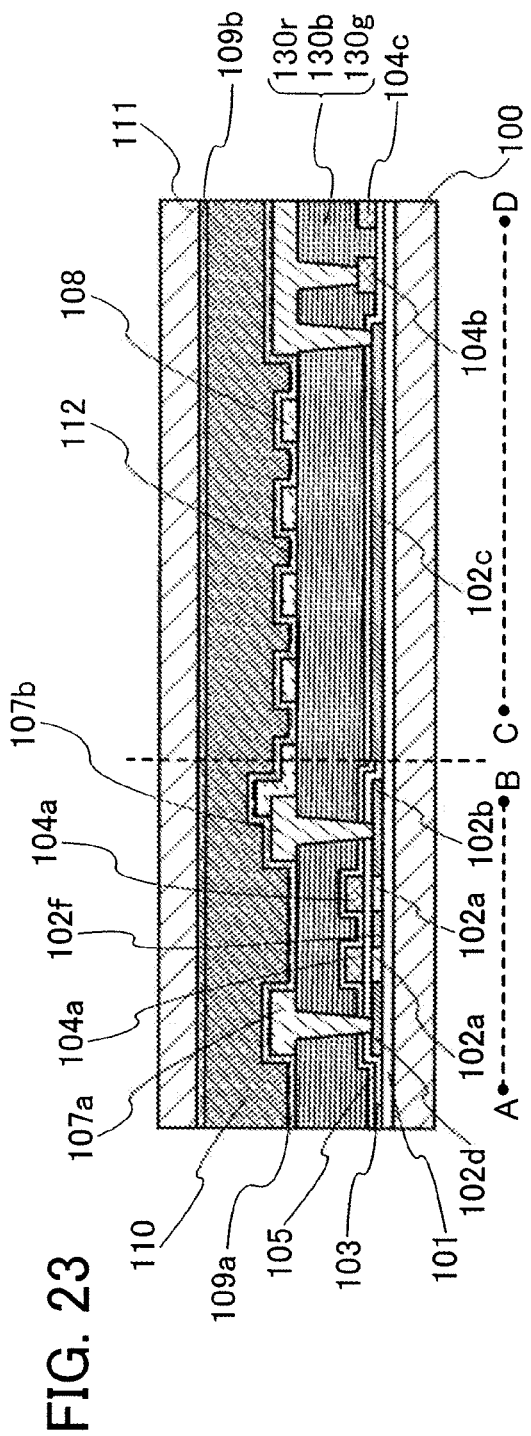
FIG. 23 is a cross-sectional view for illustrating a structure of a liquid crystal display device according to Embodiment Mode 18.

FIG. 23 is a cross-sectional view illustrating a structure of an FFS mode liquid crystal display device according to Embodiment Mode 18 in the present invention. A structure of the liquid crystal display device according to this embodiment mode is similar to that in Embodiment Mode 5, except that the color filters 130*r*, 130*b*, and 130*g* are provided instead of the first interlayer insulating film 106*a*. The layout of the color filters 130*r*, 130*b*, and 130*g* in this embodiment mode is similar to that of Embodiment Mode 17. Therefore, the description in Embodiment modes 5 and 17 can be applied to this embodiment mode. Hereinafter, the component similar to that of Embodiment Modes 5 and 17 is denoted by the same reference numeral and description thereof is omitted.

According to this embodiment mode, an effect similar to Embodiment Mode 17 can be obtained. Note that in the FFS mode liquid crystal display devices shown in Embodiment Mode 14, the color filters 130*r*, 130*b*, and 130*g* may be provided instead of the first interlayer insulating film 106*a* similar to this embodiment mode. In this case, an effect similar to this embodiment mode can be obtained.

Note that the layout of the color filters 130*r*, 130*b*, and 130*g* is not limited to those shown in Embodiment Modes 16 to 18, and various layouts such as a triangle mosaic arrangement, an RGBG four pixel arrangement, or an RGBW four pixel arrangement may be employed. In these cases, the red color filter 130*r* is preferably provided above an active layer of a thin film transistor.

Note that this embodiment mode shows an example in a case where the description in Embodiment Modes 1 to 17 is partially changed, improved, transformed, or is described from a different perspective. Therefore, the description in Embodiment Modes 1 to 17 can be applied to or combined with this embodiment mode.

In addition, description is made with reference to various drawings. One drawing includes various components. Therefore, another structure can be made by combining components selected from different drawings.

Embodiment Mode 19

Each of FIGS. 24A to 24D is a plan view illustrating a structure of an electrode of an FFS mode liquid crystal display device according to Embodiment Mode 19 in the present invention. Since a structure shown in each drawing is similar to the FFS mode liquid crystal display device according to Embodiment Mode 1, except for a shape of the second electrode 108, components other than the first electrode 102*c* and the second electrode 108 are not shown in the drawing.

In FIG. 24A, the second electrode 108 has a comb shape. A space between each comb-tooth functions as the opening pattern 112 shown in Embodiment Mode 1.

In FIG. 24B, the second electrode 108 has a shape in which a plurality of electrodes each having a shape along a circumference of a circle, of which radius is different from each other, are arranged in a concentric pattern and is connected to each other. A space between each electrode functions as the opening pattern 112 shown in Embodiment Mode 1.

In FIG. 24C, the second electrode 108 has a shape in which a plurality of linear electrodes extended in a long side direction of the rectangular first electrode 102*c* are arranged over the first electrode 102*c* so as not to overlap with each other; and each of the linear electrodes has its upper portion connected to an upper portion of an adjacent linear electrode and its lower end portion connected to an lower end portion of the other adjacent linear electrode. That is, the second electrode 108 has a shape in which an elongated electrode is led up and down repeatedly over the first electrode 102c, and its one end portion is arranged nearest to one long side of the first electrode 102c (in FIG. 24C, a long side on the right side) and is connected nowhere. Further, a space between each linear electrode functions as the opening pattern 112 shown in Embodiment Mode 1.

In FIG. 24D, the second electrode 108 has a shape in which in the second electrode 108 shown in FIG. 24C, the end portion nearest to one long side of the first electrode 102c (in FIG. 24C, the long side on the right side) is further extended and led along a short side of the first electrode 102c (in FIG. 24D, a short side on the upper side), and connected to a portion nearest to the other long side of the first electrode 102c (in FIG. 24C, the long side on the left side). Since both the end portions of the second electrode 108 are connected to each other, a potential of the second electrode 108 can be easily kept constant as compared with the shape shown in FIG. 24C.

A manufacturing method of the liquid crystal display device according to this embodiment mode is generally similar to that of Embodiment Mode 1 in each case. Therefore, the description in Embodiment mode 1 can be applied to this embodiment mode.

According to this embodiment mode, an effect similar to Embodiment Mode 1 can be obtained. Note that in Embodiment Modes 2, 5, and 13 to 18, the second electrode 108 may have a shape shown in any of FIGS. 24A to 24D.

Note that this embodiment mode shows an example in a case where the description in Embodiment Modes 1 to 18 is partially changed, improved, transformed, or is described from a different perspective. Therefore, the description in Embodiment Modes 1 to 18 can be applied to or combined with this embodiment mode.

In addition, description is made with reference to various drawings. One drawing includes various components. Therefore, another structure can be made by combining components selected from different drawings.

Embodiment Mode 20

Each of FIGS. 25A to 25D is a plan view illustrating a structure of an electrode of an IPS mode liquid crystal display device according to Embodiment Mode 20 in the present invention. Since a structure of this embodiment mode is similar to that of Embodiment Mode 3, except for the shape of the first electrode 102c and the second electrode 108, components other than the first electrode 102c and the second electrode 108 are not shown in the drawing.

Figure 25A:
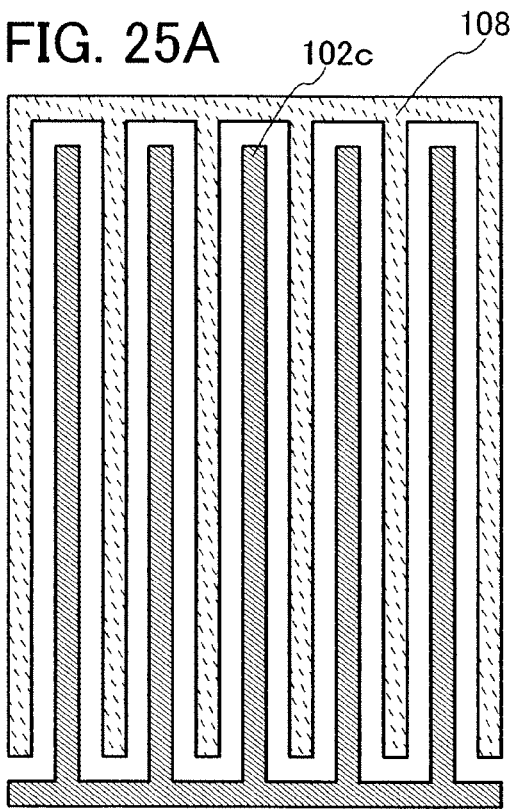
FIGS. 25A to 25D are plan views for illustrating shapes of an electrode of an IPS mode liquid crystal display device according to Embodiment Mode 20.

In FIG. 25A, each of the first electrode 102c and the second electrode 108 has a comb shape, and is arranged to face opposite directions from each other. Comb-teeth are alternately arranged.

Figure 25B:
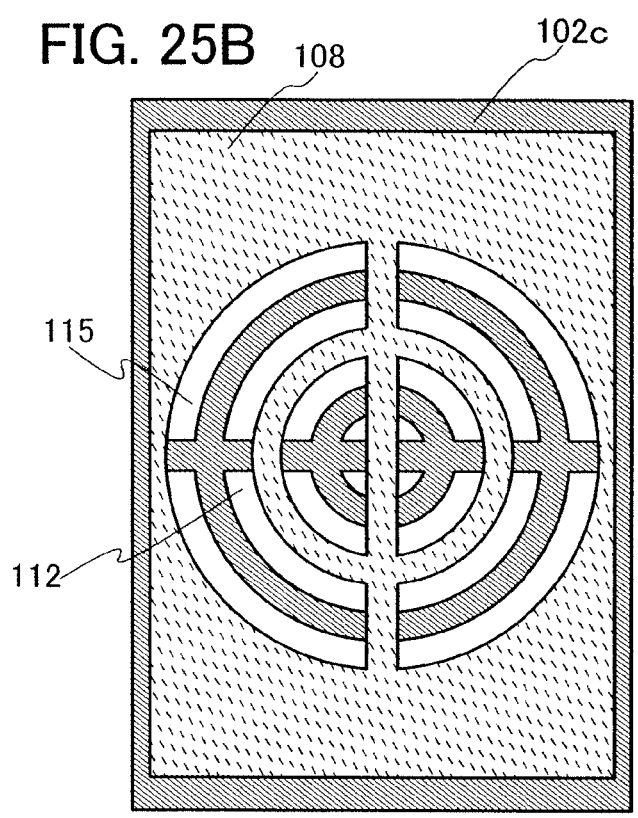

In FIG. 25B, the first electrode 102c has a shape in which the circular opening pattern 115 is provided at the center of its rectangular body; and in the opening pattern 115, a plurality of electrodes each having a shape along a circumference of a circle, of which radius are different from each other, are arranged concentrically with the opening pattern 115 and each electrode having a shape along the circumference of the circle is connected to the body by one linear electrode. The second electrode 108 has a shape in which the circular opening pattern 112 is provided at the center of the rectangular body; and in the opening pattern 112, an electrode having a shape along the circumference of the circle is arranged concentrically with the opening pattern 112 and the electrode and the body are connected by a linear electrode.

Note that the electrode having a shape along the circumference of the circle included in the second electrode 108 may be plural.

Since the opening patterns 112 and 115 are concentric with each other, the electrode having a shape along the circumference of the circle included in the first electrode 102c and the electrode having a shape along the circumference of the circle included in the second electrode 108 are concentric with each other. Note that the electrode having a shape along the circumference of the circle included in the first electrode 102c and the electrode having a shape along the circumference of the circle included in the second electrode 108 have different radiuses from each other, so that they are alternately arranged in parallel with each other.

Figure 25C:
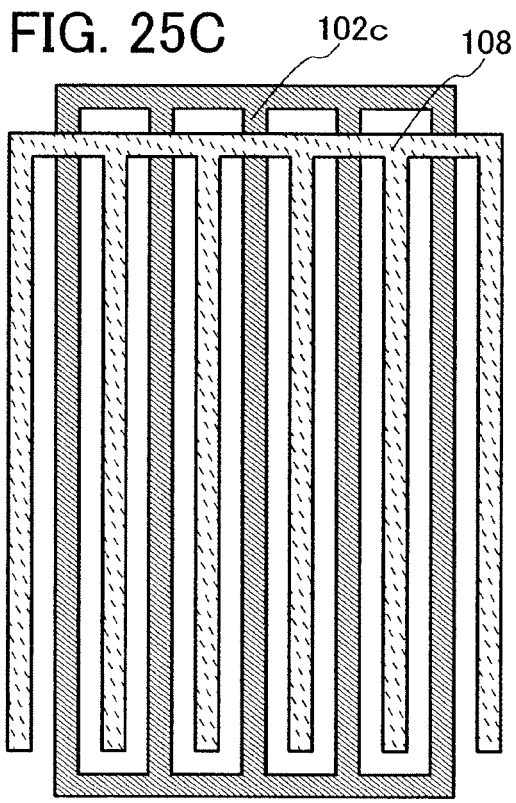

In FIG. 25C, the first electrode 102c has a shape in which a plurality of linear electrodes extended up and down in the drawing are arranged in parallel with each other and each of upper end portions or lower end portions thereof is connected by a linear electrode extended in the lateral direction in the drawing. The second electrode 108 has a comb shape, and comb-teeth are provided in a space between the linear electrodes forming the first electrode 102c.

Figure 25D:
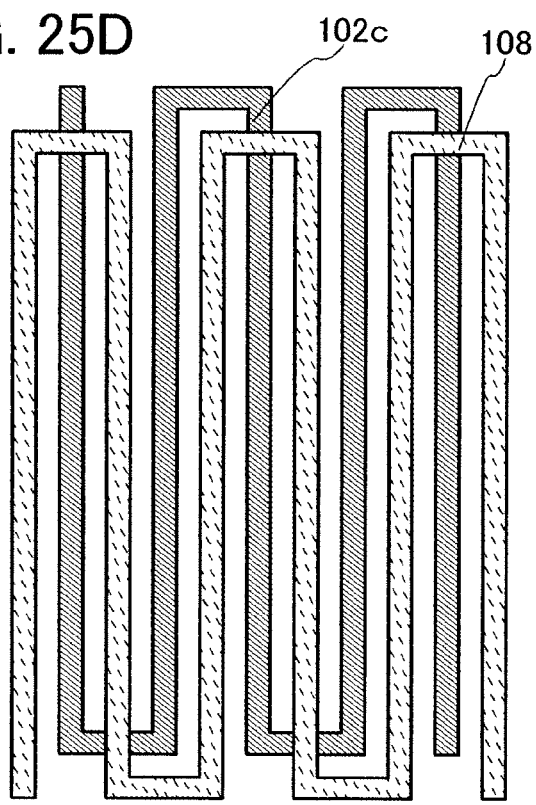

In FIG. 25D, the first electrode 102c and the second electrode 108 have a shape in which a plurality of linear electrodes extended up and down in the drawing are arranged in parallel with each other so as not to overlap with each other; and each of the linear electrodes has its upper portion connected to an upper portion of an adjacent linear electrode and its lower end portion connected to an lower end portion of the other adjacent linear electrode. That is, the second electrode 108 has a shape in which an elongated electrode is led up and down repeatedly over the first electrode 102c. Further, in the first electrode 102c and the second electrode 108, portions extended up and down in the drawing are alternately arranged in parallel with each other, and portions extended in the lateral direction do not overlap with each other.

A manufacturing method of the liquid crystal display device according to this embodiment mode is generally similar to that of Embodiment Mode 3 in each case. Therefore, the description in Embodiment mode 3 can be applied to this embodiment mode.

According to this embodiment mode, an effect similar to Embodiment Mode 3 can be obtained. Note that in Embodiment Modes 4, and 6 to 12, the first electrode 102c and the second electrode 108 may have a shape shown in any of FIGS. 25A to 25D.

In addition, in each embodiment mode described above, another semiconductor film (for example, an organic semiconductor film or an amorphous silicon film) may be used instead of the semiconductor film 102f. In this case, the first electrode 102c may also be formed of the aforementioned another semiconductor film.

Note that this embodiment mode shows an example in a case where the description in Embodiment Modes 1 to 19 is partially changed, improved, transformed, or is described from a different perspective. Therefore, the description in Embodiment Modes 1 to 19 can be applied to or combined with this embodiment mode.

In addition, description is made with reference to various drawings. One drawing includes various components. Therefore, another structure can be made by combining components selected from different drawings.

Embodiment Mode 21

Figure 32A:
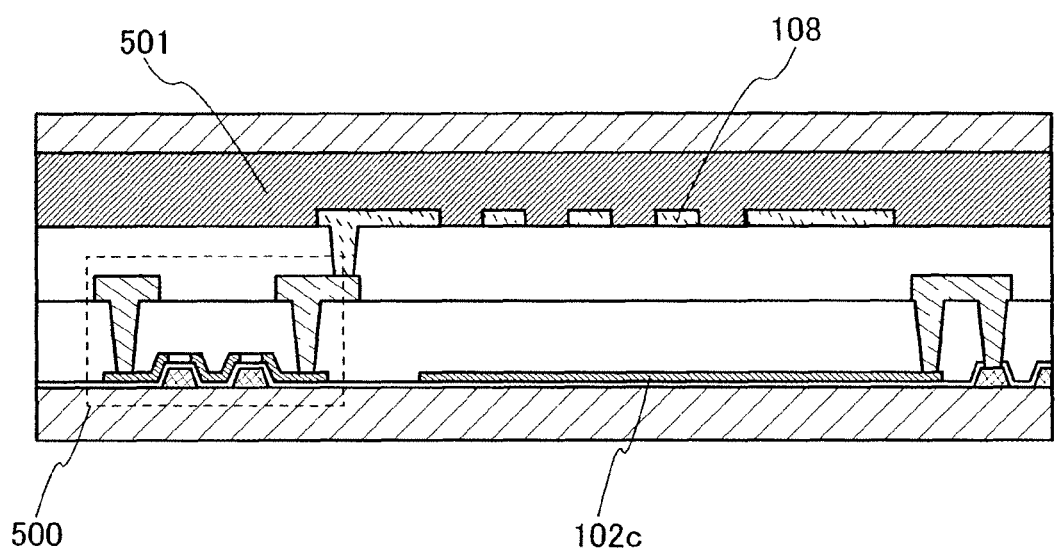
FIGS. 32A and 32B are cross-sectional views for illustrating a structure of an inorganic EL element according to Embodiment Mode 21.
Figure 32B:
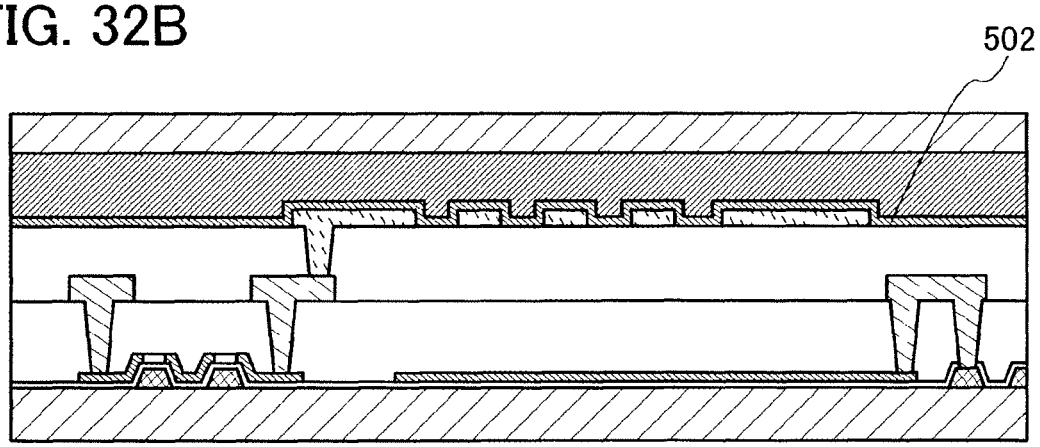

FIGS. 32A and 32B are cross-sectional views illustrating a structure of an inorganic EL element using the present invention. The inorganic EL element according to the present invention has a structure using a bottom gate transistor, and the structure is similar to the liquid crystal display device according to Embodiment Mode 13 in that the first electrode 102c and the second electrode 108 are used. A structure of a transistor, an electrode, or the like is not limited to that shown in this embodiment mode; and a top gate transistor or a structure of an electrode shown in another embodiment mode may be used. Although only one transistor is shown in the cross-sectional views shown in this embodiment mode, a structure where a plurality of transistors, such as a driving transistor, a selection transistor, or a transistor for controlling current, are included in one pixel may be employed. As a material to be used for the second electrode, one or more elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), and tin (Sn); a compound or an alloy material containing one or more of the aforementioned elements (such as indium tin oxide (ITO), indium zinc oxide (IZO), indium tin oxide doped with silicon oxide (ITSO), zinc oxide (ZnO), aluminum neodymium (Al—Nd), or magnesium silver (Mg—Ag)); a substance obtained by combining such compounds; or the like may be employed. Alternatively, a compound (silicide) of silicon and the aforementioned material (such as aluminum silicon, molybdenum silicon, or nickel silicide) or a compound of nitride and the aforementioned material (such as titanium nitride, tantalum nitride, or molybdenum nitride) can be used. Note that silicon (Si) may contain a large amount of n-type impurities (phosphorus or the like) or p-type impurities (boron or the like).

Inorganic EL elements are classified into a dispersion-type inorganic EL element and a thin-film type inorganic EL element, according to the structure of the element. These differ in that the former includes a layer including a light emitting material, in which particles of the light emitting material are dispersed in a binder, and the latter includes a layer including a light emitting material formed as a thin film. However, the dispersion-type inorganic EL element and the thin-film type inorganic EL element are common in that electrons accelerated by a high electric field are required. In this embodiment mode, a layer 501 including a light emitting material is provided above the second electrode 108. In a case of a dispersion-type inorganic EL element, a structure where the layer 501 including the light emitting material is provided on and in contact with the second electrode 108 (see FIG. 32A) is preferably employed; however, it is not limited thereto. In a case of a thin-film type inorganic EL element, a structure where a dielectric 502 is formed over the second electrode 108 and the layer 501 including the light emitting material is provided over the dielectric 502 (see FIG. 32B) is preferably employed; however, it is not limited thereto.

As a mechanism of light emission, donor-acceptor recombination emission in which a donor level and an acceptor level are utilized, and local emission in which inner shell electron transition in a metal ion is utilized are known. Generally, the dispersion-type inorganic EL element typically employs donor-acceptor recombination emission and the thin-film type inorganic EL element typically employs local emission.

The layer 501 including the light emitting material includes a base material and an impurity element to be a luminescent center. By change of the impurity element to be included, various colors of light emission can be obtained. As a manufacturing method of the light emitting material, a spraying thermal decomposition method, a double decomposition method, a method by thermal decomposition reaction of a precursor, a reversed micelle method, a method in which these methods and high temperature firing are combined, a freeze-drying method, or the like can be used.

The solid phase method is a method in which a compound including a base material and an impurity element or a compound including the impurity element are weighed, mixed in a mortar, heated in an electric-furnace, and baked to react so that the impurity element is included in the base material. The baking temperature is preferably 700 to 1500° C. This is because solid-phase reaction does not proceed when the temperature is too low, and the base material is decomposed when the temperature is too high. Note that although baking may be performed in a powder state, it is preferably performed in a pellet state. It is suitable for mass-production since it is a simple method with high productivity even though baking at a comparatively high temperature is required.

The liquid phase method (the coprecipitation method) is a method in which a base material or a compound including the base material, and an impurity element or a compound including the impurity element are reacted in a solution, dried, and then baked. The particles of the light emitting material are dispersed uniformly, and the reaction can be advanced even if the particles are small and baking temperature is low.

As the base material to be used for the light emitting material, a sulfide, an oxide, or a nitride can be used. As a sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As an oxide, zinc oxide (ZnO), yttrium oxide ($Y_2O_3$), or the like can be used, for example.

In addition, as a nitride, aluminum nitride (AlN), gallium nitride (GaN), indium nitride (InN), or the like can be used, for example. Alternatively, zinc selenide (ZnSe), zinc telluride (ZnTe), or the like; or a ternary mixed crystal such as calcium sulfide-gallium ($CaGa_2S_4$), strontium sulfide-gallium ($SrGa_2S_4$), or barium sulfide-gallium ($BaGa_2S_4$) may be used.

As a luminescent center of local emission, manganese (Mn), copper (Cu), samarium (Sm), terbium (Tb), erbium (Er), thulium (Tm), europium (Eu), cerium (Ce), praseodymium (Pr), or the like can be used. For charge compensation, a halogen element such as fluorine (F) or chlorine (Cl) may be added.

On the other hand, as a luminescent center of donor-acceptor recombination emission, a light emitting material including a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

Note that in the inorganic EL light emitting element, a voltage is applied between a pair of electrodes so that light emission can be obtained. In this embodiment mode, AC drive is preferably used since an electric field formed by the first electrode 102c and the second electrode 108 is used for light emission in the inorganic EL light emitting element shown in this embodiment mode. Note that the electric field formed for light emission is similar to the electric field in the liquid crystal display device shown in other embodiment modes.

As a binder which can be used in this embodiment mode, an organic or inorganic insulating material, or a mixed material of an organic material and an inorganic material can be used. As the organic insulating material, the following resin can be used: a polymer having a comparatively high dielectric constant such as a cyanoethyl cellulose based resin; or a resin such as polyethylene, polypropylene, a polystyrene based resin, a silicone resin, an epoxy resin, or vinylidene fluoride. Further, a heat-resistant high-molecular material such as aromatic polyamide or polybenzimidazole, or a siloxane resin may also be used.

Alternatively, the following resin material may also be used: a vinyl resin such as polyvinyl alcohol or polyvinylbutyral, a phenol resin, a novolac resin, an acrylic resin, a melamine resin, a urethane resin, an oxazole resin (polybenzoxazole), or the like. Further, a photo-curable resin or the like can be used. Fine particles having a high dielectric constant such as barium titanate ($BaTiO_3$) or strontium titanate ($SrTiO_2$) may be mixed to these resins as appropriate, so that a dielectric constant can be adjusted.

As the inorganic material used for the binder, silicon oxide ($SiO_x$), silicone nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, or a material selected from a substance including other inorganic materials can be employed. By adding the inorganic material having a high dielectric constant in the organic material (by doping or the like), the dielectric constant of a layer including a light emitting substance formed of the light emitting material and the binder can be controlled, and the dielectric constant can be further increased.

As shown in this embodiment mode, an electrode containing silicon is used as an electrode of the inorganic EL element, so that the inorganic EL element can be manufactured at low cost. By the structure shown in this embodiment mode, various electrode materials can be applied since attenuation by the electrode is not required to be considered. For example, the second electrode may be formed using a metal material so as to be thick. Further, since a layer including a light emitting material is not required to be provided between the first electrode and the second electrode, luminance as a display device can be improved; a load for the EL element can be reduced; and deterioration of the element can be reduced.

Embodiment Mode 22

Figure 33:
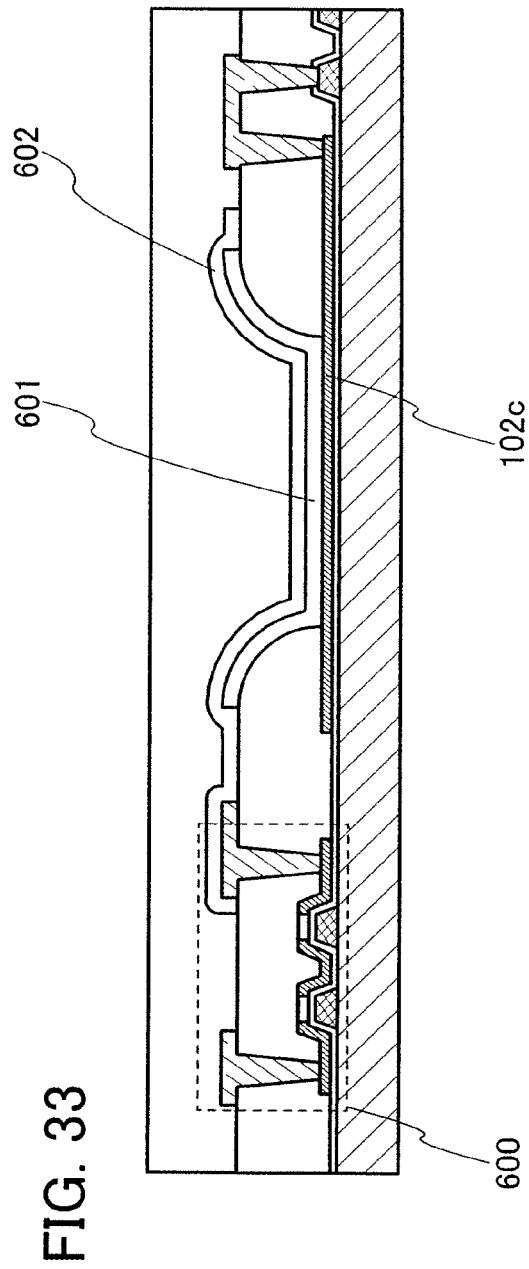
FIG. 33 is a cross-sectional view for illustrating a structure of an organic EL element according to Embodiment Mode 22.

FIG. 33 is a cross-sectional view illustrating a structure of an organic EL element which uses an electrode containing silicon in the present invention. The organic EL element according to this embodiment mode has a structure where a bottom gate transistor 600 is used. In this embodiment mode, a layer 601 including an organic compound is interposed between the first electrode 102c and a second electrode 602. A structure of a transistor is not limited to that shown in this embodiment mode, and a top gate transistor may be used. As a material used for the second electrode, one or more elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or an alloy material containing one or more of the aforementioned elements (such as indium tin oxide (ITO), indium zinc oxide (IZO), indium tin oxide doped with silicon oxide (ITSO), zinc oxide (ZnO), aluminum neodymium (Al—Nd), or magnesium silver (Mg—Ag)); a substance obtained by combining such compounds; or the like may be employed. Alternatively, a compound (silicide) of silicon and the aforementioned material (such as aluminum silicon, molybdenum silicon, or nickel silicide) or a compound of nitride and the aforementioned material (such as titanium nitride, tantalum nitride, or molybdenum nitride) can be used. Note that silicon (Si) may contain a large amount of n-type impurities (phosphorus or the like) or p-type impurities (boron or the like).

The layer 601 including the organic compound includes at least a layer (light emitting layer) including a material with a high light emitting property. There is no particular limitation on the light emitting layer; however, a layer functioning as the light emitting layer has roughly two modes. One is a host-guest type layer which includes a light emitting substance dispersed in a layer formed of a material (host material) having an energy gap larger than an energy gap of a substance (light emitting substance or guest material) to be a luminescent center. The other is a layer in which a light emitting layer includes only a light emitting material. The former is preferable since concentration quenching hardly occurs. As the light emitting substance, the following can be employed: 4-dicyanomethylene-2-methyl-6-(1,1,7,7-tetramethyljulolidyl-9-enyl)-4H-pyran (abbreviation: DCJT); 4-dicyanomethylene-2-t-butyl-6-(1,1,7,7-tetramethyljulolidyl-9-enyl)-4H-pyran; periflanthene; 2,5-dicyano-1,4-bis[2-(10-methoxy-1,1,7,7-tetramethyljulolidyl-9-enyl)]benzene; N,N'-dimethylquinacridone (abbreviation: DMQd); coumarin 6; coumarin 545T; tris(8-quinolinolato)aluminum (abbreviation: $Alq_3$); 9,9'-bianthryl; 9,10-diphenylanthracene (abbreviation: DPA); 9,10-bis(2-naphthyl)anthracene (abbreviation: DNA); 2,5,8,11-tetra-t-butylperylene (abbreviation: TBP); or the like. As the host material, the following can be used: an anthracene derivative such as 9,10-di(2-naphthyl)-2-tert-butylanthracene (abbreviation: t-BuDNA); a carbazole derivative such as 4,4'-bis(N-carbazolyl)biphenyl (abbreviation: CBP); or a metal complex such as tris(8-quinolinolato)aluminum (abbreviation: $Alq_3$), tris(4-methyl-8-quinolinolato)aluminum (abbreviation: $Almq_3$); bis(10-hydroxybenzo[h]-quinolinato)beryllium (abbreviation: $BeBq_2$); bis(2-methyl-8-quinolinolato)-4-phenylphenolato-aluminum (abbreviation: BAlq); bis[2-(2-hydroxyphenyl)pyridinato]zinc (abbreviation: $Znpp_2$); or bis[2-(2-hydroxyphenyl)benzoxazolate]zinc (abbreviation: ZnBOX). As a material which is a light transmitting substance capable of forming the light emitting layer alone, tris(8-quinolinolato) aluminum (abbreviation: $Alq_3$), 9,10-bis(2-naphthyl)anthracene (abbreviation: DNA), bis(2-methyl-8-quinolinolato)-4-phenylphenolato-aluminum (abbreviation: BAlq), or the like can be used. Note that as a layer including an organic compound, a layer such as a hole injecting layer, a hole transporting layer, an electron transporting layer, or an electron injecting layer may be included.

Note that an organic EL light emitting element can obtain light emission when a voltage is applied between a pair of electrodes. In the organic EL light emitting element shown in this embodiment mode, light is emitted by a current generated by the first electrode 102c and the second electrode 602.

As shown in this embodiment mode, the electrode containing silicon is used as an electrode of the organic EL element, so that the organic EL element can be manufactured at low cost.

Embodiment Mode 23

FIGS. 34A to 34D are cross-sectional views illustrating a reflection type liquid crystal display device using a single crystalline silicon substrate, and a manufacturing method thereof. Hereinafter, the manufacturing method is briefly described. First, oxygen ions are implanted into a single crystalline silicon substrate 700 with constant acceleration (see FIG. 34A). Thereafter, by heating at a high temperature, a silicon oxide layer 702 is formed, while a single crystalline silicon layer 701 remains on a surface of the single crystalline silicon substrate 700 (see FIG. 34B). Next, the single crystalline silicon layer 701 is etched into an island shape so as to form a transistor 703. In this case, the first electrode 102c is formed at the same time (see FIG. 34C). Note that an impurity element is added to source and drain regions 704 of the transistor 703 so as to have conductivity. As the impurity element, elements shown in other embodiment modes can be used. Further, an electrode, a wiring, or the like can be formed using a material shown in other embodiment modes.

Figure 34A:
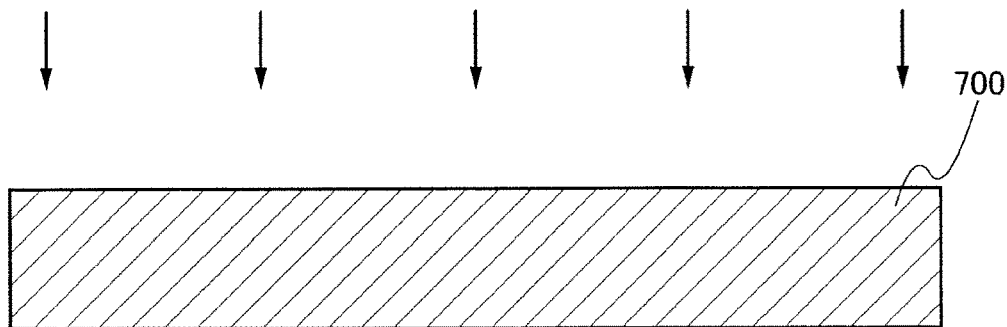
FIGS. 34A to 34D are cross-sectional views for illustrating a structure and manufacturing steps of a reflective liquid crystal display device according to Embodiment Mode 23.
Figure 34B:
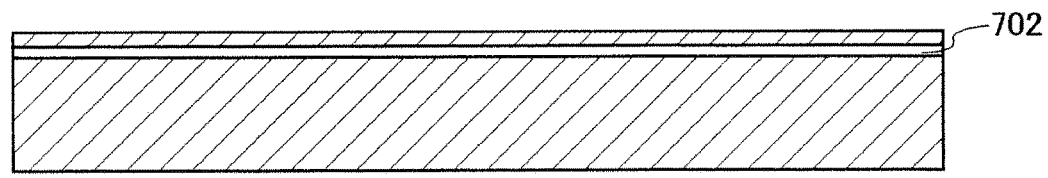
Figure 34C:
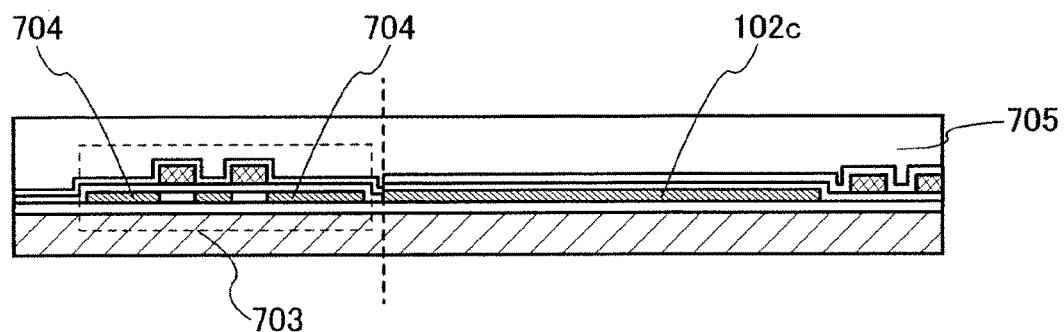
Figure 34D:
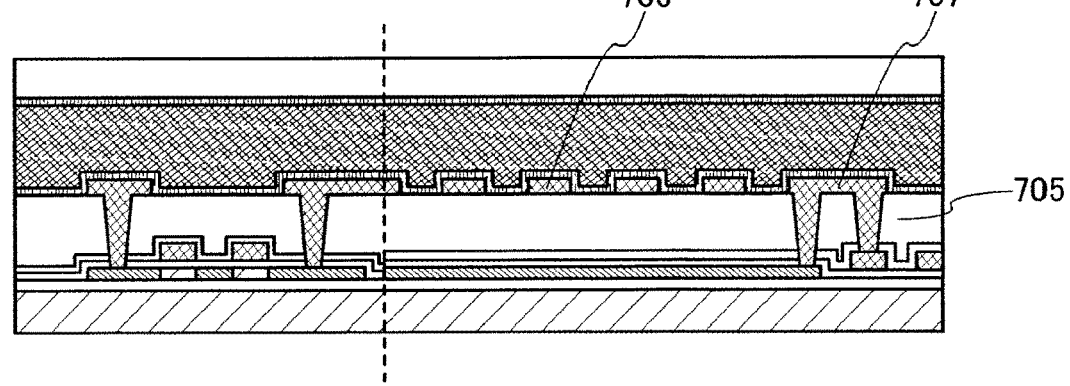

Next, an interlayer insulating film 705 is formed (see FIG. 34C). Since the interlayer insulating film can be formed using a material shown in other embodiment modes and embodiments, detailed description is omitted here. Note that in this embodiment mode, although the interlayer insulating film has a single-layer structure, it may have a stacked-layer structure of two or more layers. After the interlayer insulating film 705 is formed, a contact hole is formed and a second electrode 706 to be a pixel electrode is formed (see FIG. 34D). In this embodiment mode, as a material for the second electrode 706, a material having high visible light reflectivity is preferably used since a reflection type liquid crystal display device is formed; it is not limited thereto. As a material having high reflectivity, a metal material such as aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), or tin (Sn) can be taken as an example. Note that a wiring 707 for connection is preferably formed at the same time as the electrode 706.

Thereafter, an alignment film, a liquid crystal, an opposite substrate, and the like are provided so that the reflection type liquid crystal display device is completed. In the liquid crystal display device in this embodiment mode, light from an upper surface (on an opposite substrate side) is reflected by the first electrode 102c or the second electrode 706 so that an image is seen. Therefore, a material having high reflectivity is preferably used for the second electrode 706. Crystal silicon which is a material of the first electrode 102c has, depending on a state of a surface thereof, reflectivity higher than a certain value; therefore, it can be used as a reflective film of the reflection type liquid crystal display device. Note that a structure of a reflection type liquid crystal display device is not limited to that of this embodiment mode, and various structures can be used. For example, in this embodiment mode, a top gate transistor is used as the transistor 703; however, a bottom gate transistor may be used. Further, an electrode formed of a metal material may be employed as the first electrode 102c.

As shown in this embodiment mode, by use of a single crystalline silicon substrate, a liquid crystal display device suitable for usage requiring high-speed operation can be manufactured. That is, a driver circuit can be manufactured directly on a substrate, and high-speed operation of the driver circuit and the like can be achieved. Needless to say, not only the driver circuit but also other circuits can be formed using single crystalline silicon, so that a display device in which all circuits are mounted on one substrate can be formed.

Embodiment 1

Embodiment 1 of the present invention is described with reference to FIGS. 26A to 28B. In a liquid crystal display module according to this embodiment, a pixel portion has a structure similar to that of the liquid crystal display device shown in any of Embodiment Modes 1 to 20. Therefore, manufacturing cost can be lowered as compared with a conventional device.

Figure 26A:
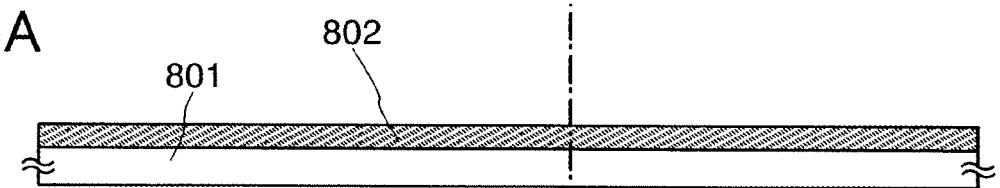
FIGS. 26A to 26E are cross-sectional views illustrating a manufacturing method of a liquid crystal display module of Embodiment 1.

First, as shown in FIG. 26A, a base film 802 is formed over a substrate 801. The substrate 801 is a glass substrate, a quartz substrate, a substrate formed of an insulator such as alumina, a plastic substrate with enough heat resistance to withstand a processing temperature of subsequent steps, a silicon substrate, or a metal plate. Further, the substrate 801 may be a substrate in which an insulating film of silicon oxide, silicon nitride, or the like is formed over a surface of a metal substrate such as a stainless steel substrate or a surface of a semiconductor substrate. Note that when a plastic substrate is used for the substrate 801, plastic with a comparatively high glass transition point, such as PC (polycarbonate), PES (polyethersulfone), PET (polyethylene terephthalate), or PEN (polyethylene naphthalate) is preferably used.

The base film 802 has a stacked-layer structure where a silicon oxide ($SiO_x$) film is formed over a silicon nitride ($SiN_g$) film, for example; other insulators (such as silicon oxynitride ($SiO_xN_y$) (x>y>0) or silicon nitride oxide ($SiN_xO_y$) (x>y>0)) may also be used. Alternatively, the base film 802 may be formed by high-density plasma treatment on a surface of the substrate 801. High-density plasma is generated by using a microwave at, for example, 2.45 GHz, and has electron density of $1\times10^{11}$ to $1\times10^{13}/cm^3$, electron temperature of 2 eV or less, and ion energy of 5 eV or less. Such high-density plasma has low kinetic energy of active species, and a film with less plasma damage and fewer defects compared with conventional plasma treatment can be formed. The distance between the substrate 801 and an antenna for generating the microwave is set to 20 to 80 mm, preferably 20 to 60 mm.

The surface of the substrate 801 can be nitrided by performing the aforementioned high-density plasma treatment in a nitrogen atmosphere, for example, in an atmosphere including nitrogen and a rare gas, an atmosphere including nitrogen, hydrogen, and a rare gas, or an atmosphere including ammonia and a rare gas. When a glass substrate, a quartz substrate, a silicon wafer, or the like is used as the substrate 801 and nitriding treatment is performed by the aforementioned high-density plasma, a nitride film formed on the surface of the substrate 801 contains silicon nitride as its main component, so that the nitride film can be used as the base film 802. A silicon oxide film or a silicon oxynitride film may be formed over the nitride film by a plasma CVD method so that the base film 802 includes a plurality of layers.

In addition, a nitride film can be formed on a surface of the base film 802 including a silicon oxide film, a silicon oxynitride film, or the like by similarly performing nitriding treatment with high-density plasma on the surface of the base film 802. The nitride film can suppress diffusion of impurities from the substrate 801 and can be formed to be very thin; therefore, influence of stress upon a semiconductor layer to be formed thereover can be reduced.

Figure 26B:
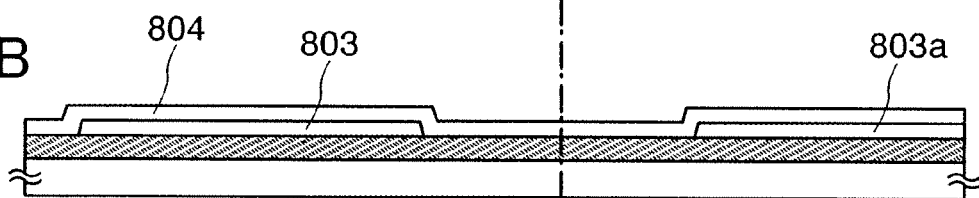

Next, as shown in FIG. 26B, a crystalline semiconductor film (such as a polysilicon film) is formed over the base film 802. As a forming method of the crystalline semiconductor film, a method in which the crystalline semiconductor film is formed directly on the base film 802, and a method in which an amorphous semiconductor film is formed over the base film 802 and subsequently crystallized can be taken as an example.

As a method of crystallizing the amorphous semiconductor film, the following can be used: a crystallization method by laser light irradiation; a crystallization method by heating using an element (for example, a metal element such as nickel) which promotes crystallization of the semiconductor film; or a crystallization method by heating using an element which promotes crystallization of the semiconductor film and subsequently irradiating the semiconductor film with laser light. Needless to say, a method of thermally crystallizing the amorphous semiconductor film without using the aforementioned element can be used as well. However, in this case, the substrate is required to be a quartz substrate, a silicon wafer, or the like which can withstand the high temperature.

When laser irradiation is used, a continuous wave laser beam (CW laser beam) or a pulsed laser beam (pulse laser beam) can be used. Here, a laser beam emitted from one or plural kinds of a gas laser such as an Ar laser, a Kr laser, or an excimer laser; a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser can be used. By irradiation with a laser beam having a fundamental wave of such laser beams or one of the second to fourth harmonics of the fundamental wave, a crystal with a large grain size can be obtained. For example, the second harmonic (532 nm) or the third harmonic (355 nm) of an Nd:$YVO_4$ laser (fundamental wave of 1064 nm) can be used. In this case, the energy density of approximately 0.01 to 100 $MW/cm^2$ (preferably, 0.1 to 10 $MW/cm^2$) is required for the laser. The scanning rate is set at approximately 10 to 2000 cm/sec to irradiate the semiconductor film.

Note that a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser; and a Ti:sapphire laser are capable of continuous oscillation. Further, pulse oscillation thereof can be performed at a repetition rate of 10 MHz or more by carrying out Q switch operation or mode locking. When a laser beam is emitted at a repetition rate of 10 MHz or more, a semiconductor film is irradiated with a next pulse after being melted by the laser beam and before being solidified. Therefore, unlike a case of using a pulsed laser with a low repetition rate, a solid-liquid interface can be continuously moved in the semiconductor film; therefore, crystal grains which continuously grow in a scanning direction can be obtained.

When ceramic (polycrystal) is used as a medium, the medium can be formed to have a desired shape for a short time and at low cost. When a single crystalline is used, a columnar medium with several mm in diameter and several tens of mm in length is used. When the ceramic is used, a medium larger than the case of using the single crystalline can be formed.

A concentration of a dopant such as Nd or Yb in a medium, which directly contributes to light emission, cannot be changed largely in either case of the single crystalline or the polycrystal; therefore, there is some limitation on improvement in output of a laser by increasing the concentration of the dopant. However, in the case of ceramic, the size of a medium can be significantly increased as compared with the case of the single crystalline; therefore, drastic improvement in output of a laser can be expected.

Further, in the case of ceramic, a medium with a parallelepiped shape or a rectangular parallelepiped shape can be easily formed. When a medium having such a shape is used and oscillated light is made travel in a zigzag manner inside the medium, a path of the oscillated light can be made long. Therefore, amplification is increased and a laser beam can be oscillated at high output. Furthermore, since a cross section of a laser beam emitted from the medium having such a shape has a quadrangular shape, it has an advantage over a circular beam in being shaped into a linear beam. By shaping a laser beam emitted in the aforementioned manner by using an optical system, a linear beam having a length of 1 mm or less on a lateral side and a length of several mm to several m on a longitudinal side can be easily obtained. In addition, when a medium is uniformly irradiated with excited light, energy distribution of a linear beam becomes uniform in a longitudinal direction.

A semiconductor film is irradiated with this linear beam, so that the whole surface of the semiconductor film can be annealed more uniformly. When uniform annealing is required from one end to the other end of the linear beam, ingenuity such as arrangement in which slits are provided in ends of the linear beam to shield light at a portion where energy is attenuated is required.

When a semiconductor film is annealed using the thus obtained linear beam having uniform intensity and an electronic appliance is manufactured by using this semiconductor film, characteristics of the electronic appliance are good and uniform.

As the method for crystallizing the amorphous semiconductor film by heating with an element which promotes crystallization of the semiconductor film, a technique described in Japanese Published Patent Application No. H8-78329 can be used. In the technique in the patent application publication, an amorphous semiconductor film (also referred to as an amorphous silicon film) is doped with a metal element which promotes crystallization of the semiconductor film, and then heat treatment is performed so that the amorphous semiconductor film is crystallized with the doped region as a nucleus.

Alternatively, an amorphous semiconductor film can be crystallized by performing irradiation with strong light instead of heat treatment. In this case, one of or a combination of infrared light, visible light, and ultraviolet light can be used. Typically, light emitted from a halogen lamp, a metal halide lamp, a xenon arc lamp, a carbon arc lamp, a high pressure sodium lamp, or a high pressure mercury lamp is used. A lamp light source is lighted for 1 to 60 seconds, preferably 30 to 60 seconds, and such lighting is repeated 1 to 10 times, preferably 2 to 6 times. The light emission intensity of the lamp light source is arbitrary, but the semiconductor film is required to be instantaneously heated up to approximately 600 to 1000° C. Note that if necessary, heat treatment may be performed in order to discharge hydrogen contained in the amorphous semiconductor film having an amorphous structure before the irradiation with the strong light. Alternatively, crystallization may be performed by both heat treatment and irradiation with strong light.

After the heat treatment, in order to increase the degree of crystallinity of the crystalline semiconductor film (rate of area occupied by crystalline components against the whole volume of the film) and to correct defects which remain in crystalline grains, the crystalline semiconductor film may be irradiated with the laser light in the atmospheric air or an oxygen atmosphere. The laser light may be selected from the aforementioned laser light.

The doped elements are required to be removed from the crystalline semiconductor film, and the method is described below. First, a surface of the crystalline semiconductor film is treated with a solution containing ozone (typically, ozone water), so that a barrier layer formed of an oxide film (called chemical oxide) is formed on the surface of the crystalline semiconductor film to have a thickness of 1 to 10 nm. The barrier layer functions as an etching stopper when only a gettering layer is selectively removed in a subsequent step.

Then, a gettering layer containing a rare gas element is formed as a gettering site over the barrier layer. Here, a semiconductor film containing a rare gas element is formed as the gettering layer by a CVD method or a sputtering method. When the gettering layer is formed, the sputtering conditions are controlled as appropriate so that a rare gas element is added to the gettering layer. The rare gas element may be one or more of helium (He), neon (Ne), argon (Ar), krypton (Kr), or xenon (Xe).

Note that when the gettering layer is formed by using a source gas containing phosphorus which is an impurity element or by using a target containing phosphorus, gettering can be performed by utilizing the coulomb force of phosphorus in addition to the gettering using the rare gas element. In gettering, a metal element (such as nickel) tends to move to a region having a high concentration of oxygen; therefore, the concentration of oxygen contained in the gettering layer is preferably set at, for example, $5 \times 10^{18}/cm^{-3}$ or higher.

Next, the crystalline semiconductor film, the barrier layer, and the gettering layer are subjected to thermal treatment (such as heat treatment or irradiation with strong light), and thereby the metal element (such as nickel) is gettered, so that the metal element in the crystalline semiconductor film is lowered in concentration or removed.

Next, a known etching method is performed using the barrier layer as an etching stopper so that only the gettering layer is selectively removed. After that, the barrier layer formed of an oxide film is removed, for example, using an etchant containing hydrofluoric acid.

Here, impurity ions may be added in consideration of threshold characteristics of a TFT to be manufactured.

Next, a photo resist film (not shown) is applied over the crystalline semiconductor film, and is exposed to light and developed. Therefore, a resist pattern is formed over the crystalline semiconductor film. Next, the crystalline semiconductor film is etched using the resist pattern as a mask. Therefore, a crystalline semiconductor film 803 to be included in a thin film transistor and a crystalline semiconductor film 803a to be a common electrode are formed over the base film 802.

Next, after surfaces of the crystalline semiconductor films 803 and 803a are cleaned with an etchant containing hydrofluoric acid, a gate insulating film 804 is formed to have a thickness of 10 to 200 nm over the crystalline semiconductor film 803. The gate insulating film 804 is formed of an insulating film containing silicon as a main component, such as a silicon oxide film, a silicon nitride film, a silicon oxynitride film, or a silicon nitride oxide film. Further, the gate insulating film may have a single layer or a stacked-layer film. Note that the gate insulating film 804 is also formed over the crystalline semiconductor film 803a and the base film 802.

Figure 26C:
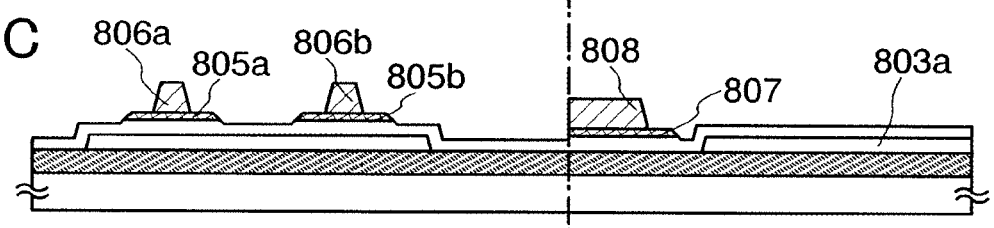

Next, as shown in FIG. 26C, after the gate insulating film 804 is cleaned, a first conductive film and a second conductive film are formed in this order over the gate insulating film 804. For example, the first conductive film is a tungsten film and the second conductive film is a tantalum nitride film.

Next, a photo resist film (not shown) is applied over the second conductive film, and is exposed to light and developed. Therefore, a resist pattern is formed over the second conductive film. Next, by using the resist pattern as a mask, the first conductive film and the second conductive film are etched under a first condition, and further, the second conductive film is etched under a second condition. Thus, first gate electrodes 805a and 805b and second gate electrodes 806a and 806b are formed over the crystalline semiconductor film 803. The first gate electrodes 805a and 805b are separated from each other. The second gate electrode 806a is provided over the first gate electrode 805a, and the second gate electrode 806b is provided over the first gate electrode 806b. Inclined angles of side surfaces of each of the first gate electrodes 805a and 805b are more moderate than inclined angles of side surfaces of each of the second gate electrodes 806a and 806b.

By the etching treatment, a first wiring 807 and a second wiring 808 provided over the first wiring 807 are formed near the crystalline semiconductor film 803a. Here, each of the aforementioned gate electrodes and wirings is preferably led so as to have a round corner when seen from a direction perpendicular to the substrate 801. By making the corners round, dust or the like can be prevented from remaining at the corners of the wiring; therefore, the number of defects generated due to dust can be reduced and yield can be improved. Thereafter, the photo resist film is removed.

Figure 26D:
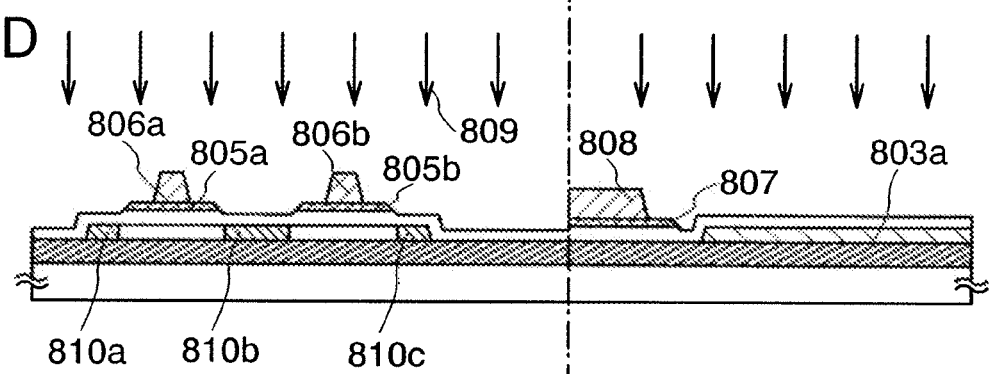

Next, as shown in FIG. 26D, a first conductivity type (for example, n-type) impurity element (for example, phosphorus) is injected into the crystalline semiconductor film 803 by using the first gate electrodes 805a and 805b and the second gate electrodes 806a and 806b as masks. Therefore, first impurity regions 810a, 810b, and 810c are formed in the crystalline semiconductor film 803. The first impurity region 810a is provided in a region to be a source of the thin film transistor. The first impurity region 810c is provided in a region to be a drain of the thin film transistor. The impurity region 810b is provided between the first gate electrodes 805a and 805b.

Note that in this treatment, the first conductivity type impurity element is also injected into the crystalline semiconductor film 803a to be a common electrode to lower resistance.

Figure 26E:
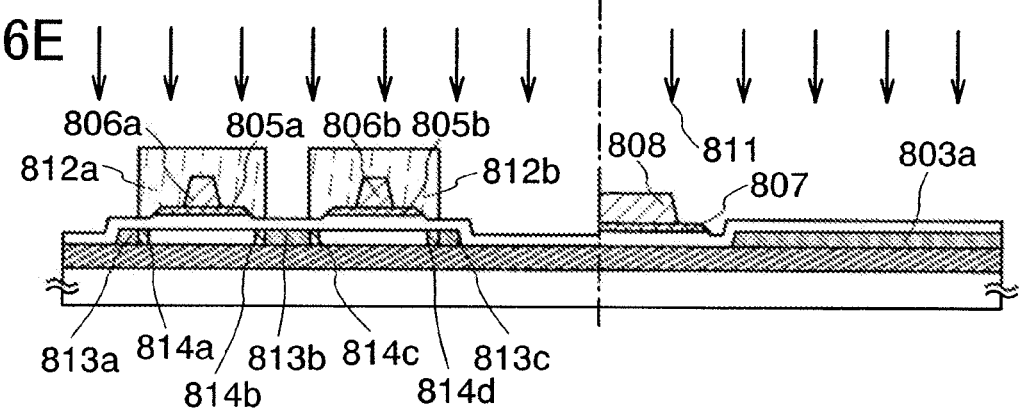

Next, as shown in FIG. 26E, a photo resist film is applied over the whole surface including over the first gate electrodes 805a and 805b and the second gate electrodes 806a and 806b, and is exposed to light and developed. Therefore, each of top surfaces of the first gate electrode 805a and the second gate electrode 806a and their surroundings are covered with a resist pattern 812a, and each of top surfaces of the first gate electrode 805b and the second gate electrode 806b and their surroundings are covered with a resist pattern 812b. Next, by using the resist patterns 812a and 812b as masks, a first conductivity type impurity element 811 (for example, phosphorus) is injected into the crystalline semiconductor film 803. Therefore, the first conductivity type impurity element 811 is further injected into a part of each of the first impurity regions 810a, 810b, and 810c, so that second impurity regions 813a, 813b, and 813c are formed.

Further, the first conductivity type impurity element is further injected into the crystalline semiconductor film 803a to be the common electrode to lower resistance. Note that the other parts of the first impurity regions 810a, 810b, and 810c remain as third impurity regions 814a, 814b, 814c, and 814d.

Figure 27A:
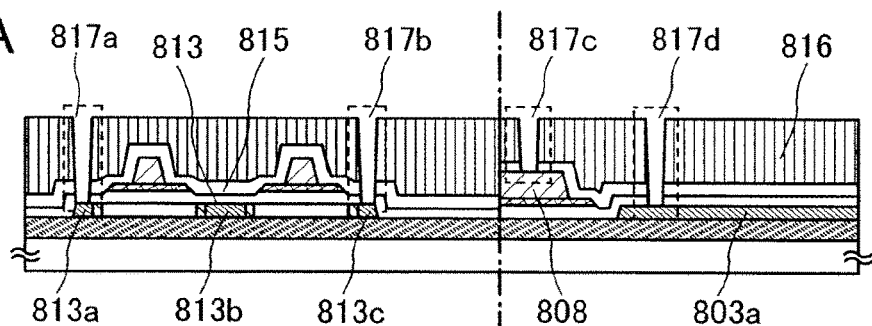
FIGS. 27A to 27D are cross-sectional views illustrating a manufacturing method of a liquid crystal display module of Embodiment 1.

Thereafter, as shown in FIG. 27A, the resist patterns 812a and 812b are removed. Next, an insulating film (not shown) covering almost all surface is formed. The insulating film is, for example, a silicon oxide film formed by a plasma CVD method.

Next, heat treatment is performed on the crystalline semiconductor films 803 and 803a to activate the impurity elements doped therewith. The heat treatment is performed by a rapid thermal annealing method (RTA method) using a lamp light source, irradiation of a YAG laser or an excimer laser from the back surface, or heat treatment using a furnace, or by a combination of a plurality of these methods.

By the aforementioned treatment, the impurity elements are activated, and simultaneously the element (for example, a metal element such as nickel), which is used as a catalyst for crystallizing the crystalline semiconductor film 803, is gettered in the second impurity regions 813a to 813c including a high concentration impurity (such as phosphorus), and a nickel concentration mainly in a region to be a channel forming region of the crystalline semiconductor film 803 is reduced. As a result, crystallinity of the channel forming region is improved. Accordingly, an off-current value of a TFT is reduced and high electron field-effect mobility can be obtained. Therefore, a TFT having favorable characteristics can be obtained.

Next, an insulating film 815 is formed over the whole surface including above the crystalline semiconductor films 803 and 803a. The insulating film 815 is, for example, a silicon nitride film formed by a plasma CVD method. Next, a planarizing film to be an interlayer insulating film 816 is formed over the insulating film 815. As the interlayer insulating film 816, a light-transmitting inorganic material (silicon oxide, silicon nitride, silicon nitride containing oxygen, or the like); a photosensitive or non-photosensitive organic material (polyimide, acrylic, polyamide, polyimide amide, a resist, or benzocyclobutene); a stacked-layer structure thereof; or the like is used. Alternatively, as another light-transmitting film used for the planarizing film, an insulating film formed of a $SiO_x$ film containing an alkyl group obtained by a coating method, for example, an insulating film using silica glass, alkyl siloxane polymers, alkylsilsesquioxane polymers, hydrogen silsesquioxane polymers, hydrogen alkylsilsesquioxane polymers, or the like can be used. As an example of siloxane-based polymers, there are coating insulating film materials such as PSB-K1 and PSB-K31 (product of Toray industries, Inc.) and ZRS-5PH (product of Catalysts & Chemicals Industries Co., Ltd.). The interlayer insulating film may be a single-layer film or a multi-layer film.

Next, a photo resist film (not shown) is applied over the interlayer insulating film 816, and is exposed to light and developed. Therefore, a resist pattern is formed over the interlayer insulating film 816. Next, the interlayer insulating film 816, the insulating film 815, and the gate insulating film 804 are etched using the resist pattern as a mask. Therefore, contact holes 817a, 817b, 817c, and 817d are formed in the interlayer insulating film 816, the insulating film 815, and the gate insulating film 804. The contact hole 817a is provided over the second impurity region 813a, which is the source of the transistor. The contact hole 817b is provided over the second impurity region 813c, which is the drain of the transistor. The contact hole 817c is provided over the second wiring 808. The contact hole 817d is provided over the crystalline semiconductor film 803a, which is the common electrode. Thereafter, the resist pattern is removed.

Figure 27B:
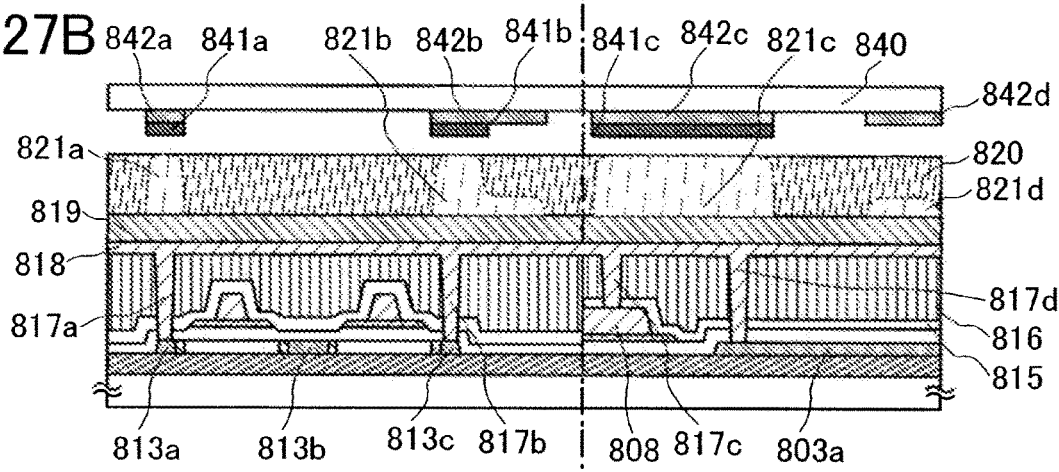

Next, as shown in FIG. 27B, a first conductive film 818 is formed in each of the contact holes 817a to 817d and over the interlayer insulating film 816. The first conductive film 818 is a light-transmitting conductive film, such as an ITO film, a film of indium tin oxide containing a Si element, or a film of IZO (indium zinc oxide) formed by using a target in which zinc oxide (ZnO) of 2 to 20 wt % is mixed with indium oxide. Next, a second conductive film 819 is formed over the first conductive film 818. The second conductive film 819 is, for example, a metal film.

Next, a photo resist film 820 is applied over the conductive film 819. Next, a reticle 840 is provided above the photo resist film 820. The reticle 840 has a structure where semi-transmitting film patterns 842a, 842b, 842c, and 842d are formed over a glass substrate and light shielding patterns 841a, 841b, and 841c are formed over a part of the semi-transmitting film patterns 842a to 842d. The semi-transmitting film pattern 842a and the light shielding pattern 841a are provided above the contact hole 817a. The semi-transmitting film pattern 842b and the light shielding pattern 841b are provided above the contact hole 817b. The semi-transmitting film pattern 842c and the light shielding pattern 841c are provided above the contact holes 817c and 817d. The semi-transmitting film pattern 842d is provided above the crystalline semiconductor film 803a.

Next, the photo resist film 820 is exposed to light using the reticle 840 as a mask. Therefore, the photo resist film 820 is exposed to light except for a portion below the light shielding patterns 841a to 841c and a lower layer of a portion below the semi-transmitting film patterns 842a to 842d. Note that portions which are not exposed to light are denoted by reference numerals 821a, 821b, 821c, and 821d.

Figure 27C:
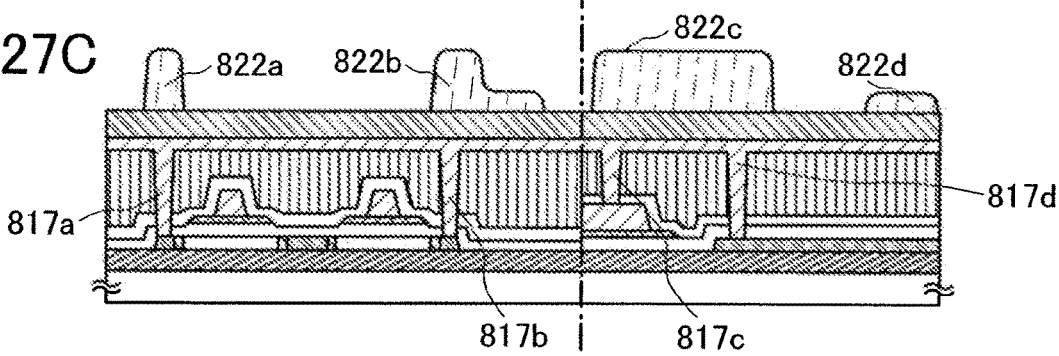

Next, as shown in FIG. 27C, the photo resist film 820 is developed. Therefore, portions exposed to light in the photo resist film 820 are removed, and resist patterns 822a, 822b, 822c, and 822d are formed. The resist pattern 822a is provided above the contact hole 817a. The resist pattern 822b is provided above and around the contact hole 817b. The resist pattern 822c is provided above and between the contact holes 817c and 817d. The resist pattern 822d is provided above the crystalline semiconductor film 803a to be the common electrode. Note that portions of the resist pattern 822b, except for a portion above the contact hole 817b, and the resist pattern 822d are thinner than other resist patterns.

Figure 27D:
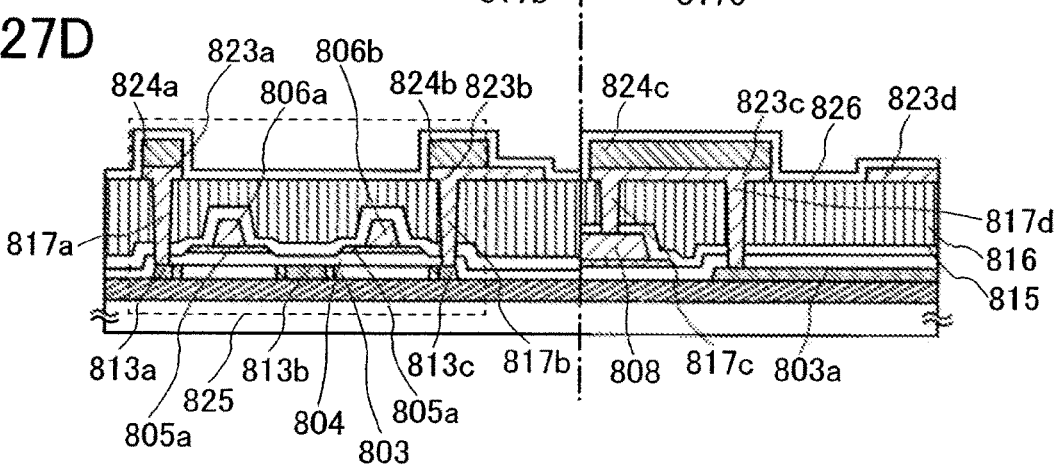

Next, as shown in FIG. 27D, the first conductive film 818 and the second conductive film 819 are etched using the resist patterns 822a to 822d as masks. Thus, the first conductive film 818 and the second conductive film 819 in regions which are not covered with the resist patterns 822a to 822d are removed.

Further, since the resist patterns 822a to 822d are also gradually etched, in the etching treatment, a thin portion (specifically, the portions of the resist pattern 822b, except for a portion above the contact hole 817b, and the resist pattern 817d) of the resist pattern is removed. Therefore, in each of regions below the portion of the resist pattern 822b except for a portion above the contact hole 817b, and the resist pattern 817d, the second conductive film 819 is removed and only the first conductive film 818 remains. Thereafter, the resist patterns 822a to 822c are removed.

As described above, with one resist pattern and one etching treatment, source wirings 823a and 824a, drain wiring 823b and 824b, connection wirings 823c and 824c, and a pixel electrode 823d are formed. The source wirings 823a and 824a and the drain wiring 823b and 824b form a thin film transistor 825 along with the crystalline semiconductor film 803, impurity regions formed in the crystalline semiconductor film 803, the gate insulating film 804, the first gate electrodes 805a and 805b, and the second gate electrodes 806a and 806b. The connection wirings 823c and 824c connect the second wiring 808 and the crystalline semiconductor film 803a.

Thereafter, a first alignment film 826 is formed. Thus, an active matrix substrate is formed. Note that with the treatments shown in FIGS. 26A to 27D, thin film transistors 827 and 829 (shown in FIG. 28B) are formed in a gate signal line driver circuit region 854 of a liquid crystal display device shown in FIGS. 28A and 28B. Further, with the treatments shown in FIGS. 27B to 27D, a first terminal electrode 838a and a second terminal electrode 838b (shown in FIG. 28B) which connect the active matrix substrate and the outside are formed.

Figure 28A:
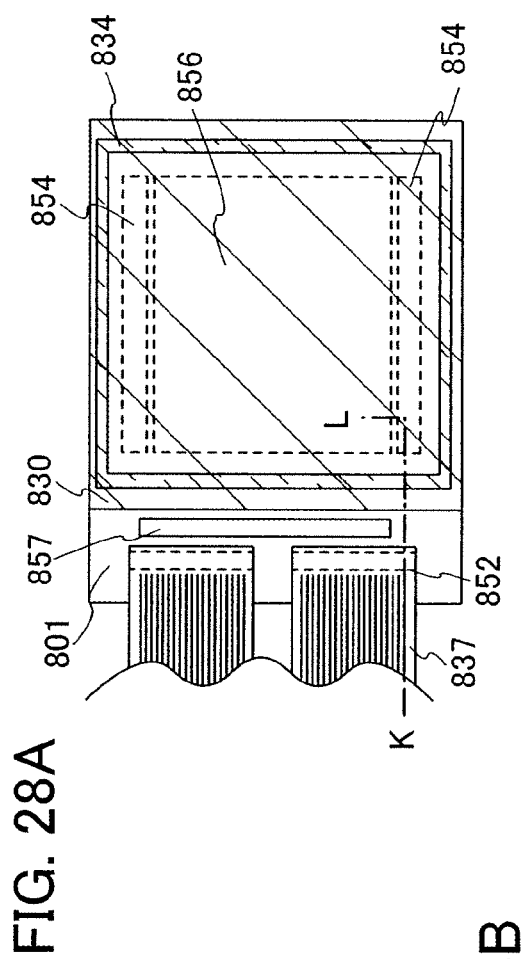
FIG. 28A is a plan view of a liquid crystal display module of Embodiment 1 and FIG. 28B is a cross-sectional view along a line K-L of FIG. 28A.
Figure 28B:
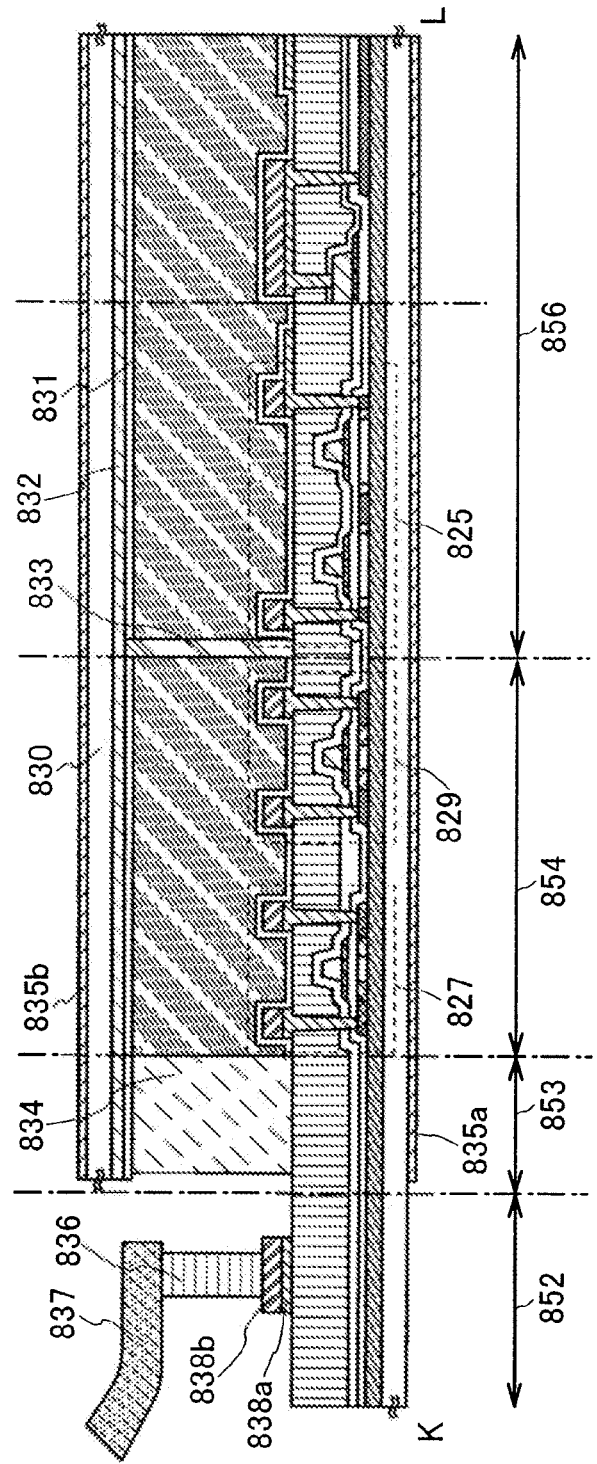

Thereafter, as shown in a plan view of FIG. 28A and a cross-sectional view along a line K-L of FIG. 28B, an organic resin film such as an acrylic resin film is formed over the active matrix substrate, and patterning is performed on the organic resin film. Thus, a columnar spacer 833 is formed over the active matrix substrate. Next, after a sealing material 834 is formed in a sealing region 853, a liquid crystal is dropped on the active matrix substrate. Before the liquid crystal is dropped, a protective film may be formed over the sealing material to prevent the sealing material and the liquid crystal from reacting with each other.

Thereafter, an opposite substrate 830 provided with a color filter 832 and a second alignment film 831 is provided opposed to the active matrix substrate, and these two substrates are attached by the sealing material 834. In this case, the active matrix substrate and the opposite substrate 830 are attached by the spacer 833 to have a uniformed space. Next, the space between the substrates is completely sealed. Thus, the liquid crystal is sealed between the active matrix substrate and the opposite substrate.

Next, if required, one or both the active matrix substrate and the opposite substrate are cut into a desired shape. Further, polarizing plates 835a and 835b are provided. Next, a flexible printed circuit (hereinafter referred to as an FPC) 837 is connected to the second terminal electrode 838b provided in an external terminal connection region 852, through an anisotropy conductive film 836.

A structure of the liquid crystal display module formed in this manner is described. A pixel region 856 is provided at the center of the active matrix substrate. A plurality of pixels are formed in the pixel region 856. In FIG. 28A, the gate signal line driver circuit regions 854 for driving a gate signal line are provided above and below the pixel region 856. A source signal line driver circuit region 857 for driving a source signal line is provided in a region between the pixel region 856 and the FPC 837. The gate signal line driver circuit region 854 may be provided either above and below the pixel region 856, which may be selected by a designer as appropriate in accordance with substrate size in the liquid crystal display module, or the like. Note that when operation reliability, efficiency of driving, and the like of the circuits are considered, the gate signal line driver circuit regions 854 are preferably provided symmetrically with the pixel region 856 therebetween. Signals to each driver circuit are inputted from the FPC 837.

Embodiment 2

A liquid crystal display module according to Embodiment 2 of the present invention is described with reference to FIGS. 29A to 30B. In each drawing, a structure of a pixel portion 930 is similar to that of the pixel region 856 shown in Embodiment 1, and a plurality of pixels are formed over the substrate 100.

Figure 29A:
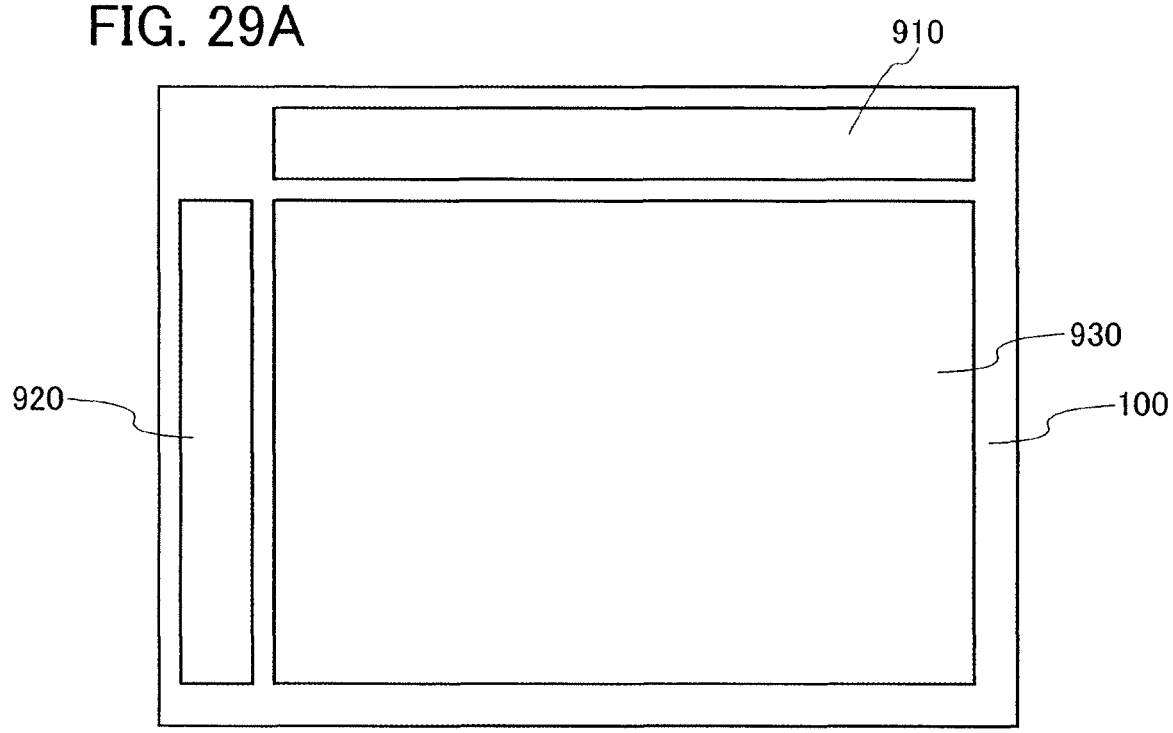
FIGS. 29A and 29B are diagrams for illustrating a liquid crystal display module according to Embodiment 2.
Figure 29B:
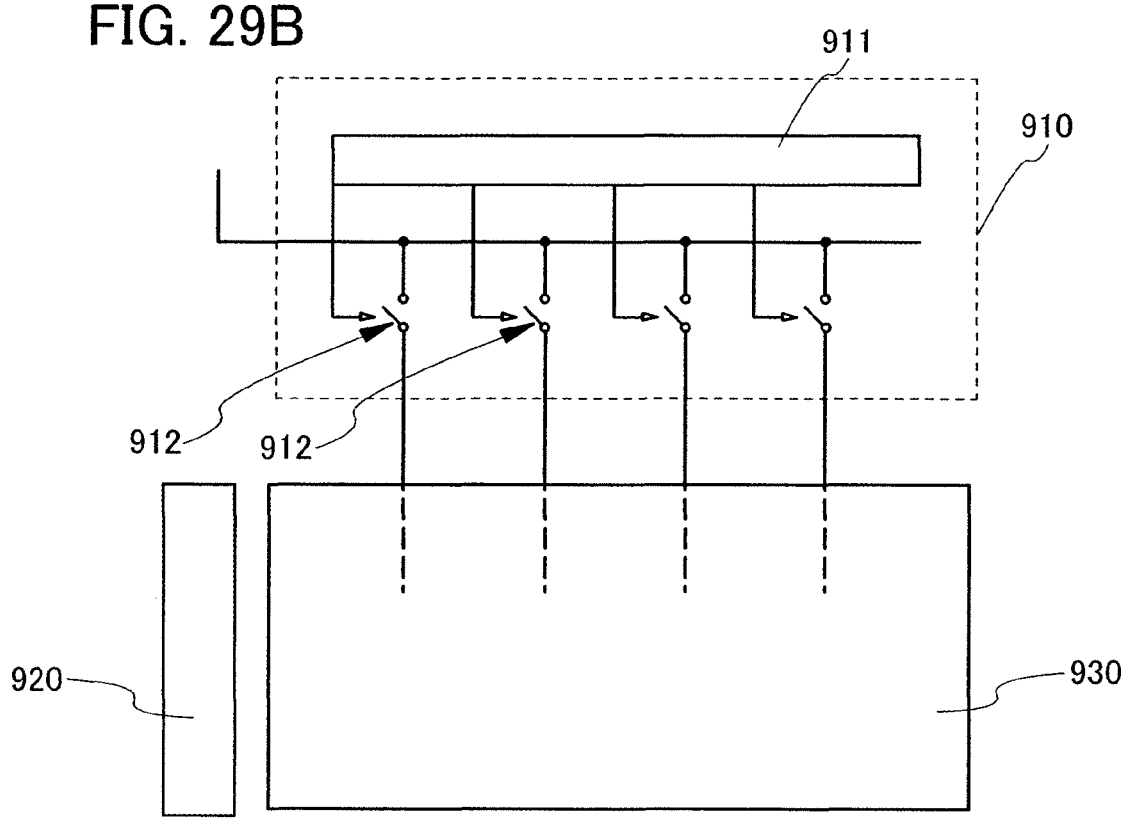

FIG. 29A is a schematic plan view of a liquid crystal display module. FIG. 29B is a diagram illustrating a circuit structure of a source driver 910. As an example of FIGS. 29A and 29B, both a gate driver 920 and the source driver 910 are formed over the substrate 100 same as the pixel portion 930 as shown in FIG. 29A. The source driver 910 includes a plurality of thin film transistors 912 for selecting the source signal line to which an inputted video signal is transmitted; and a shift register 911 for controlling the plurality of thin film transistors 912.

Figure 30A:
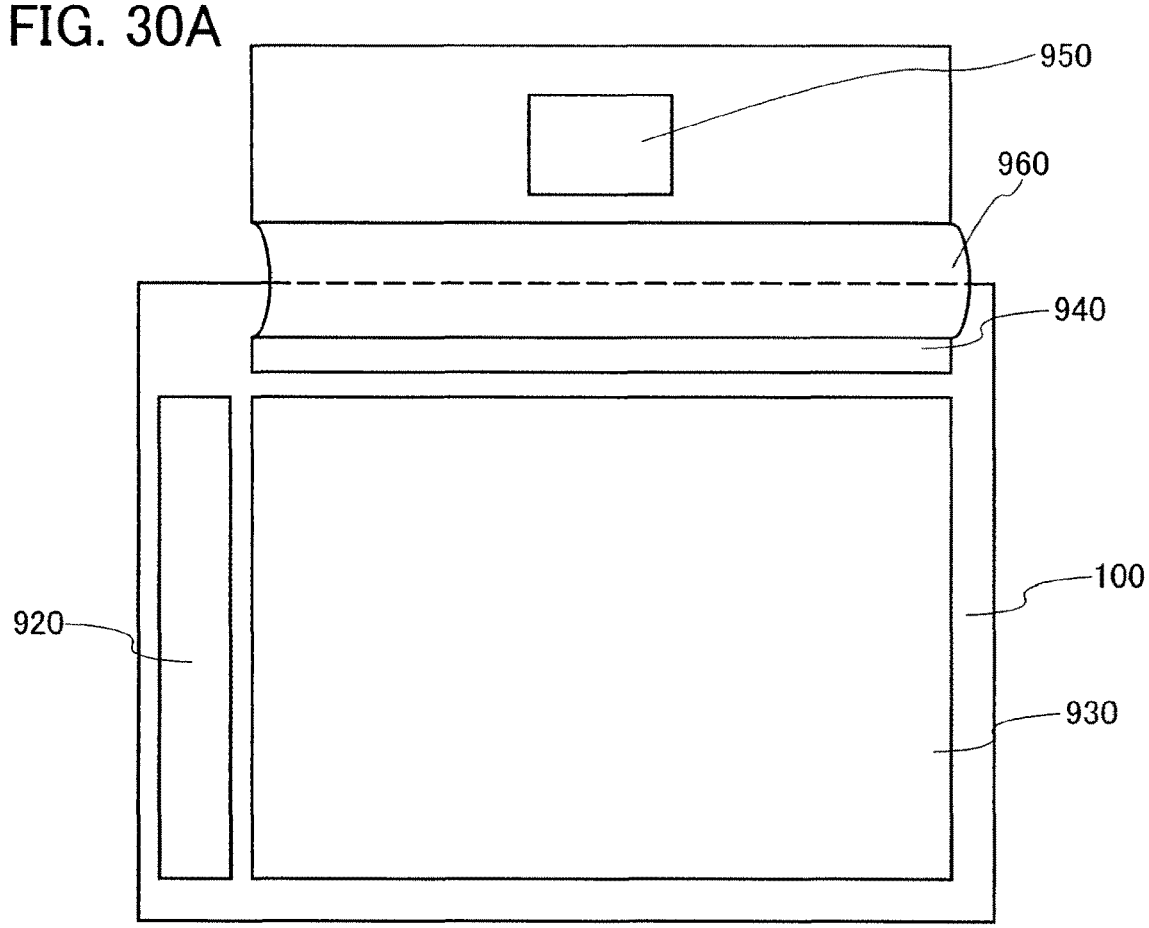
FIGS. 30A and 30B are diagrams for illustrating a liquid crystal display module according to Embodiment 2.
Figure 30B:
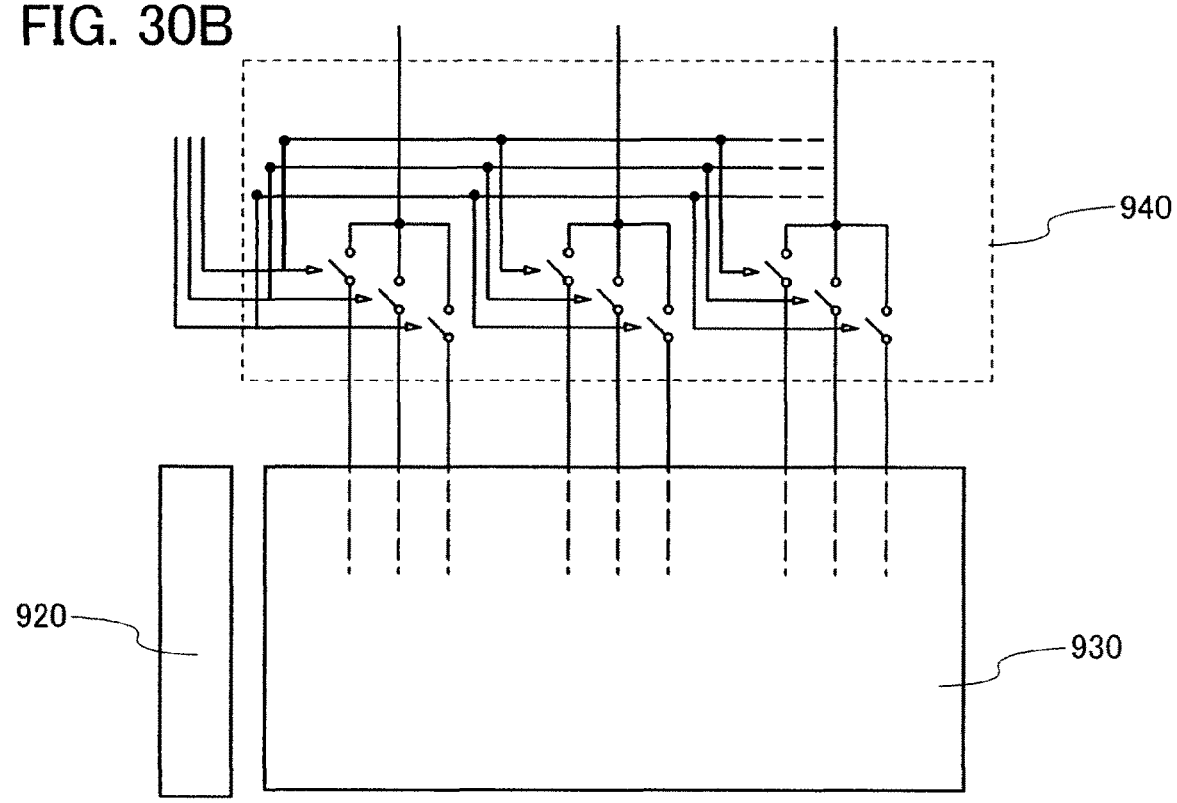

FIG. 30A is a schematic plan view of a liquid crystal display module. FIG. 30B is a diagram illustrating a circuit structure of a source driver. As an example of FIGS. 30A and 30B, the source driver includes a thin film transistor group 940 formed over the substrate 100; and an IC 950 formed separately from the substrate 100. The IC 950 and the thin film transistor group 940 are electrically connected by an FPC 960, for example.

The IC 950 is formed using a single crystalline silicon substrate, for example. The IC 950 controls the thin film transistor group 940 and inputs a video signal to the thin film transistor group 940. The thin film transistor group 940 selects the source signal line to which an inputted video signal is transmitted, based on a control signal from the IC.

According to Embodiment 2, manufacturing cost of a liquid crystal display module can be reduced.

Embodiment 3

An electric appliance according to Embodiment 3 of the present invention is described with reference to FIGS. 31A to 31H. An electric appliance includes a light emitting device of the present invention and is provided with a module such as examples shown in the aforementioned embodiments.

The electronic appliances include cameras such as a video camera and a digital camera, a goggle-type display (head mounted display), a navigation system, an audio reproducing device (such as a car audio component stereo), a computer, a game machine, a portable information terminal (such as a mobile computer, a mobile phone, a mobile game machine, and an electronic book), an image reproducing device provided with a recording medium (specifically, a device for reproducing a recording medium such as a digital versatile disc (DVD) and having a display for displaying the reproduced image) and the like. FIGS. 31A to 31H show specific examples of these electric appliances.

Figure 31A:
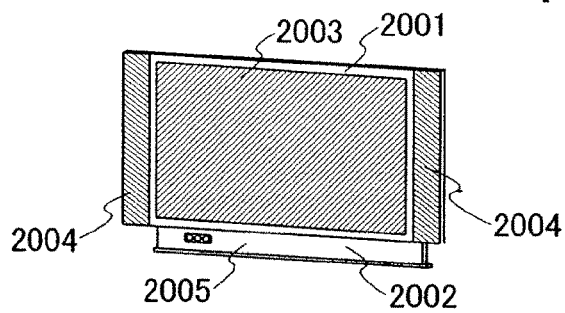
FIGS. 31A to 31H are perspective views illustrating electronic appliances of Embodiment 3.

FIG. 31A shows a monitor of a television receiving device or a personal computer, which includes a housing 2001, a supporting base 2002, a display portion 2003, a speaker portion 2004, a video input terminal 2005, and the like. As the display portion 2003, the liquid crystal display device shown in any of Embodiment Modes 1 to 20 is used. Since the monitor of the television receiving device or the personal computer includes the liquid crystal display device, manufacturing cost thereof can be reduced.

Figure 31B:
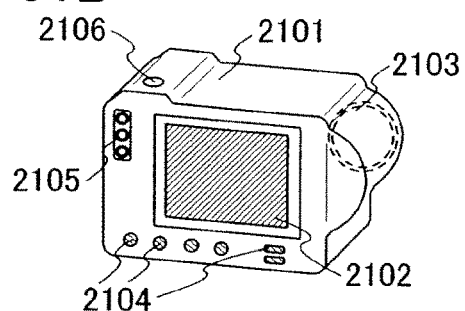

FIG. 31B shows a digital camera. An image receiving portion 2103 is provided in the front side of a main body 2101. A shutter 2106 is provided at the upper portion of the main body 2101. A display portion 2102, operation keys 2104, and an external connection port 2105 are provided at the backside of the main body 2101. As the display portion 2103, the liquid crystal display device shown in any of Embodiment Modes 1 to 20 is used. Since the digital camera includes the liquid crystal display device, manufacturing cost thereof can be reduced.

Figure 31C:
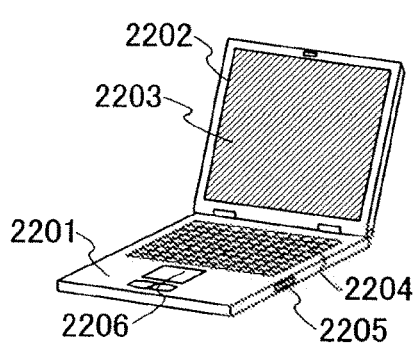

FIG. 31C shows a notebook computer. A main body 2201 is provided with a keyboard 2204, an external connection port 2205, and a pointing device 2206. A housing 2202 including a display portion 2203 is attached to the main body 2201. As the display portion 2203, the liquid crystal display device shown in any of Embodiment Modes 1 to 20 is used. Since the notebook computer includes the liquid crystal display device, manufacturing cost thereof can be reduced.

Figure 31D:
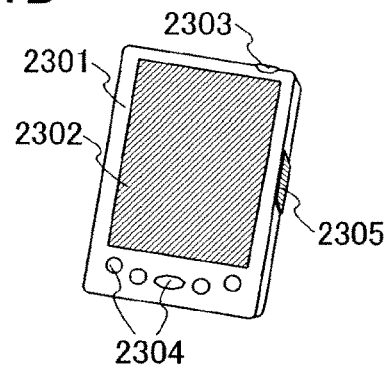

FIG. 31D shows a mobile computer, which includes a main body 2301, a display portion 2302, a switch 2303, operation keys 2304, an infrared port 2305, and the like. An active matrix display device is provided for the display portion 2302. As the display portion 2303, the liquid crystal display device shown in any of Embodiment Modes 1 to 20 is used. Since the mobile computer includes the liquid crystal display device, manufacturing cost thereof can be reduced.

Figure 31E:
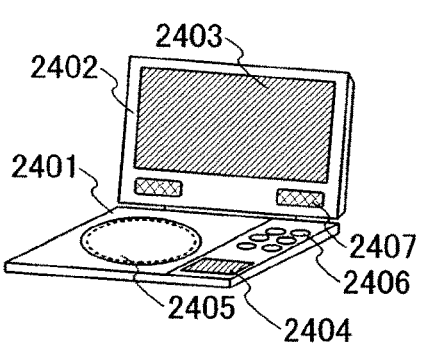

FIG. 31E shows an image reproducing device. A main body 2401 is provided with a display portion B 2404, a recording medium reading portion 2405, and an operation key 2406. A housing 2402 including a speaker portion 2407 and a display portion A 2403 is attached to the main body 2401. As each of the display portion A 2403 and the display portion B 2404, the liquid crystal display device shown in any of Embodiment Modes 1 to 20 is used. Since the image reproducing device includes the liquid crystal display device, manufacturing cost thereof can be reduced.

Figure 31F:
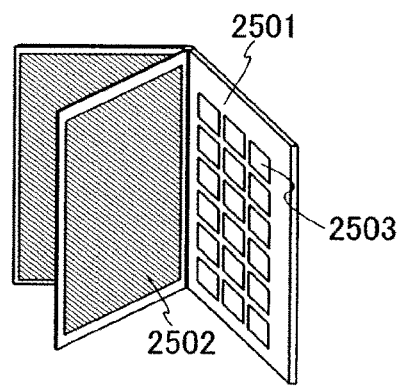

FIG. 31F shows an electronic book. A main body 2501 is provided with an operation key 2503. A plurality of display portions 2502 are attached to the main body 2501. As the display portions 2502, the liquid crystal display device shown in any of Embodiment Modes 1 to 20 is used. Since the electronic book includes the liquid crystal display device, manufacturing cost thereof can be reduced.

Figure 31G:
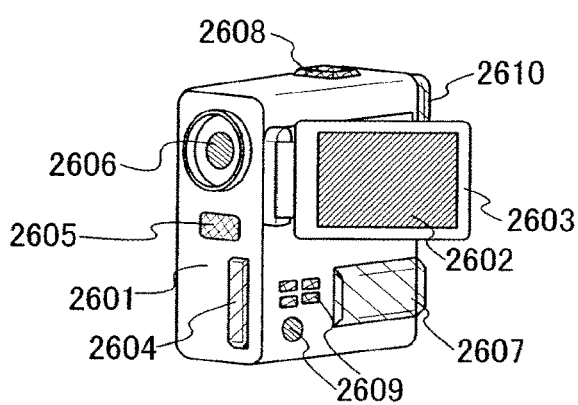

FIG. 31G shows a video camera. A main body 2601 is provided with an external connection port 2604, a remote control receiving portion 2605, an image receiving portion 2606, a battery 2607, an audio input portion 2608, operation keys 2609, and an eyepiece portion 2610. A housing 2603 including a display portion 2602 is attached to the main body 2601. As the display portions 2602, the liquid crystal display device shown in any of Embodiment Modes 1 to 20 is used. Since the video camera includes the liquid crystal display device, manufacturing cost thereof can be reduced.

Figure 31H:
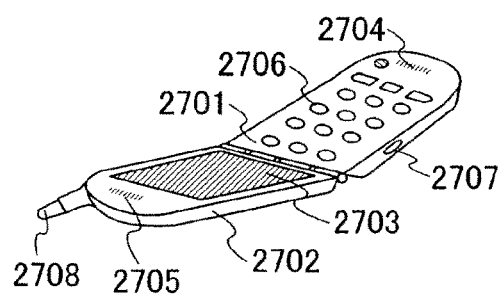

FIG. 31H shows a mobile phone, which includes a main body 2701, a housing 2702, a display portion 2703, an audio input portion 2704, an audio output portion 2705, an operation key 2706, an external connection port 2707, an antenna 2708, and the like. As the display portions 2703, the liquid crystal display device shown in any of Embodiment Modes 1 to 20 is used. Since the mobile phone includes the liquid crystal display device, manufacturing cost thereof can be reduced.

As described above, the application range of the present invention is so wide that the present invention can be applied to electronic appliances of various fields.

This application is based on Japanese Patent Application serial No. 2006-105618 filed in Japan Patent Office on Apr. 6, 2006, the entire contents of which are hereby incorporated by reference.

What is claimed is:

1. A display device comprising:
a first pixel comprising:
a capacitor comprising a first electrode and a second electrode; and
a transistor comprising a semiconductor layer connected to the second electrode,
wherein the second electrode comprises a region used as a pixel electrode,
wherein the first electrode comprises indium, zinc, gallium, and oxygen,
wherein the semiconductor layer comprises indium, zinc, gallium, and oxygen,
wherein the first electrode and the semiconductor layer are positioned over a first insulating layer,
wherein the second electrode is positioned over a second insulating layer comprising an organic material,
wherein the second insulating layer is positioned over the first electrode and the semiconductor layer, and
wherein the first electrode is connected to a wiring positioned below the first electrode.

2. The display device according to claim 1, further comprising a second pixel adjacent to and connected to the first pixel through the wiring,
wherein the wiring extends to the first pixel to the second pixel.

3. The display device according to claim 1, wherein the first insulating layer is a stacked layer comprising a first layer comprising oxygen or nitrogen and a second layer comprising oxygen or nitrogen.

4. The display device according to claim 1, wherein the transistor is a driving transistor.

5. A display device comprising:
a first pixel comprising:
a capacitor comprising a first electrode and a second electrode; and
a transistor comprising a semiconductor layer connected to the second electrode,
wherein the second electrode comprises a region used as a pixel electrode,
wherein the first electrode comprises indium, zinc, gallium, and oxygen,
wherein the semiconductor layer comprises indium, zinc, gallium, and oxygen,
wherein the first electrode and the semiconductor layer are positioned over a first insulating layer,
wherein the second electrode is positioned over a second insulating layer comprising an organic material,
wherein the second insulating layer is positioned over the first electrode and the semiconductor layer, and
wherein the first electrode is not a floating electrode.

6. The display device according to claim 5, wherein the first insulating layer is a stacked layer comprising a first layer comprising oxygen or nitrogen and a second layer comprising oxygen or nitrogen.

7. The display device according to claim 5, wherein the transistor is a driving transistor.

8. A display device comprising:
- a first pixel comprising:
  - a capacitor comprising a first electrode and a second electrode; and
  - a transistor comprising a semiconductor layer connected to the second electrode,
  - wherein the second electrode comprises a region used as a pixel electrode,
  - wherein the first electrode comprises indium, zinc, gallium, and oxygen,
  - wherein the semiconductor layer comprises indium, zinc, gallium, and oxygen,
  - wherein the first electrode and the semiconductor layer are positioned over a first insulating layer,
  - wherein the second electrode is positioned over a second insulating layer comprising an organic material,
  - wherein the second insulating layer is positioned over the first electrode and the semiconductor layer, and
  - wherein the first electrode is not a pixel electrode.

9. The display device according to claim 8, wherein the first insulating layer is a stacked layer comprising a first layer comprising oxygen or nitrogen and a second layer comprising oxygen or nitrogen.

10. The display device according to claim 8, wherein the transistor is a driving transistor.

* * * * *